US006882045B2

(12) United States Patent
Massingill et al.

(10) Patent No.: US 6,882,045 B2
(45) Date of Patent: Apr. 19, 2005

(54) MULTI-CHIP MODULE AND METHOD FOR FORMING AND METHOD FOR DEPLATING DEFECTIVE CAPACITORS

(76) Inventors: Thomas J. Massingill, 170 Northridge Dr., Scotts Valley, CA (US) 95066; Mark Thomas McCormack, 2356 White Oak Pl., Livermore, CA (US) 94550; Wen-Chou Vincent Wang, 18457 Edminton Dr., Cupertino, CA (US) 95014

( * ) Notice: Subject to any disclaimer, the term of this patent is extended or adjusted under 35 U.S.C. 154(b) by 215 days.

(21) Appl. No.: 09/997,589

(22) Filed: Nov. 29, 2001

(65) Prior Publication Data

US 2002/0155661 A1 Oct. 24, 2002

Related U.S. Application Data

(63) Continuation-in-part of application No. 09/956,605, filed on Sep. 18, 2001, and a continuation-in-part of application No. 09/429,854, filed on Oct. 28, 1999, now Pat. No. 6,428,942.

(51) Int. Cl.[7] ............................................. H01L 23/34
(52) U.S. Cl. ....................... 257/724; 257/758; 257/532; 257/528
(58) Field of Search .............................. 257/724, 758, 257/532, 528

(56) References Cited

U.S. PATENT DOCUMENTS

| | | | | |
|---|---|---|---|---|
| 3,655,540 | A | 4/1972 | Irvin | 204/143 GE |
| 3,791,858 | A | 2/1974 | McPherson et al. | 117/201 |
| 3,867,272 | A | 2/1975 | Rust et al. | 204/194 |
| 3,976,524 | A | 8/1976 | Feng | 156/8 |
| 4,045,312 | A | 8/1977 | Satoshi | 204/129.65 |
| 4,181,755 | A | 1/1980 | Liu et al. | 430/314 |
| 4,248,683 | A | 2/1981 | Shaw | 204/129.3 |
| 4,614,021 | A | 9/1986 | Hulseweh | 29/590 |
| 4,729,970 | A | 3/1988 | Nath et al. | 437/225 |
| 4,749,454 | A | 6/1988 | Arya et al. | 204/129.3 |
| 4,782,028 | A | 11/1988 | Farrier et al. | 437/3 |
| 4,908,940 | A | 3/1990 | Amano et al. | 29/852 |
| 4,915,983 | A | 4/1990 | Lake et al. | 427/98 |
| 4,921,777 | A | 5/1990 | Fraenkel et al. | 430/314 |

(Continued)

FOREIGN PATENT DOCUMENTS

| | | | |
|---|---|---|---|
| JP | 56-116697 | 9/1981 | 3/46 |
| JP | 63-244796 | 10/1988 | 3/46 |

OTHER PUBLICATIONS

Pan et al., "A Planar Approach to High Density Copper–Polymide Interconnect Fabrication," pp. 174–189, Proceeding of the Technical Conference—$8_{th}$ Int'l Electronics Packaging Conference (1988).

Iwasaki et al., "A Pillar–Shaped Via Structure in a Cu–Polymide Multilayer Substrate," pp. 127–131, Proceedings of the 1989 Japan International Electronic Manufacturing Technology Symposium.

*Primary Examiner*—Luan Thai
(74) *Attorney, Agent, or Firm*—Sheppard Mullin Richter & Hampton LLP

(57) ABSTRACT

A method for deplating defective capacitors comprising forming a plurality of capacitors on a semiconductor substrate, forming a plurality of metal contacts on the plurality of capacitors, and depositing a layer of photoresist on the semiconductor substrate. The photoresist layer is patterned so that the plurality of metal contacts are exposed, which are then contacted with an electrically conductive solution. The metal contacts, which are disposed over defective capacitors, are subsequently deplated. A method for forming a multi-chip module comprising forming a thin-film polymeric interconnect structure having a pair of sides, one of which is disposed on a silicon substrate having active or passive devices and the other of which has a computer chip mounted thereon. A multi-chip module formed by the method.

9 Claims, 34 Drawing Sheets

U.S. PATENT DOCUMENTS

| | | | |
|---|---|---|---|
| 4,980,034 A | 12/1990 | Volfson et al. | 437/195 |
| 4,984,358 A | 1/1991 | Nelson | 29/830 |
| 5,063,175 A | 11/1991 | Broadbent | 437/192 |
| 5,071,518 A | 12/1991 | Pan | 205/122 |
| 5,091,289 A | 2/1992 | Cronin et al. | 430/312 |
| 5,097,393 A | 3/1992 | Nelson et al. | 361/386 |
| 5,106,461 A | 4/1992 | Volfson et al. | 205/125 |
| 5,118,385 A | 6/1992 | Kumar et al. | 156/644 |
| 5,137,597 A | 8/1992 | Curry, II et al. | 156/636 |
| 5,162,260 A | 11/1992 | Leibovitz | 427/195 |
| 5,202,018 A | 4/1993 | Horányl et al. | 204/129.2 |
| 5,283,081 A | 2/1994 | Kata et al. | 427/96 |
| 5,287,619 A | 2/1994 | Smith et al. | 29/852 |
| 5,316,974 A | 5/1994 | Crank | 437/190 |
| 5,337,466 A | 8/1994 | Ishida | 29/830 |
| 5,464,653 A | 11/1995 | Chantraine et al. | 427/96 |
| 5,512,514 A | 4/1996 | Lee | 437/195 |
| 5,543,585 A | 8/1996 | Booth et al. | 174/261 |
| 5,591,678 A | 1/1997 | Bendik et al. | 437/208 |
| 5,640,049 A * | 6/1997 | Rostoker et al. | 257/758 |
| 5,654,237 A | 8/1997 | Suguro et al. | 438/624 |
| 5,656,548 A | 8/1997 | Zavracky et al. | 438/23 |
| 5,656,552 A | 8/1997 | Hudak et al. | 438/15 |
| 5,699,613 A | 12/1997 | Chong et al. | 29/852 |
| 5,716,881 A | 2/1998 | Liang et al. | 438/238 |
| 5,734,555 A | 3/1998 | McMahon | 361/704 |
| 5,770,487 A | 6/1998 | Maas et al. | 438/164 |
| 5,784,261 A | 7/1998 | Pedder | 361/767 |
| 5,784,782 A | 7/1998 | Boyko et al. | 29/848 |
| 5,807,783 A | 9/1998 | Gaul et al. | 438/406 |
| 5,811,879 A | 9/1998 | Akram | 257/723 |
| 5,830,533 A | 11/1998 | Lin et al. | 427/272 |
| 5,834,845 A | 11/1998 | Stolmeijer | 257/752 |
| 5,838,545 A | 11/1998 | Clocher et al. | 361/719 |
| 5,843,806 A | 12/1998 | Tsai | 438/107 |
| 5,843,839 A | 12/1998 | Ng | 438/637 |
| 5,851,845 A | 12/1998 | Wood et al. | 438/15 |
| 5,856,937 A | 1/1999 | Chu et al. | 365/51 |
| 5,859,397 A | 1/1999 | Ichinose et al. | 204/157.15 |
| 5,863,412 A | 1/1999 | Ichinose et al. | 205/652 |
| 5,863,829 A | 1/1999 | Nakayoshi et al. | 438/459 |
| 5,866,441 A | 2/1999 | Pace | 438/108 |
| 5,872,025 A | 2/1999 | Cronin et al. | 438/109 |
| 5,872,700 A | 2/1999 | Collander | 361/760 |
| 5,877,034 A | 3/1999 | Ramm et al. | 438/15 |
| 5,891,606 A | 4/1999 | Brown | 430/312 |
| 5,891,799 A | 4/1999 | Tsui | 438/624 |
| 5,916,453 A | 6/1999 | Beilin et al. | 216/38 |
| 6,013,417 A | 1/2000 | Sebesta et al. | 430/312 |
| 6,316,838 B1 * | 11/2001 | Ozawa et al. | 257/778 |
| 6,608,371 B1 * | 8/2003 | Kurashima et al. | 257/686 |

* cited by examiner

Figure : After deposition of gapfilling polymer and CMP b) or Masking can be used to make polymer layer discontinuous from conductor to conductor.

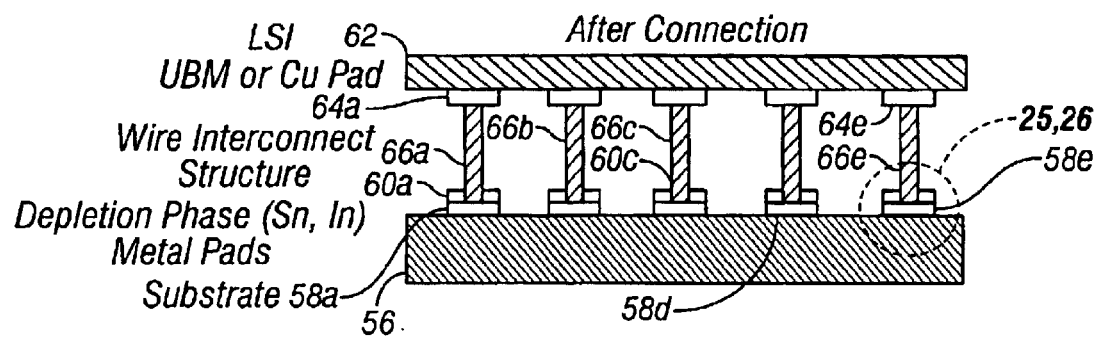
FIG. 24
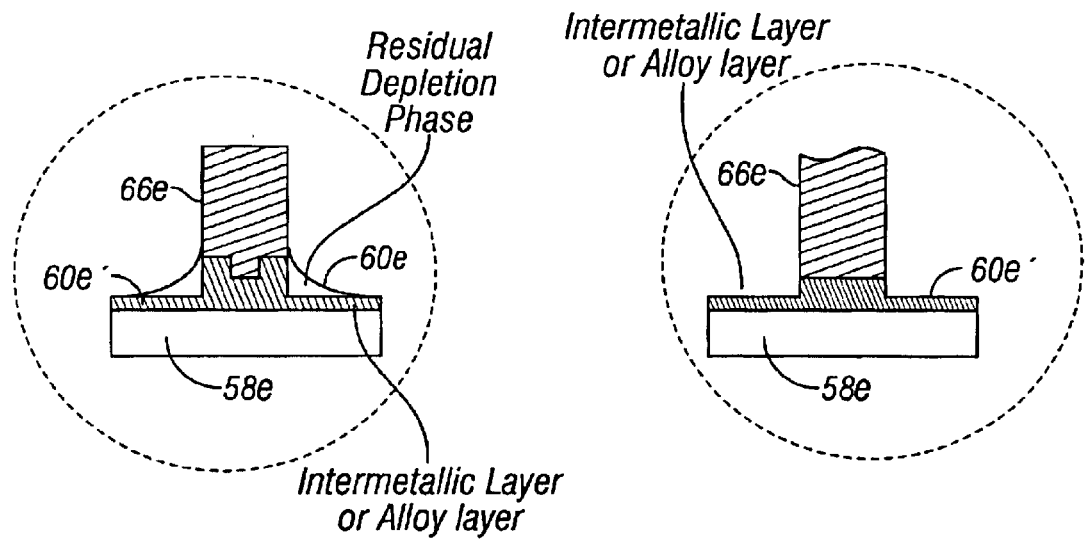
FIG. 25  FIG. 26

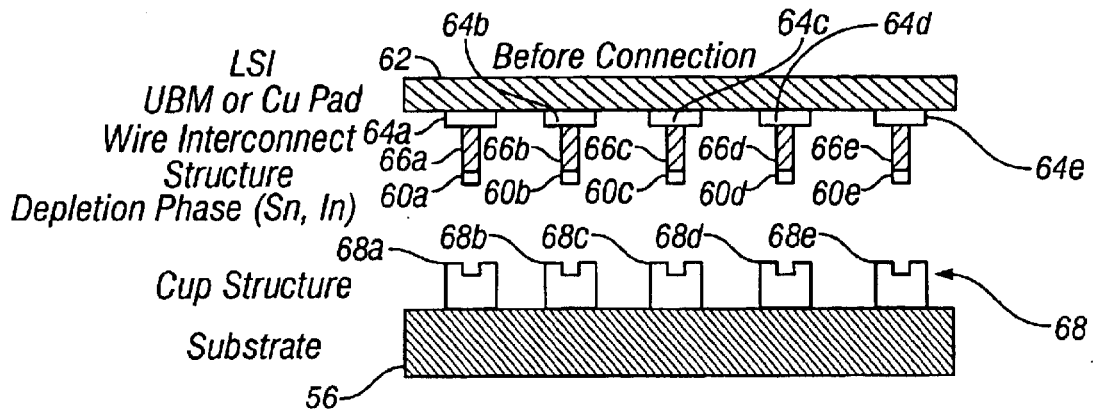
FIG. 33
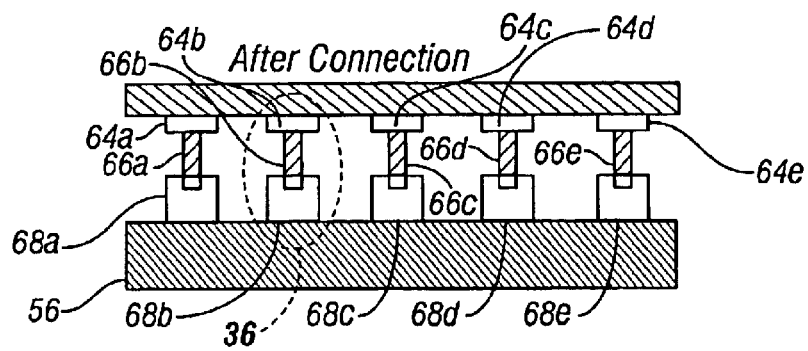
FIG. 34
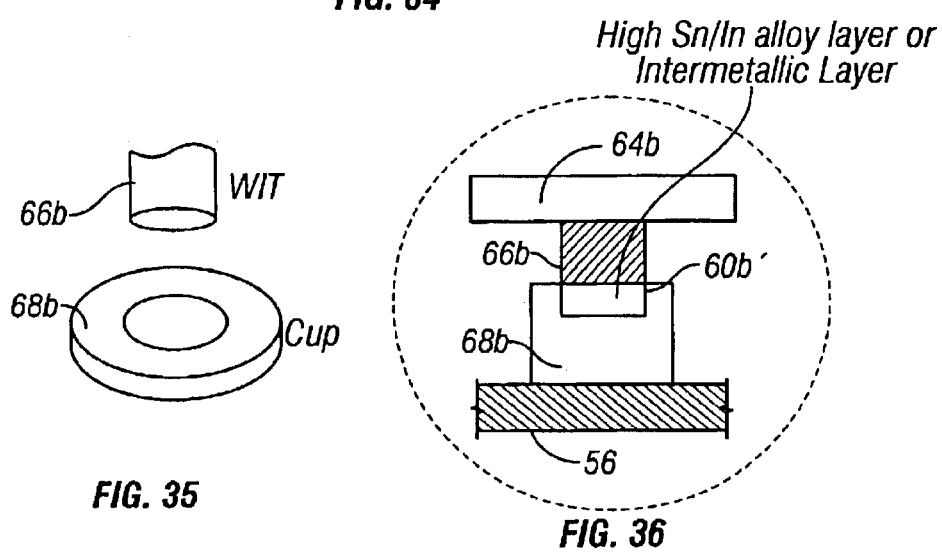
FIG. 35
FIG. 36

MULTI-CHIP MODULE AND METHOD FOR FORMING AND METHOD FOR DEPLATING DEFECTIVE CAPACITORS

This is a continuation-in-part patent application of patent applications having Ser. No. 09/429,854, filed Oct. 28, 1999, now U.S. Pat. No. 6,428,942, and Ser. No. 09/956,605, filed Sep. 18, 2001. Benefit of the earlier filing dates is claimed for all common subject matter.

BACKGROUND OF THE INVENTION

1. Field of the Invention

The present invention is related to multichip modules (MCMs). More specifically, the present invention provides MCM substrates, as well as to a method for making multichip module substrates and to a method for deplating defective capacitors.

2. Description of the Prior Art

Multilayer circuit structures can be used to electrically communicate two or more electrical devices such as two or more computer chips. Multilayer circuit structures typically contain multiple conductive layers separated by one or more dielectric layers. Via structures disposed in apertures in the dielectric layers provide conductive paths so that electrical signals can pass from one conductive layer to another conductive layer. Multiple via structures in successive dielectric layers can be used to form a conductive path from an inner region to an outer region of a multilayer circuit structure.

Multichip module (MCM) packages require off-module connections to receive input signal, to provide output signals, and to receive power and ground voltages. In low-cost, low performance MCM modules, these off-module connections are usually around the periphery edges of the MCM's substrate. In higher-cost, higher performance MCM modules, the off-module connections are formed through the MCM's substrate which usually comprises a multilayer ceramic material.

Discrete surface-mount or chip capacitors are often added to the surface of a MCM substrate to remove (e.g., de-couple) noise between the power lines and the ground lines. However, as the operating frequency of MCMs has increased, the effectiveness of these surface mount and chip capacitors has decreased to marginal and unacceptable levels.

The via structures in successive dielectric layers can be staggered in a multilayer circuit structure. For example, as shown in FIG. 37, a plurality of staggered via structures 110 are in electrical communication with each other. The staggered conductive path formed by the via structures 110 can provide communication between a core structure 120 and an outer surface of the multilayer circuit structure 100. Each of the via structures 110 shown in FIG. 37 is in the form of a conductive coating on an aperture wall in a dielectric layer. Unfortunately, staggering the via structures can consume valuable area in a multilayer circuit structure and can increase the signal run length. This can decrease the density of the circuitry in a multilayer circuit structure. Moreover, the metal coating of via structures of the type shown in FIG. 37 is thin. Open circuits can form if the coating is not thick enough or is not uniform.

A patentability investigation was conducted and the following U.S. Patents were discovered: U.S. Pat. No. 3,867,272 to Rust et al.; U.S. Pat. No. 4,729,970 to Nath et al.; U.S. Pat. No. 4,749,454 to Arya et al.; U.S. Pat. No. 4,782,028 to Farrier et al.; U.S. Pat. No. 4,984,358 to Nelson; U.S. Pat. No. 5,202,018 to Horántl et al.; U.S. Pat. No. 5,543,585 to Booth et al.; U.S. Pat. No. 5,591,678 to Bendik et al.; U.S. Pat. No. 5,656,548 to Zavracky et al.; U.S. Pat. No. 5,656,552 to Hudak et al.; U.S. Pat. No. 5,716,881 to Liang et al.; U.S. Pat. No. 5,770,487 to Maas et al.; U.S. Pat. No. 5,784,261 to Pedder; U.S. Pat. No. 5,807,783 to Gaul et al.; U.S. Pat. No. 5,811,879 to Akram; U.S. Pat. No. 5,838,545 to Clocher et al.; U.S. Pat. No. 5,843,806 to Tsai; U.S. Pat. No. 5,851,845 to Wood et al.; U.S. Pat. No. 5,856,937 to Chu et al.; U.S. Pat. No. 5,859,397 to Ichinose et al.; U.S. Pat. No. 5,863,412 to Ichinose et al.; U.S. Pat. No. 5,863,829 to Nakayoshi et al.; U.S. Pat. No. 5,866,441 to Pace; U.S. Pat. No. 5,872,025 to Cronin et al.; U.S. Pat. No. 5,872,700 to Collander; and U.S. Pat. No. 5,877,034 to Ramm et al.

U.S. Pat. No. 3,867,272 discloses microelectric devices and circuits, such as those found in semiconductor and hybrid microelectrics. Microelectric devices are rendered unrecognizable and may be destroyed by means of an electrochemical reaction comprising an electro-chemical or chemical etching and/or de-plating process.

U.S. Pat. No. 4,729,970 discloses an electronic device of the type including a thin film body having a superposed electrode and further including short circuit defects therein passivated by conversion process in which the electrical resistivity of the electrode material is increased proximate the defect regions. Conversion is accomplished by exposing the electrode material to a conversion reagent and activating the reagent proximate the defect regions. The process may be utilized for a variety of differently configured devices, and may be readily adapted for use in a roll-to-roll device fabrication process.

U.S. Pat. No. 4,749,454 discloses a method of removing electrical shorts and shunts from a thin-film semiconductor device having pairs of electrodes with exposed contact surfaces wherein each pair of electrodes is separated by a semiconductor film. The disclosed method comprises the steps of coating the exposed contact surfaces with an ionic solution and successively applying a reverse-bias voltage between the exposed contact surfaces of each pair of electrodes. The ionic solution has an etching rate that increases with increased temperature so that the leakage current flowing through shorts and shunts located between each respective pair of electrodes in response to the reverse-bias voltage will create a local temperature increase at the shorts and shunts and selectively etch or oxidize the shorts and shunts, rendering them substantially nonconductive. The exposed contact surfaces can be coated using a sponge application or spray apparatus. The preferred ionic solution comprises an acid mixture diluted to one part in at least five parts water.

U.S. Pat. No. 4,782,028 discloses a method for forming a detector device, such as thinned bulk silicon blocked impurity transducer infrared detector, by thinning a semiconductor substrate and processing the thinned region on two sides to form the detector device. The semiconductor substrate is thinned to form a cavity in the substrate. Further processing on both sides of the thinned region is performed while the thinned region is still connected to the thicker substrate. The thinned region is then separated from the substrate upon completion of the given processing steps. The device may then be mounted to a readout device.

U.S. Pat. No. 4,984,358 discloses integrated circuit dies which, while still in wafer form, are prepared for stacking without requiring packaging. Holes are made through a wafer having a plurality of integrated circuit dies and are placed between the dies and adjacent the die pads. A layer of insulating material is placed on the wafer and in the outer periphery of the holes. An electrically conductive connection is made between the top of each pad and the inside of the insulating material in an adjacent hole. The insulating layer and the electrically conductive layer can be further extended to the backside of the dies if desired. The dies are separated from each other and can be assembled in a stack and/or surface mounted to a substrate.

U.S. Pat. No. 5,202,018 discloses the invention relating to the electrochemical dissolution of semiconductors by alternating applications of anodic and cathodic direct currents to an electrode formed by contacting a semiconductor material with an electrolyte.

U.S. Pat. No. 5,543,585 discloses a simple process for card assembly by direct chip attachment using electrically conductive adhesives. Methods are disclosed which create the same intermediate wafer product with a layer of insulative thermoplastic and conductive thermoplastic bumps. After sawing or dicing the wafer to form the chips, the chips are adhered to chip carriers with conductive pads which match the conductive thermoplastic bumps, using heat and pressure. Chips may be easily removed and replaced using heat.

U.S. Pat. No. 5,591,678 discloses a microelectric device, which is fabricated by furnishing a first substrate having a silicon etchable layer, a silicon dioxide etch-stop layer overlying the silicon layer, and a single-crystal silicon wafer overlying the etch-stop layer. The wafer has a front surface not contacting the etch stop layer. A microelectronic circuit element is formed in the single-crystal silicon wafer. The method further includes attaching the front surface of the single-crystal silicon wafer to a second substrate, and etching away the silicon layer of the first substrate down to the etch-stop layer. The second substrate may also have a microelectronic circuit element therein that can be electrically interconnected to the microelectronic circuit element.

U.S. Pat. No. 5,656,548 discloses a multi-layered structure fabricated in which a microprocessor is configured in different layers and interconnected vertically through insulating layers which separate each circuit layer of the structure. Each circuit layer can be fabricated in separate wafer or thin film material and then transferred onto the layered structure and subsequently interconnected.

U.S. Pat. No. 5,656,552 discloses a method of making a multi-chip module by thinning individual integrated circuit die or an integrated circuit wafer containing multiple integrated circuits, bonding thinned dice or a thinned wafer to a mylar, polyimide, semiconductor, or a ceramic substrate, and depositing at least one interconnect material over the wafer, where the first interconnect layer is deposited directly over the wafer. A dielectric layer is disclosed as being deposited over each of the interconnect layers. Vias are opened in the dielectric layers in order to interconnect the dice and multip-chip module as required, and the substrate is removed to form a thin, conformal, and high-yielding multi-chip module.

U.S. Pat. No. 5,716,881 discloses a fabrication process for integrating stacked capacitor DRAM devices, and thin film transistor SRAM devices. The fabrication process includes combing key operations used to create transfer gate transistor structures, and access transistor structures for the DRAM and SRAM devices.

U.S. Pat. No. 5,770,487 discloses a method of manufacturing a device whereby a layer structure with semiconductor elements and conductor tracks is formed on a first side of a semiconductor wafer which is provided with a layer of semiconductor material disposed on an insulating layer. The semiconductor wafer is subsequently fastened with the first side to a support wafer by means of a glue layer. The support wafer is provided with a metallization. Material is then removed from the semiconductor wafer from the second side of the semiconductor wafer until the insulating layer is exposed. Contact windows are provided in the insulating layer from the first side of the semiconductor wafer before the latter is refastened on the support wafer. These windows are filled with a material which can be removed selectively relative to the insulating layer. The contact windows are opened from the second side of the semiconductor wafer after the latter has been fastened on the support wafer and after the insulating layer has been exposed.

U.S. Pat. No. 5,784,261 discloses formation of low profile microchip module assemblies by first mounting one or more active semiconductor integrated circuit chips on a multilayer metallization and dielectric structure disposed on a substrate by wire bonding or flip-chip solder bonding, and then inverting the substrate and mounting it on a printed circuit board by means of solder bump connections. The solder bump connections are sufficiently high for the chips to be held clear of the printed circuit board.

U.S. Pat. No. 5,807,783 discloses a bonded wafer having a first handle wafer, a device layer, an interconnected layer, and a number of vias filled with conductive material that extends between surfaces of the device layer. The interconnect layer has conductors that connect internal device contacts to the conductive vias. A second handle wafer of glass is bonded to the interconnect layer and the first handle wafer is removed. Bottom, external contacts are formed on a surface of device layer.

U.S. Pat. No. 5,811,879 discloses a multi-chip module (MCM) and method of manufacturing same which provides for attachment of semiconductor dice to both sides of the MCM printed circuit boards (PCB). Semiconductor dice, attached to the top surface of the PCB, may be attached by conventional wire bonding, TAB or flip chip methods. Those semiconductor dice attached to the bottom surface of the PCB are wire bonded or TAB connected to the top surface through openings in the PCB. The openings provide a lead-over chip (LOC) arrangement for those semiconductor dice attached to the bottom surface. The bottom surface of the PCB may be provided with die recesses into which the openings extend, to receive the dice and bring their active surfaces even closer to the top surface of the PCB for wire bonding.

U.S. Pat. No. 5,838,545 discloses a high performance, low cost multi-chip module package using a heatsink as a substrate with thin film wiring techniques or multilayered wiring techniques for interconnection of the chips on the surface of the module and a solder column grid array or solder ball grid array for interconnection to the next level of packaging (printed circuit board). The columns or balls create a space between the board and module with the chips being in the space and provide the required interconnect density.

U.S. Pat. No. 5,843,806 discloses methods for packaging TAB-BGA integrated circuits which include providing a double-sided polyimide, forming first dry film layers, sequentially performing a multi-layer electroplating operation of electro-coppering, electronickelling, gold plating and electronickelling again (or electronickelling and gold plating, or electro-coppering and electronickelling), and removing the first dry film layers. A lower second dry film layer serves as a mask for etching a bottom thin copper layer to define a plurality of predetermined openings, and the bottom thin copper layer serves as a mask for applying a laser etching operation to the polymide substrate to define holes without totally penetrating the polymide substrate. An electrolytic plating operation is applied to the holes for forming protruding contacts, and the exposed top thin copper layer is etched or removed. A chip installation hole and a plurality of through holes are respectively defined by performing a laser drilling operation, and a chip is attached to the two electroplated multi-layer (or double-layer) protrusions beside the chip installation hole by using a single point bond method.

U.S. Pat. No. 5,851,845 discloses a method for packaging semiconductor dice. The package includes a thinned die mounted on a compliant adhesive layer disposed on a substrate. The package is formed by providing a wafer containing a plurality of dice, thinning a backside of the wafer by etching or polishing, attaching the thinned wafer to the substrate, and then dicing the wafer. The semiconductor package may be mounted to a supporting substrate such as a printed circuit board in a chip-on-board configuration. The compliant adhesive layer and substrate of the package eliminate stresses and cracking of the die caused by a thermal mismatch between the die and supporting substrate. In addition, the semiconductor package can be mounted in a flip chip configuration with the substrate for the package protecting a backside of the die from radiation.

U.S. Pat. No. 5,856,937 discloses a processor module having a cache of SRAM chips mounted on both a back and front surface, and de-coupling capacities mounted on only the back surface. Each de-coupling capacitor is for suppressing current spikes from a pair of SRAM chips. The pair of SRAM chips includes a first SRAM chip on the same surface as the capacitor and a second SRAM chip opposite the first SRAM chip on the front surface of the module. The first SRAM chip belongs to a first bank while the second SRAM chip belongs to a second bank. Two chip-enable signals control access to the two banks. Only one bank and only one SRAM chip in the pair of SRAM chips creates a current spike at any time. Thus, a capacitor can be shared between the two SRAM chips in the pair. The shared capacitor may be mounted next to or under one of the SRAM chips, or formed within the multi-layer substrate itself.

U.S. Pat. No. 5,859,397 discloses a process for producing a photovoltaic element by the steps of: providing a photovoltaic element comprising a lower electrode layer having a metallic layer comprising aluminum or an aluminum compound and a transparent and electrically conductive layer, a photoelectric conversion semiconductor layer, and a transparent electrode layer stacked on an electrically conductive surface of a substrate, and immersing the photovoltaic element in an electrolyte solution to passivate a short-circuited current path defect present in the photovoltaic element by the action of an electric field.

U.S. Pat. No. 5,863,412 discloses a method for etching an object having a portion to be etched on the surface thereof. The method comprises the steps of: immersing the object in an electrolyte solution such that the object serves as a negative electrode, arranging a counter electrode having a pattern corresponding to a desired etching pattern to be formed at the portion to be etched of the object in the electrolyte solution so as to maintain a predetermined interval between the counter electrode and the object, and applying a direct current or a pulse current between the object and the counter electrode to etch the portion to be etched of the object into a pattern corresponding to the pattern of the counter electrode.

U.S. Pat. No. 5,863,829 discloses a process for fabricating an SOI substrate with no peripheral scratches and with enhanced fabrication efficiency. The present process includes bonding a semiconductor wafer of an active substrate onto a semiconductor base wafer to form a bonded wafer. The active substrate is surface-grounded and then spin etched.

U.S. Pat. No. 5,866,441 discloses an electronic packaging module for inverted bonding of semiconductor devices, integrated circuits, and/or application specific integrated circuits and having protuberances on the conductive pattern of the substrate. The protuberances are ductile metal which is capable of being metallurgically bonded to the input/output pads of semiconductor devices. The input/output pads of the semiconductor devices are simulataneously bonded to the protuberances of the packaging module.

U.S. Pat. No. 5,872,025 discloses stacked three-dimensional devices prepared by stacking wafers as an alternative to stacking individual devices. Chip regions are formed on several wafers with each chip region being surrounded by a separation region, such as an insulator filled trench. The wafers are subsequently stacked with the chip regions in alignment. Aligning the wafers may be facilitated using notched regions in the periphery of the wafers. The wafers are subsequently joined together by lamination. After laminating the stacks of wafers, stacks of chips are separated by etching, dicing or other processes, which separate out stacked chip devices from the stacked wafer at the chip separation regions.

U.S. Pat. No. 5,872,700 discloses microcircuit packaging techniques, and more particularly packaging of a structure compiled of several microcircuits. Unpackaged components are mounted on a substrate, and to the substrate there is attached a tape. Solder bumps are formed on a side of the tape so that the whole structure can be mounted to a circuit board by applying conventional surface-mounting techniques. The connections between the solder bumps and the I/O lines of the substrate are realised by conductive patterns formed on the tape, and by leads provided at the edges of the tape.

U.S. Pat. No. 5,877,034 discloses a method of making a three-dimensional integrated circuit by the steps of: transferring fully processed devices from a device layer of first substrate to an auxiliary substrate, separating the auxiliary substrate and the devices thereon into individual chips, testing the chips for their functionality and mounting functioning chips on a carrier substrate in a side-by-side arrangement to form a device layer therein, and thereafter mounting a further device layer on the device layer of the carrier substrate.

Accordingly, there is a need in the art to provide a capacitance to the MCM module substrate which is capable of operating at higher frequencies. More specifically, there is a need for a method for efficiently producing a reliable high-density multilayer circuit structure in a cost effective manner.

SUMMARY OF THE INVENTION

The present invention provides a method for deplating defective capacitors comprising forming a plurality of capacitors on a semiconductor substrate, forming a plurality of metal contacts on the plurality of capacitors, and depositing a layer of photoresist on the semiconductor substrate. The method for deplating defective capacitor additionally comprises patterning the photoresist layer so that the plurality of metal contacts are exposed, contacting the exposed metal contacts with an electrically conductive solution, and deplating metal contacts which are disposed over defectively capacitors (e.g. capacitors having at least one short circuit). Also provided is a method for forming a multi-chip module comprising forming a thin-film polymeric interconnect structure having a first side and a second side disposed on a silicon substrate having active or passive devices, and mounting a computer chip on the first side of the thin-film interconnect structure. The method for forming a multi-chip module may further comprise reducing the thickness of the semiconductor substrate to form a thin semiconductor layer, and subsequently forming an aperture through the thin semiconductor layer. A ceramic carrier may be disposed on the semiconductor layer on a side opposite the interconnect structure. A further aspect of embodiments of the present invention is a multi-chip module comprising a thin-film polymeric interconnect structure having a first side and a second side, a chip disposed on the first side, and semiconductor layer disposed directly on the second side and having active or passive devices. The active devices may comprise SRAMS, and the passive devices may comprise chip capacitors. The semiconductor layer further comprises an aperture extending through the layer and filled with a solder material.

The present invention further provides a multichip module substrate capacitor structure comprising a substrate having a top surface and a bottom surface, a doped region of the substrate located at the substrate's top surface, an ohmic contact located on the top surface of the substrate, and a first dielectric layer disposed over the doped region. A first conductive layer includes a top surface and a bottom surface and is disposed over the first dielectric layer with its bottom surface adjacent to the first dielectric layer. The first conductive layer has at least a sub-layer of a first conductive material disposed at its top surface. A second dielectric layer is disposed over the first conductive layer, and an aperture is formed in the second dielectric layer over the first conductive layer to expose a portion thereof. A conductive via is formed through the aperture and is disposed against a portion of the first conductive layer and includes a second conductive material disposed adjacent to the sub-layer of the first conductive material of the first conductive layer. A second conductive layer is disposed over the second dielectric layer with its bottom surface adjacent to the second dielectric layer. The second conductive layer includes a portion therefor disposed over the conductive via.

Embodiments of the invention are also directed to methods for forming multilayer circuit structures, particularly high density multilayer circuit structures, having stacked via structures. The via structures are preferably stacked conductive posts.

One embodiment of the invention may be directed to a method for forming a multilayer circuit structure. The method comprises: forming a first plurality of conductive posts on first and second sides of a circuitized core structure, each conductive post having an end proximate to the core structure and an end distal to the core structure; depositing a first dielectric layer on the first side of the core structure; depositing a second dielectric layer on the second side of the core structure; removing dielectric layer material from the distal ends of the first plurality of conductive posts; and forming a second plurality of conductive posts on the distal ends of the first plurality of conductive posts.

Another embodiment is directed a method comprising: forming a first plurality of conductive posts on a side of a circuitized core structure, each conductive post having an end proximate to the core structure and an end distal to the core structure; laminating a dielectric layer on the core structure; depositing a protective layer on the dielectric layer; removing dielectric layer material from the distal ends of the first plurality of conductive posts through the protective layer; and forming a second plurality of conductive posts on the distal ends of the first plurality of conductive posts.

The present invention also provides a method for forming a solder bump on a metal comprising providing a metallic support; depositing a first solder layer on the metallic support; and depositing a second solder layer on the first solder layer. A third solder layer may be disposed on the second solder layer. The first solder layer comprises a first solder composition and the second layer comprises a second solder composition which is generally different than the first solder composition. The third solder layer comprises a third solder composition, which may be generally different than the second solder composition. In one preferred embodiment of the invention, the third solder composition is generally equal to the first solder composition. In another preferred embodiment of the invention the first solder composition and the third solder composition each comprise a major proportion of tin and a minor proportion of lead, and the second solder composition comprises a major proportion of lead and a minor proportion of tin. The metallic support may be a metal-filled via in a laminated substrate. Preferably, the metal-filled via comprises a blind via having a generally frusto-conical shape in vertical cross section. In another embodiment of the invention, a bonding sheet may be disposed on the substrate and the solder layers may be disposed in an opening in the bonding sheet.

The present invention further provides a method for forming a multilayered packaging assembly comprising forming a first metallic support on a first substrate; forming a second metallic support on a second substrate; depositing a first solder layer on the first metallic support; depositing a second solder layer on the first solder layer; and coupling the second solder layer to the second metallic support on the second substrate. The method additionally comprises rotating the second substrate 180 degrees prior to the coupling of the second solder layer to the second metallic support on the second substrate. The method further additionally comprises heating the first solder layer to a temperature higher than its melting point temperature but below a melting point temperature of the second solder layer. A third solder layer may be deposited on the second solder layer. In an alternative preferred embodiment of the invention, the method additionally comprises heating the first substrate to a temperature higher than a melting temperature of the first and third solder layers but below a melting point temperature of the second solder layer. A bonding sheet is preferably supported by the first substrate. An opening may be formed in the bonding sheet and one or more of the solder layers may be positioned in the opening. In another embodiment of the invention, the first substrate is subsequently heated to a temperature greater than the melting point temperature of the second solder layer, and the first substrate is then preferably cooled to a temperature which approximates a curing temperature of the bonding sheet.

The present invention also provides a substrate assembly and a multilayered packaging assembly. The substrate assembly comprises a substrate having a metallic member, a first solder layer disposed on the metallic member, and a second solder layer disposed on the first solder layer. The multilayered packaging assembly comprises a first substrate having a first metallic support, a first solder layer disposed on the first metallic support, a second solder layer disposed on the first solder layer, a third solder layer disposed on the second solder layer, and a second substrate having a second metallic support and coupled to the first substrate.

These provisions together with the various ancillary provisions and features which will become apparent to those skilled in the art as the following description proceeds, are attained by the methods and multilayered circuit structures of the present invention, preferred embodiments thereof being shown with reference to the accompanying drawings, by way of example only, wherein:

BRIEF DESCRIPTION OF THE DRAWINGS

FIG. 24 is a side elevational view of the LSI substrate assembly after being coupled to the pad-supporting substrate;

FIG. 25 is a partial enlarged sectional view of one embodiment of a post in FIG. 24 coupled to a metal pad;

FIG. 26 is a partial enlarged sectional view of another embodiment of a post in FIG. 24 coupled to a metal pad;

FIG. 33 is a side elevational view of another embodiment of the two assemblies of FIG. 23;

FIG. 34 is a side elevational view of the two assemblies of FIG. 33 coupled together;

FIG. 35 is an enlarged elevational view of a post in FIG. 34 coupled to a cup member;

FIG. 36 is a partial perspective view of a wire interconnect structure (e.g., a WIT) spaced from a cup member;

FIGS. 54 to 57A illustrates the fabrication process for forming a substrate having a plurality of metal-filled vias with each via supporting an embodiment of the solder bump(s) of the present invention;

FIGS. 58A to 63A illustrate one embodiment of process flow steps for forming the multilayer circuit structure assembly of FIG. 53;

FIGS. 58B to 65B illustrate another embodiment of process flow steps for forming the multilayer circuit structure assembly of FIG. 53;

DETAILED DESCRIPTION OF PREFERRED EMBODIMENTS OF THE INVENTION

Figure 1:
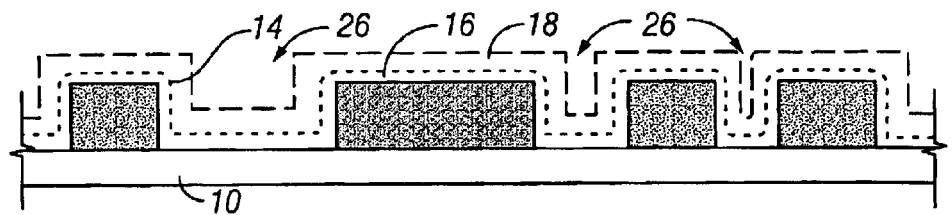
FIG. 1 is a side elevational view of conformal polymer layer(s) disposed on a substrate assembly and over conductor pads.

Referring in detail now to the drawings, there is seen in FIGS. 1–22 various embodiments of a structure and method for making a low dielectric constant MCM. Structures and methods of the type illustrated in FIGS. 1–22 are of priority of future generation MCM's as they will enable gigahertz speed products without huge losses, noise, and delays. The advantages of a low dielectric constant MCM of the various embodiments of the present invention are: (1) higher performance MCMs may be made with lower dielectric constants; (2) reduces amount of chemical mechanical polishing (CMP) required by using only conformal dielectric coatings in the MCMs; (3) enables better dielectric-layer adhesion than possible with only one type of dielectric polymer because of using two or more dielectric polymers; and (4) enables controlled impedance structures. A dielectric constant is a value serving as an index of the ability of the dielectric material(s) (e.g., polymers) to resist the transmission of an electrostatic force from one charged body to another. The dielectric materials utilized in various embodiments of the present invention for producing low dielectric constant MCMs have a low dielectric constant, such as a dielectric constant less than about 3.8 at 20° C. In a preferred embodiment of the invention, the dielectric constant at 20° C. for the dielectric materials ranges from about 1.2 to about 3.4; preferably from about 1.4 to about 3.0; more preferably from about 1.6 to about 2.8; most preferably from about 1.8 to about 2.7; such as from about 2.0 to about 2.6 including from about 2.1 to about 2.5.

Suitable dielectric material(s) include B-stage polymeric compounds, such as polyimides, epoxy resins, polyurethanes or silicons, provided that these compounds are produced with a low dielectric constant at 20° C. Additional suitable materials could include thermosetting materials, such as high glass transition anhydride-cured epoxy composition possessing a low dielectric constant at 20° C. More particular suitable thermoset materials include, but are not limited to, one or more compounds produced with a low dielectric constant at 20° C. and selected from group consisting of epoxies and modified epoxies, melamine-formaldehydes, urea formaldehydes, phelonic resins, poly (bis-maleimides), acetylene-terminated BPA resins, IPN polymers, triazine resins, and mixtures thereof. Further additional suitable materials include high temperature thermoplastic materials, such as liquid crystal polyesters (e.g., Xydar™ or Vectra™), poly-(ether ether ketones), or the poly(aryl ether ketones), provided that these thermoplastic materials are produced such as to possess the low dielectric constant at 20° C. Additional suitable thermoplastic materials include, by way of example only, ABS-containing resinous materials (ABS/PC, ABS/polysulfone, ABS/PVC), acetals acrylics, alkyds, allylic ethers, benzocyclobutenes, cellulosic esters, chlorinated polyalkylene ethers, cyanate, cyanamides, furans, parylene amorphous fluoropolymers, polyalkylene ethers, polyamides (Nylons), polyarylene ethers, perfluoroalkoxy polymeric resins, fluoroethylenepropylene polymers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, and the like, and mixtures of any of the foregoing, provided that the materials are manufactured to have a low dielectric constant at 20° C.

In another preferred embodiment of the invention the low dielectric constant material comprises a polymer having the repeat structure $(-CH_2C_6H_4CH_2-)_n$ wherein n is an integer having a value ranging from about 2,000 to about 8,000; more preferably from about 3,000 to about 7,000; most preferably from about 4,000 to about 6,000, such as from about 4,500 to about 5,500 including from about 4,800 to about 5,200. In a further embodiment of the invention the low dielectric constant material comprises the repeat structure $(-CF_2-CF_2-)_n$ wherein n is an integer having a value ranging from about 3,000 to about 16,000; more preferably from about 4,000 to about 14,000; most preferably from about 8,000 to about 12,000.

Figure 2A:
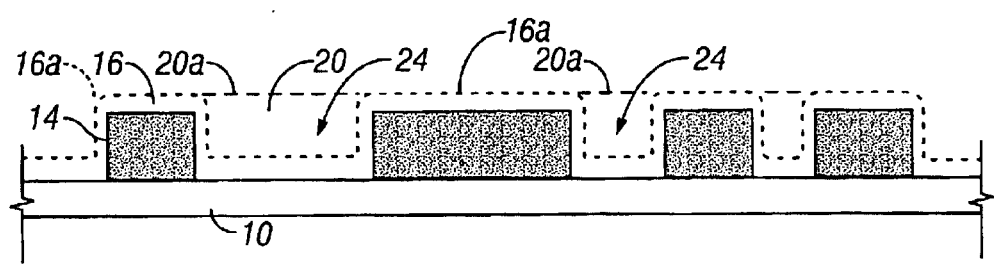
FIG. 2 is a side elevational view of the substrate assembly of FIG. 1 after deposition of gap-filling polymer.
Figure 2B:
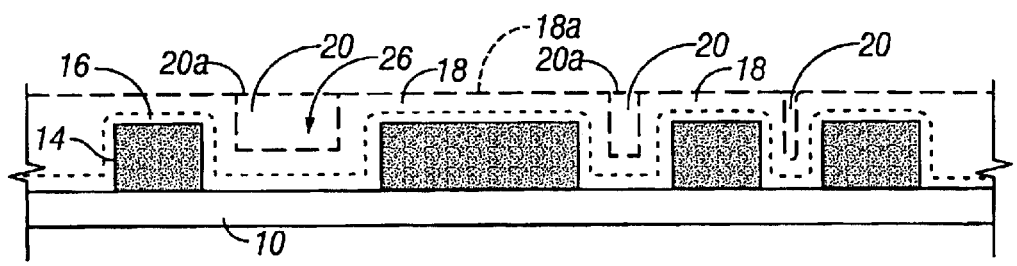
Figure 3:
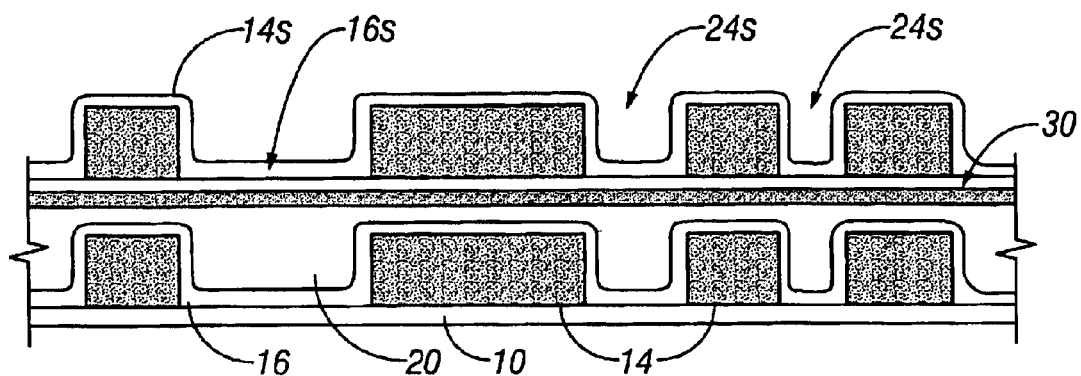
FIG. 3 is a side elevational view of an alternative substrate assembly with impedance control and ground planes deposited over polymeric CVD layers.

Referring now to FIGS. 1–3, a thin conformal coating of one low dielectric constant layer of material 16 is first deposited over the conductor traces 14 (i.e., Cu) supported by substrate 10. A conformal coating is a coating which has sufficient viscosity to generally conform to an underneath supporting surface as shown in FIG. 1. A conformal coating is also a coating which deposits in a generally uniform thickness as shown in FIG. 1. A conformal coating is furthermore a coating which does not have to be polished (e.g., such as by CMP) after deposition. Conductor traces 14 (or pads or regions) may be plated and/or sputtered onto substrate 10. This layer of material 16 provides good adhesion to the conductor traces 14, and may be deposited by any suitable manner, such as chemical vapor deposition (CVD), sprayed on, or spun on. Optionally, a second low dielectric constant layer of material 18, preferably a conformal layer of material 18, may subsequently be deposited on and/or over layer of material 16. The layer of material 18 may be manufactured from a material having less adhesion to the conductor traces 14 but good adhesion to the layer of material 16. Thus, by way of example only, the material 16 may comprise the repeat structure $(—CH_2C_6H_4CH_2—)_n$ where n ranges from about 4,500 to about 5,500; and material 18 may comprise a fluorinated parylene, such as, by way of example only, one having the repeat structure $(—CHFC_6H_2F_2CHF—)_n$ wherein n is an integer having a value ranging from about 2,000 to about 8,000; more preferably from about 3,000 to about 7,000; and most preferably from about 4,000 to about 6,000. The low dielectric constant for material 16 may have a value which is less than, or more than, the value of the low dielectric constant for the material 18. More specifically, the dielectric constant for material 16 may be less than about 2.3 (or less than about 1.8) whereas the dielectric constant for material 18 may be greater than about 2.3 (or greater than about 1.8), i.e., a value ranging from greater than about 1.8, or from about 2.3 to about 3.8, and vice versa, i.e., dielectric constant for material 18 is less than about 2.3, or less than about 1.8, and the dielectric constant for material 16 is greater than about 1.8, or greater than about 2.3 up to and including about 3.8.

Figure 4:
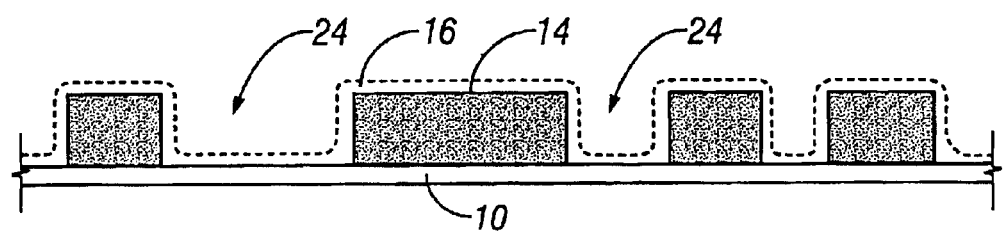
FIG. 4 is a side elevational view of the substrate assembly of FIG. 3 after deposition of gap-filling polymer.

A gap-filling material 20 is subsequently deposited (e.g., spun on) in voids 24 between spaced material 16 (see FIG. 2A and FIG. 4). In FIGS. 1 and 2B, the gap-filling material 20 is disposed (e.g., spun on) in voids 26 between spaced material 18 which is supported by material 16. Any excess gap-filling material 20 extending about material 16 and/or material 18 may be polished or planarized down until a planar surface 20a registers with planar surfaces 16a—16a of material 16 or with planar surfaces 20a—20a of material 20 (see FIG. 2A). The material 20 is one or more of the previously mentioned low dielectric constant materials. The low dielectric constant for material 20 may be the same as, less than, or greater than the dielectric constant for material 16 and/or material 18.

Fluorinated parylene $AF_4$ has a dielectric constant of approximately 2.3 with a very low dissipation constant (approaching that of Teflon). Future $AF_4$ variants will have even lower values of dielectric constant and dissipation factor. It has been surprisingly discovered that heat treatments in a specific temperature range result in highly desirable improvements in the mechanical properties of parylene $AF_4$ films. Without this inventive heat treatment, the thermal expansion coefficient of films are in excess of 100 ppm. Following the heat treatment, the films exhibit thermal expansion coefficients of ~35 ppm. Even more importantly, the total elongation to plastic instability of the films is changed >100% from undesirable values of 5–10% to much more desirable values in excess of 15–20%. Without a property enhancement such as this, it is very unlikely that multilayer electrical circuits could be manufacturable or made reliable.

Free standing parylene $AF_4$ films of ~50–100 micron thickness were deposited by the Gorham process at platen temperatures of both −15° C. and −25° C. The lower temperature deposition temperature is believed to result in higher molecular weights of the polymer film. From these films dogbone specimens with gauge widths of 4 mm and gauge lengths of 1 cm were cut using a YAG laser. The specimens were then pulled to failure in an Instron at strain rates of $10^{-2}$/sec. The lower molecular weight film became plastically unstable and fractured at essentially the same lower strain values of ~6–9%. The higher molecular weight films became plastically unstable at essentially the same strains as the higher molecular weight film. The toughness of these films is unacceptable for multilayer film build-up (strains in excess of 10% prior to plastic instability are required). The films exhibit young's moduli of approximately 1 Gpa and sustain stresses of roughly 50 Mpa to the point of plastic instability. The following vacuum (<1 mbar) heat treatments of the films as set forth in the following Table 1 were performed prior to cutting the tensile specimens:

TABLE I

| Heat Treatment (HT) Temperature (° C.) | Time @ HT Temperature | Elongation prior to plastic instability |
| --- | --- | --- |
| As-Received | | <5–8% |
| 280 | 1 hr | ~10% |
| 300 | 1 hr | ~10% |
| 300 | 4 hr | ~10% |
| 330 | Ramp and cool | ~20% |
| 330 | 1 hr | ~20% |
| 330 | 16 hr | ~20% |
| 400 | 1 hr | ~20% |
| 450 | 1 hr | ~10% |

In another embodiment of the invention and as best shown in FIG. 3, a ground layer 30 may be disposed over material 20; or alternatively, over material 18 which is used to fill the voids 24 instead of material 20. Subsequently, a second material 16s is deposited as indicated with second conductor traces 14s disposed as shown in FIG. 3. The ground layer 30 may serve to both control impedance and provide mechanical stability to the structure.

Figure 5:
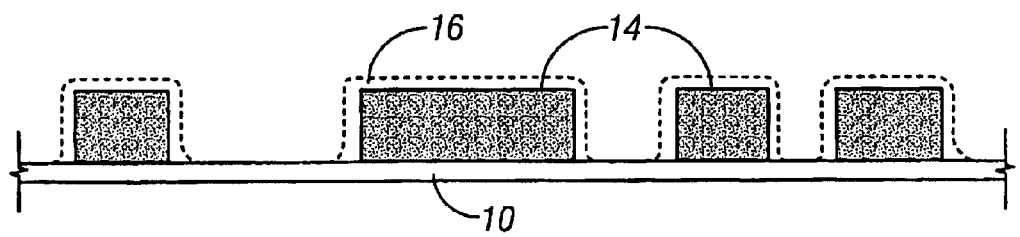
FIG. 5 is a side elevational view of a substrate assembly with conformal polymer layer(s) on a substrate assembly and over conductor(s) and previously deposited layers.
Figure 6:
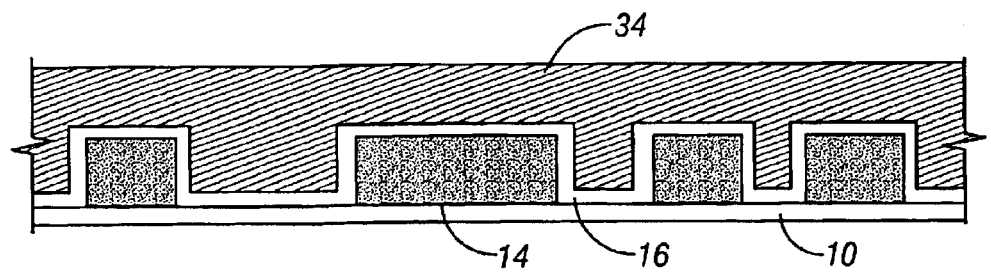
FIG. 6 is a side elevational view of the substrate assembly of FIG. 1 after deposition of an organic or inorganic gap-filling layer.
Figure 7:
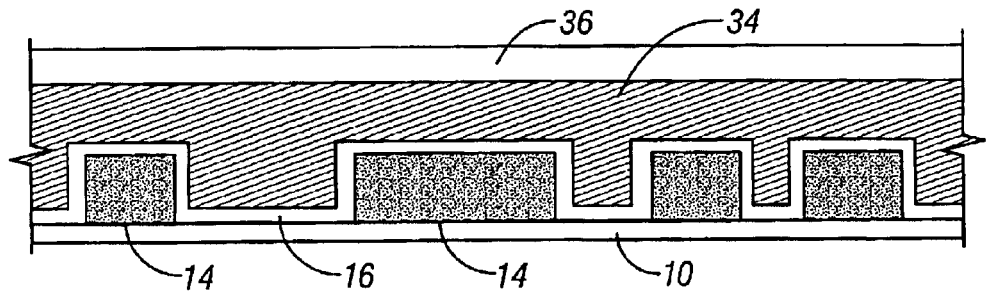
FIG. 7 is a side elevational view of the substrate assembly of FIG. 6 after depositing a planarizing layer(s) to provide a compliant sealant layer, to facilitate chemical mechanical polishing and further build-up.
Figure 8:
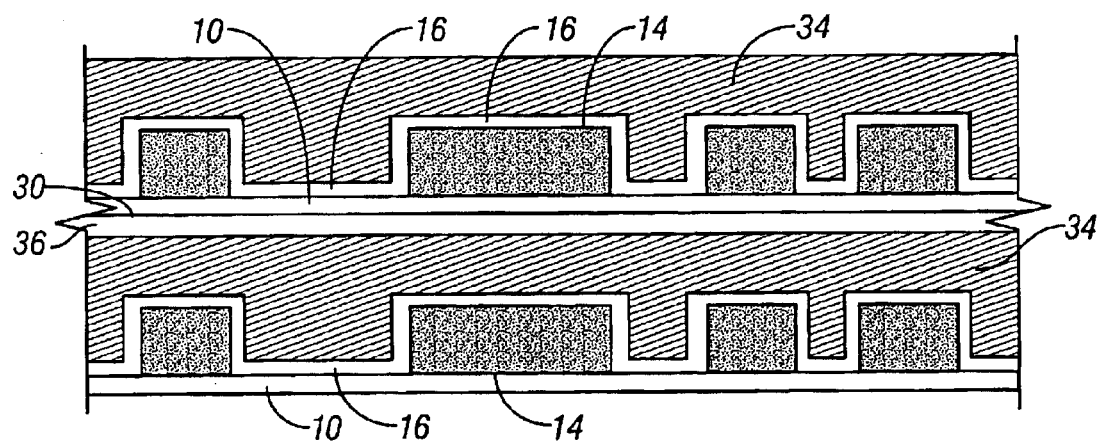
FIG. 8 is a side elevational view of the substrate assembly of FIG. 7 after subsequent build-up.
Figure 9:
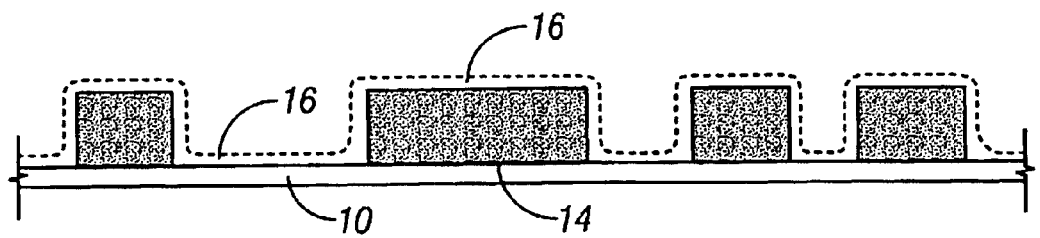
FIG. 9 is a side elevational view of part of the substrate assembly of FIG. 5.
Figure 10:
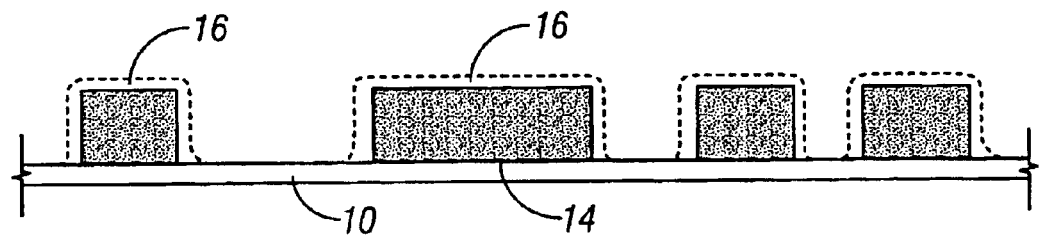
FIG. 10 is a side elevational view another part of the substrate assembly of FIG. 5.

Referring now to FIGS. 4–8 for another embodiment of the invention, masking may be used on the layer of material 16 to remove or discontinue material 16 from one conductor trace 14 to a contiguous conductor trace 14, as best shown in FIG. 5. Subsequently, a low dielectric constant material 34, such as xerogel, sesquisilones, etc., is deposited over the material 16. The layer of material 34 may be thermally cured and may contain or develop voids and cracks, especially as deposited layers exceed about one micron in thickness. Subsequently chemical mechanical polishing (CMP) and structural stability are facilitated with a deposit of a low dielectric constant layer 36 (see FIG. 7), such as Teflon AF, parylene, PAE, BCB or low molecular weight reactive oligimers with low dielectric constants. CMP may then be performed and a next layer may be constructed. An additional or alternative layer (not shown in the drawings) of parylene, PAE, BCB or low molecular weight reactive oligimers with low dielectric constants may be deposited after CMP of the layer of material 34 to better enable a subsequent layer (not shown) of conductor to adhere. As was seen for the embodiment of the invention in FIG. 3, the conformal coating of material 36 may be thicker than the layer of material 34, and subsequently the conducting ground layer 30 may be deposited on material 36 as shown in FIG. 8. This ground layer 30 may serve to both control impedance and provide mechanical stability to the structure. These "sidewalls" of the impedance controlling ground layer 30 may alternatively be deposited to a thickness for which adjoining sidewalls bridge one another.

Figure 11:
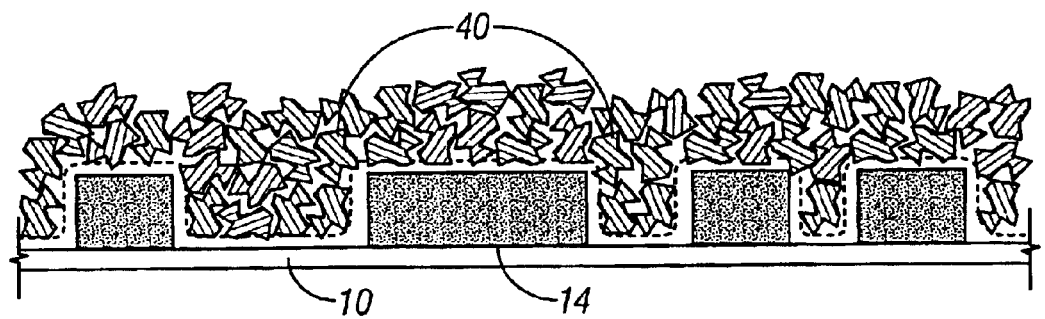
FIG. 11 is a side elevational view of the substrate assembly of FIG. 1 after low dielectric constant thermoplastic particulates were deposited.
Figure 12:
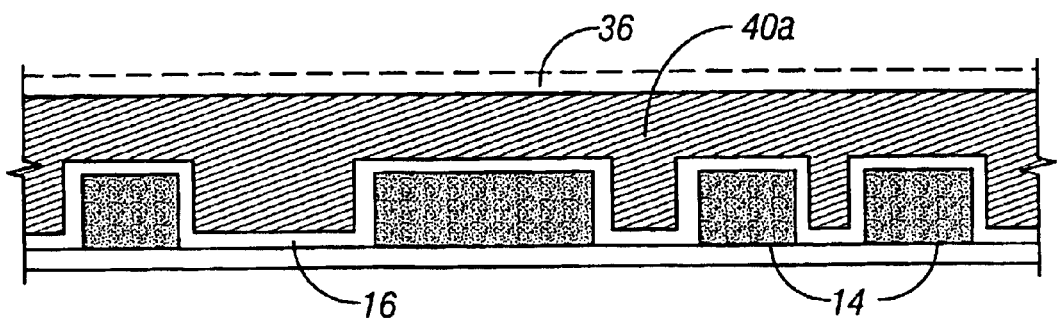
FIG. 12 is a side elevational view of the substrate assembly of FIG. 11 after thermal treatment.
Figure 13:
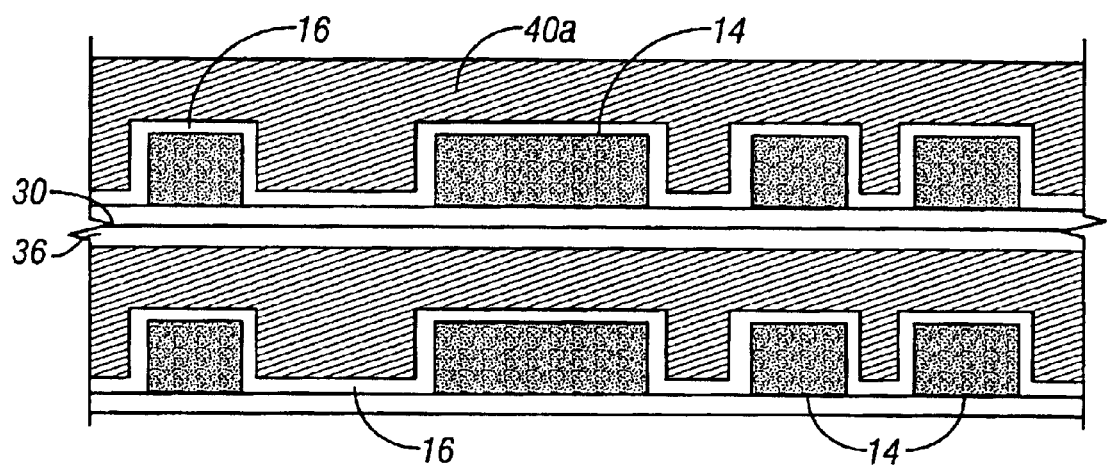
FIG. 13 is a side elevational view of the substrate assembly of FIG. 12 after build-up with another substrate assembly.
Figure 14:
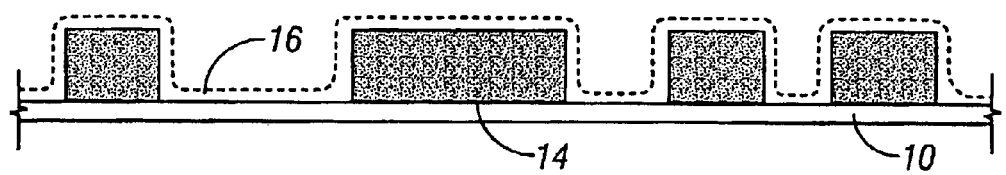
FIG. 14 is a side elevational view of part of the substrate assembly of FIG. 5.
Figure 15:
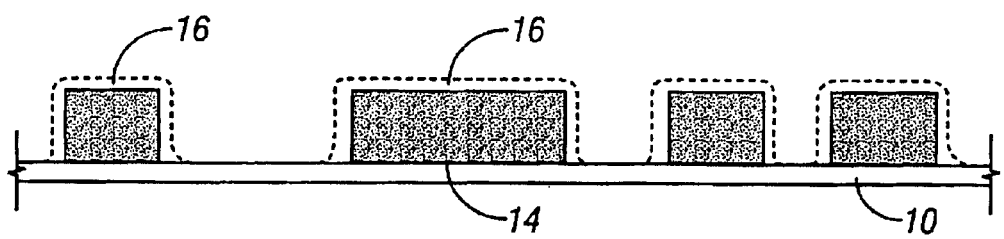
FIG. 15 is a side elevational view of another part of the substrate assembly of FIG. 5.

Referring now to FIGS. 9–22 for additional embodiments of the present invention, there is seen in FIG. 11 a plurality of low dielectric constant particulate material 40. The particulate material 40 may comprise or consist of material 16 and/or material 18 and/or material 34, or any of the previously mentioned low dielectric constant material(s). The particulate material 40 may be applied to the surface of material 16 and/or material 18 by any suitable manner, such as by spreading, spray, transfer, etc. The particulate material 40 is then thermally processed to flow material 40 and enable it to substantially fill the gaps to produce material 40a (see FIG. 12). The temperature (e.g., a temperature ranging from about 85° C. to about 200° C.) to cause particulate material 40 to flow would depend on the composition of low dielectric constant material 40. Voids may be retained in this layer if desired. Material 36 may be disposed on material 40*a*, and ground layer 30 may be deposited on material 36, followed by disposing on ground layer 30 another assembly of traces 14, material 16 and material 40*a*.

Referring now to FIGS. 14–17, a thin, essentially conformal coating of one low dielectric constant material 16 (i.e., parylene, PAE, BCB or low molecular weight reactive oligimers with low dielectric constants) is first deposited over the conductor traces 14 (i.e., Cu). The conductor traces 14 may be plated and/or sputtered onto substrate 10. Layer of material 16 possesses good adhesion for the conductor traces 14. Material 16, as previously indicated, is preferably deposited from the vapor phase, but may be spun or sprayed on. An optional separate or phased-in (gradient composition or co-deposited) thin conformal layer 18 with less adhesion to the conductor traces 14 but good adhesion to the first layer 16 (e.g., inorganic containing dielectrics, fluorinated parylene, fluorinated PAE, fluorinated BCB or low molecular weight reactive oligimers with low dielectric constants) may then be deposited, as shown in FIG. 2B. This layer 18 should also have good adhesion to successive additions and layers. Masking can be used to make such polymer layers discontinuous from conductor to conductor. Such layers may serve as a diffusion or electromigration barriers as well as an adhesion promoter.

Figure 16:
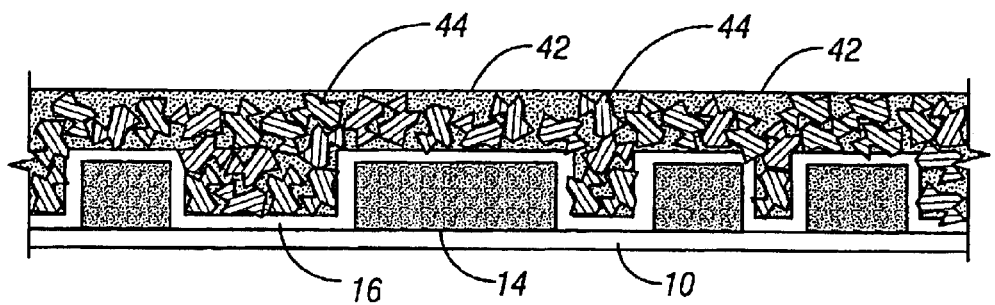
FIG. 16 is a side elevational view of the substrate assembly of FIG. 14 after depositing a composite of low dielectric constant polymer particulates within another planarizing low dielectric constant polymer.

Next, and as shown in FIG. 16, a composite layer of polymer 42 (e.g., Teflon AF, liquid crystal polymer, etc.) and/or inorganic containing dielectrics is deposited together within another planarizing low dielectric constant material (e.g., inorganic containing dielectrics, fluorinated BCB or low molecular weight reactive oligimers with low dielectric constants). Particulates 44 may be pressed into fluid or fluid spun on lightly compressed (and/or partially sintered) particulates. Also, they can be co-deposited by spray or spin-on processes. Alternatively, the particulates 44 may be precipitated out of solution (chemically or via solvent removal). The structure may alter its spatial geometry during curing as the thermoplastics may flow somewhat at elevated temperatures. Voids may be retained in this layer. Subsequent CMP and structural stability may be facilitated with a planarizing deposit of inorganic dielectric, BCB or low molecular weight reactive oligimers with low dielectric constants deposition on top of the thermoplastic. CMP may then be performed and a next layer can be constructed. An additional layer of inorganic containing dielectric, parylene, PAE, BCB or low molecular weight reactive oligimers with low dielectric constants may be deposited after CMP to better enable the next layer of conductor to adhere.

Figure 17:
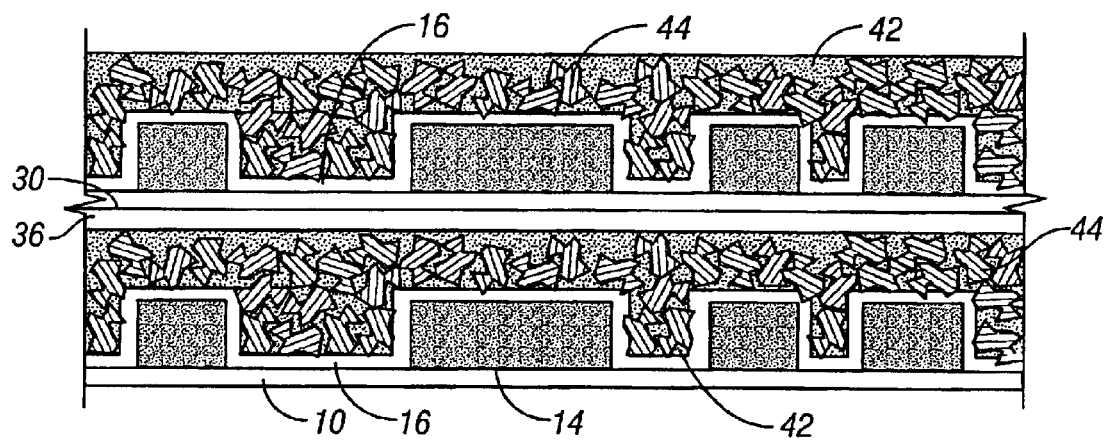
FIG. 17 is a side elevational view of the substrate assembly of FIG. 16 after build-up with another substrate assembly.
Figure 18:
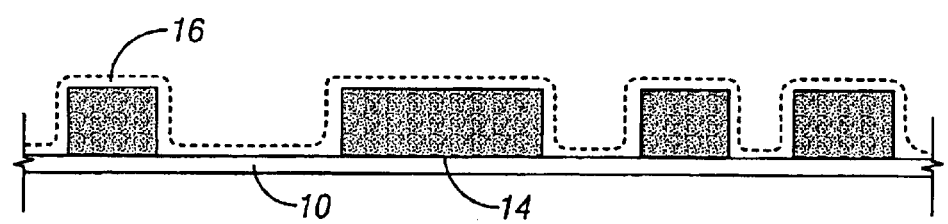
FIG. 18 is a side elevational view of part of the substrate assembly of FIG. 5.
Figure 19:
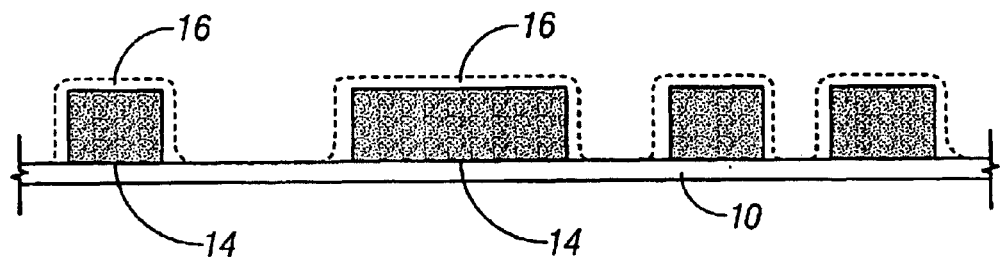
FIG. 19 is a side elevational view of another part of the substrate assembly of FIG. 5.
Figure 20:
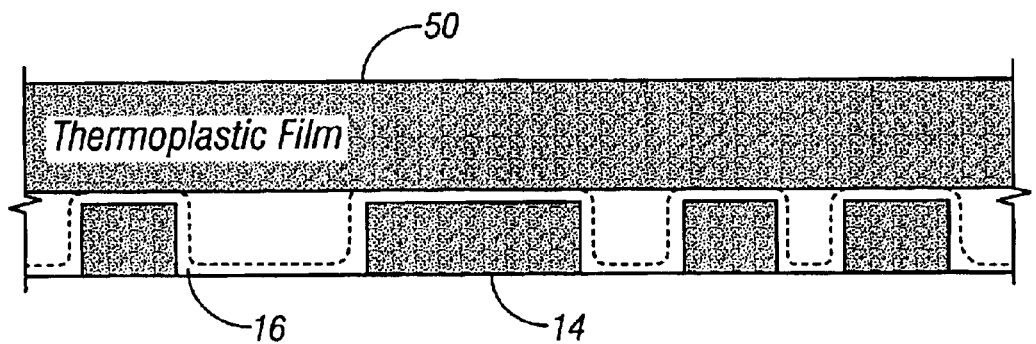
FIG. 20 is a side elevational view of the substrate assembly of FIG. 18 after disposing a thermoplastic low dielectric constant polymer film on top thereof.

As best shown in FIG. 17, another conformal polymer layer 42 and conductor traces 14 may be formed for further circuit buildup. The optional ground layer 30 may be deposited prior to this second layer buildup for dimensional stability and/or electrical performance.

Figure 21:
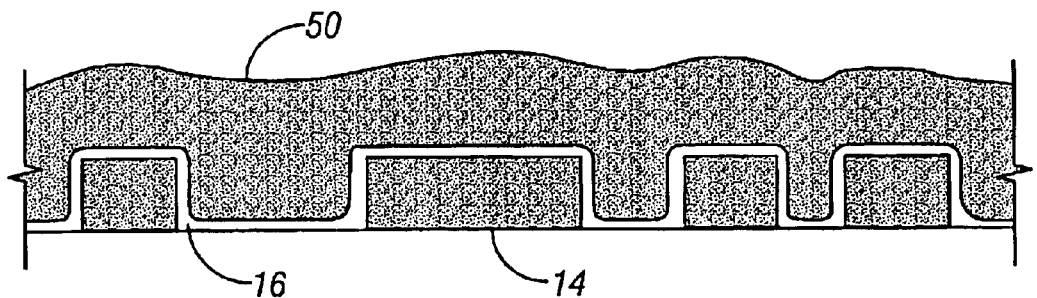
FIG. 21 is a side elevational view of the substrate assembly of FIG. 20 after thermal treatment.
Figure 22:
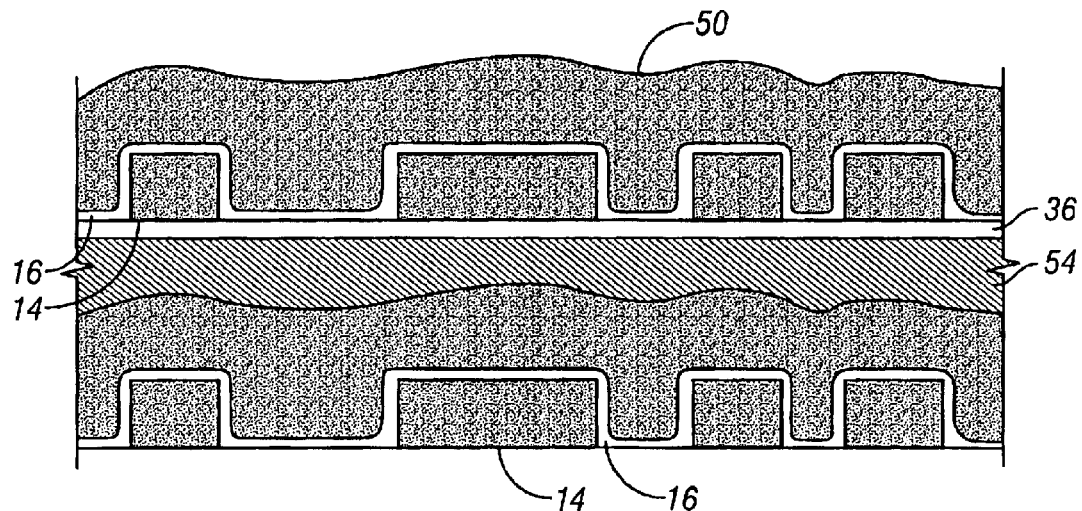
FIG. 22 is a side elevational view of the substrate assembly of FIG. 20 after disposing an optional planarizing layer and subsequent build-up of successive layers.
Figure 23:
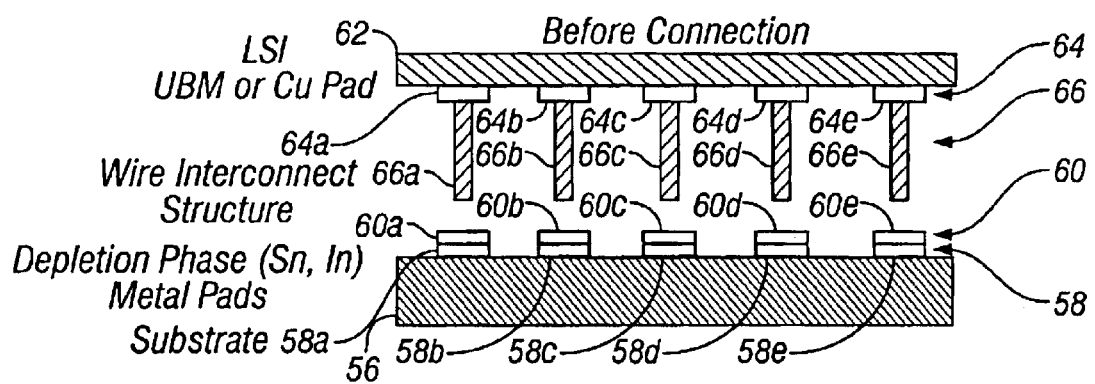
FIG. 23 is a side elevational view of an LSI substrate assembly separated from a substrate supporting metal pads.

Referring now to FIGS. 18–22, after the low dielectric constant assembly is formed (see FIGS. 18–19), as the same low dielectric assembly of FIGS. 4–5, 9–10 and 14–15 was formed, a thermoplastic film 50 (e.g., Teflon AF, PFTE, PFA, FEP, liquid crystal polymer, etc.) with low dielectric constant is placed over the appropriately coated circuitry. The film 50 may be thermally laminated or autoclaved onto the circuitry, as best shown in FIG. 21. Subsequent CMP and structural stability may be facilitated with a planarizing deposit of inorganic dielectric, BCB or low molecular weight reactive oligimers with low dielectric constants deposition on top of the thermoplastic. As previously indicated, CMP may then be performed and a next layer may be formed. An additional layer of inorganic containing dielectric material 54, such as parylene, PAE, BCB or low molecular weight reactive oligimers with low dielectric constants may be deposited on film 50, followed preferably by CMP to better enable the next layer of conductor to adhere. FIG. 22 discloses a second layer build-up, similar to the second layer build-ups of FIGS. 8, 13, 17 and 22.

Referring now to FIGS. 23–36 for describing a method and structure which utilizes the "Wire Interconnect Structure" (WIT) and "Transient Liquid Alloy Bonding" (TLAB) on ultra-fine-pitch flip chip technology. WIT structure provides an ultra-fine-pitch interconnection method between LSI and a substrate. TLAB provides a reliable lead-free bonding method. The depletion layer of the TLAB can be located at the bottom pad (substrate side), on the wire structure, or at the middle of the wire structure.

Figure 27:
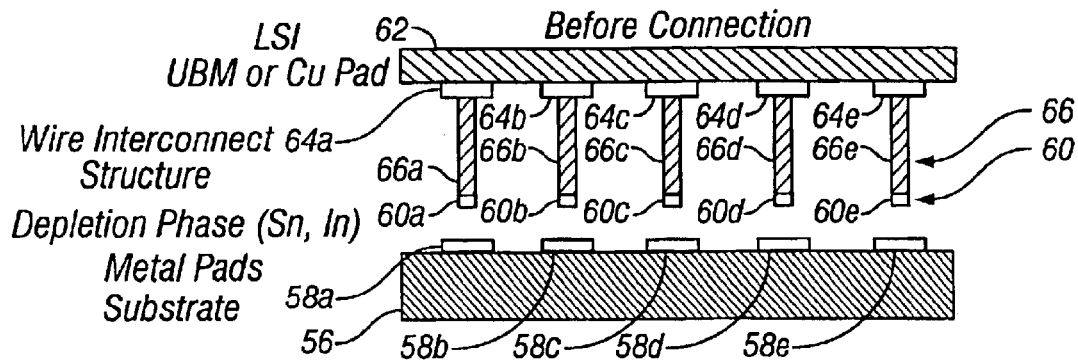
FIG. 27 is a side elevational view of another embodiment of the two assemblies of FIG. 23.
Figure 28:
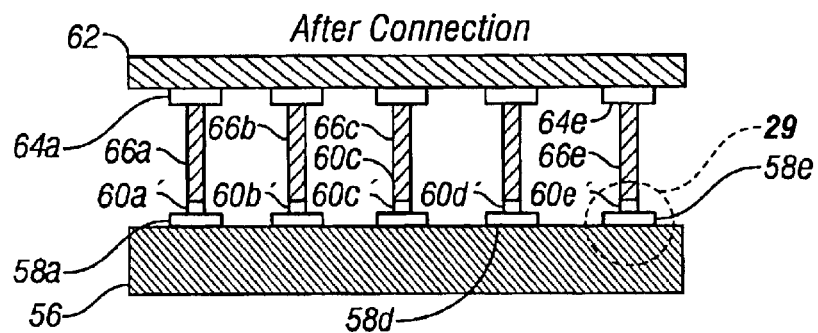
FIG. 28 is a side elevational view of the two assemblies of FIG. 27 coupled together.
Figure 29:
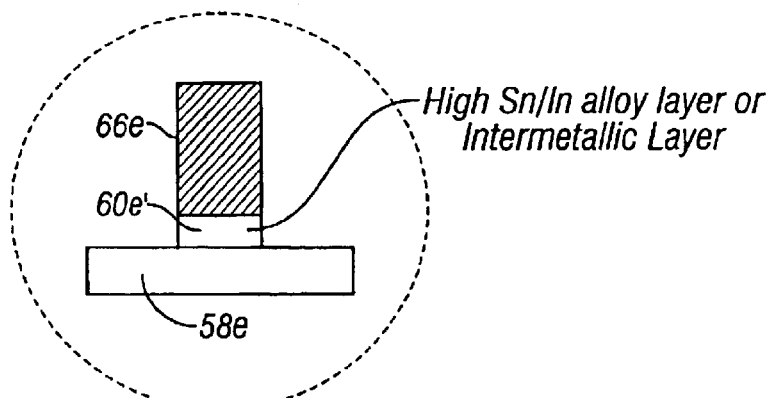
FIG. 29 is a partial enlarged elevational view of one embodiment of a post in FIG. 28 coupled to a metal pad.
Figure 30:
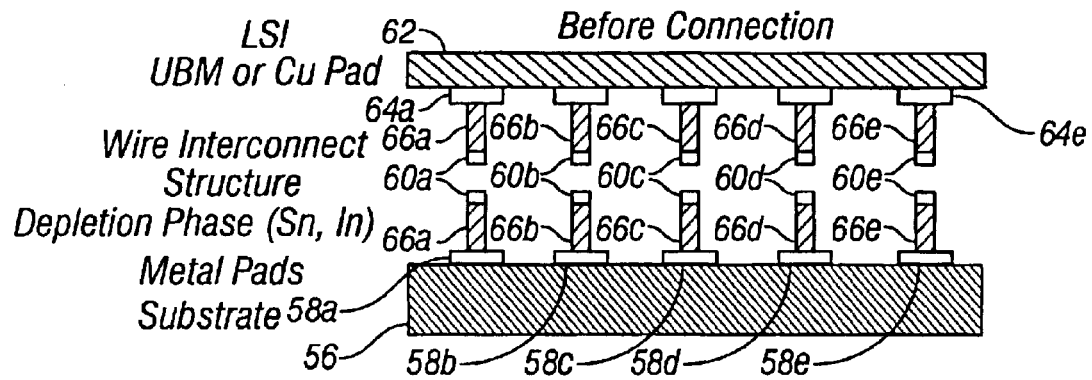
FIG. 30 is a side elevational view of another embodiment of the two assemblies of FIG. 23.
Figure 31:
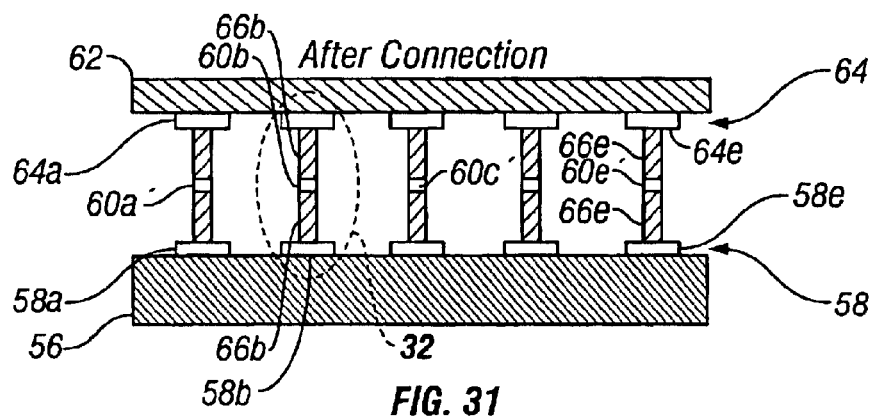
FIG. 31 is a side elevational view of the two assemblies of FIG. 30 coupled together.
Figure 32:
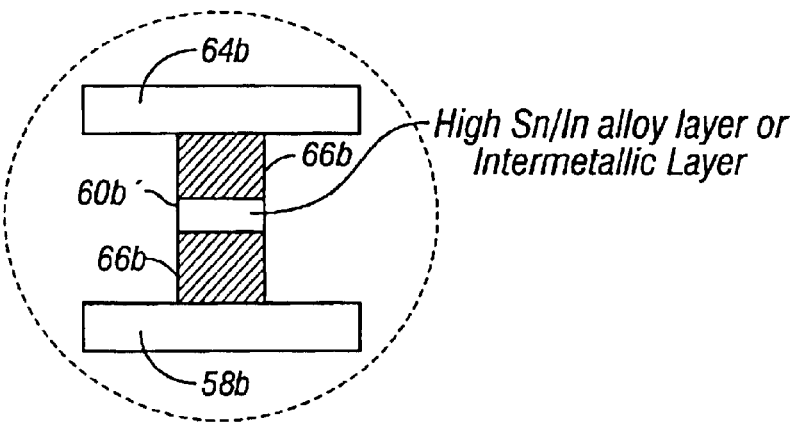
FIG. 32 is an enlarged elevational view of two posts in FIG. 31 coupled together.
Figure 37:
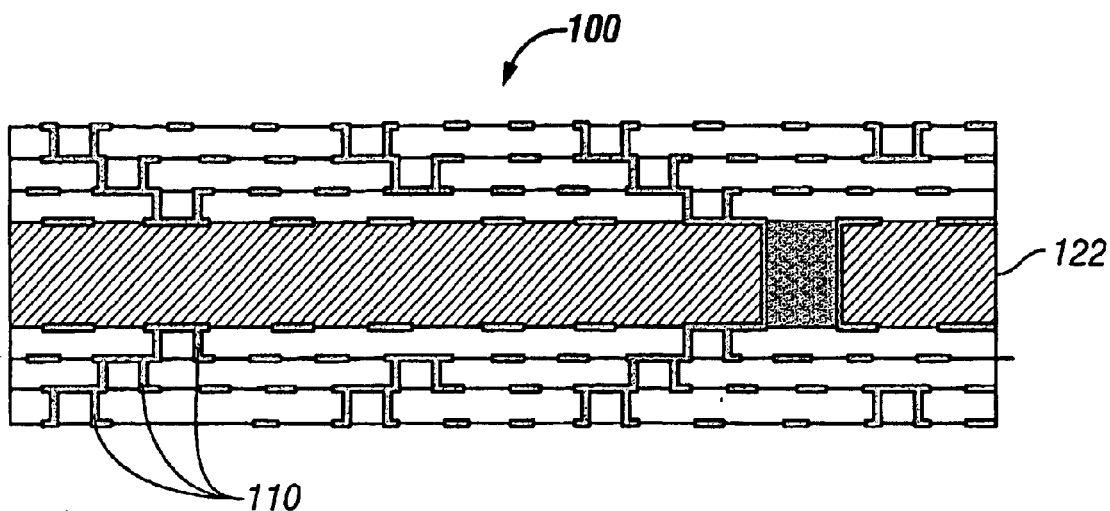
FIG. 37 shows a cross section of a multilayer circuit structure with staggered via structures.

As respectively illustrated in FIGS. 23–26, FIGS. 27–29, FIGS. 30–32, and FIGS. 33–36, embodiments of the invention include four types of structures. The first structure of FIGS. 23–26 illustrates the WIT on an LSI side and a depletion phase (Sn, In or Sn/In alloy) on a substrate side. The second structure of FIGS. 27–29 illustrates the depletion phase on the WIT structure, which may be done by sequential electroplating. The third structure of FIGS. 30–32 illustrates the depletion phase located at the middle of the final WIT structure, which is accomplished by electroplating of depletion phase on one side of WIT or both sides (i.e., half-WIT is built on both sides first). The fourth structure of FIGS. 33–36 illustrates a cup structure combined with the WIT structure. The cup structure provides an anchoring function to hold the WIT tip. It supports the structure with a good laterally mechanical strength and can transfer the shearing stain/stress directly to the WIT structure but not the joint interface. In the fourth structure, the Sn can be within the cup structure or on the tip of WIT. Also, the cup height can be low, which will be functioned to compensate the stress concentration directly, or be high to avoid the high stress point.

Referring more specifically now to FIGS. 23–36, there is seen a substrate 56 supporting a plurality of metal pads 58 (i.e., pads 58*a*, 58*b*, 58*c*, 58*d* and 58*e*) which in turn support depletion layers 60 (i.e., depletion layers 60*a*, 60*b*, 60*c*, 60*d* and 60*e* such as Sn and/or In deposited by electroplating). There is also seen an LSI substrate 62 supporting a plurality of conductive pads 64 (i.e., conductive pads 64*a*, 64*b*, 64*c*, 64*d* and 64*e*), having connected thereto wire interconnect structures (WISs) 66 (i.e., WTIs 66*a*, 66*b*, 66*c*, 66*d* and 66*e*) which may be fabricated by electroplating with a thick photoresist and preferably may be copper and/or gold. The advantage of gold is that it can provide better elasticity when employed at a high CTE mismatch circumstance. In FIGS. 27, 30 and 33, the depletion layers 60*a*, 60*b*, 60*c*, 60*d* and 60*e* are respectively deposited on the terminal ends of the WTIs 66*a*, 66*b*, 66*c*, 66*d* and 66*e*. In FIG. 30, WTIs 66 are divided such that part of the respective WTIs 66 is coupled to and supported by LSI substrate 62 and part is coupled to and supported by substrate 56. Furthermore with respect to the embodiment of the invention in FIG. 30, depletion layers 60 are divided between the two sets of WTIs 66—66 and disposed on terminal ends of the respective WTIs 66—66. In FIG. 33 substrate 56 supports a plurality of conductive cups 68 (i.e., cups 68*a*, 68*b*, 68*c*, 68*d* and 68*e*) for receiving terminal ends of WTIs 66 including the respective depletion layers 60 associated with the terminal ends of WTIs 66. The conductive (e.g., copper) cups 68 are preferably fabricated by electroplating. A donut shape ring is exposed for depositing the conductive cups 68. The depletion layers 60 may be deposited on the terminal ends of the WITs 66 or inside the respective conductive cups 68 either by electroplating, immersion or evaporation.

The LSI substrate 62 and substrate 56 are aligned by a suitable aligner, e.g., a flip-chip bonder by Karl Suess. The aligned pair is subsequently pressed and heated by a flip-chip bonder in air or nitrogen environment. The temperature needs to be higher than the melting point of the depletion layers 60 and held for a certain period of time. The melting temperature is around 232° C. for Sn, 157° C. for In and between 120° C. to 232° C. for Sn—In temperature alloy (depending on the alloy composition). The time should be long enough to convert the molten phase of depletion layers 60 completely into an alloy or intermetallic compounds $60a'$, $60b'$, $60c'$, $60d'$ and $60e'$ with the base metal (e.g., copper or gold). More desirably, the depletion layers 60 are to be converted completely into a strong and reliable metal phase which depends on the metallurgical system used. Lastly, the underfill is applied between the interconnects to form a reliable chip packaging. Another alternative way to put in underfill material is during the bonding process by using a liquid-type underfill that can be cured during the bonding process.

Referring in detail now to FIGS. 37–52, embodiments of the invention are directed to methods for forming multilayer circuit structures. In preferred embodiments, the methods comprise forming a first plurality of conductive posts on first and second sides of a circuitized core structure. Each conductive post has an end proximate to the core structure and an end distal to the core structure. After the conductive posts are formed, a first dielectric layer is deposited on the first side of the core structure and a second dielectric layer is deposited on the second side of the core structure. Dielectric layer material deposited on the distal ends of the first plurality of conductive posts is then removed. After removing the dielectric layer material from the ends of the posts, circuit patterns are formed on the dielectric layers. The formed circuit patterns can include conductive pads disposed over the cleaned distal ends of the posts. A second plurality of conductive posts can then be formed on the conductive pads on the distal ends. The second plurality of conductive posts can be stacked on the first plurality of conductive posts. Additional sets of subsequently formed conductive posts (e.g., third, fourth pluralities) and pads can be stacked on the second plurality of conductive posts to form a plurality of generally vertical conductive pathways (e.g., generally perpendicular to the orientation of the core structure) through the dielectric layers. The generally vertical conductive pathways can result in a multilayer circuit structure which occupies less space than a similar multilayer circuit structure having staggered via structures.

In embodiments of the invention, multilayer circuit structures can be formed quickly and efficiently. For example, in preferred embodiments, the dielectric layers, conductive posts, and conductive patterns including conductive pads can be simultaneously formed or deposited on opposite sides of multilayer circuit structure precursors (e.g., a core structure). For example, in embodiments of the invention, conductive posts can be simultaneously electroplated on conductive regions on opposite sides of a core structure. Furthermore, in preferred embodiments, the multilayer circuit structures having stacked conductive posts can be formed using less expensive processes such as photolithography and electroplating. More expensive techniques such as laser drilling are not needed in preferred embodiments of the invention. Consequently, high density multilayer circuit structures having high circuit densities can be formed efficiently and cost-effectively.

The conductive posts and conductive patterns in the multilayer circuit structures are preferably formed by additive processes. Additive processes have advantages over subtractive processes. For example, subtractive processes use etchants to remove metal from continuous metal layers to form conductive patterns. The uniformity of the lines in the etched patterns can be difficult to control, because etchants can undercut the lines. Consequently, it can be difficult to form fine line patterns using subtractive processes. In an additive process, however, the conductive pattern resolution is limited only by the resolution of the photoresist used to form the conductive patterns. Consequently, fine line and high density circuit patterns can be produced using additive processes. For instance, the circuit lines can have widths of 25 microns or less, and can be at a pitch of about 50 microns or less. In addition, in subtractive processes, metal layers are etched and then rinsed. The etching and rinsing processes consume large amounts of wet chemicals and water and can generate large amounts of waste (e.g., wasted metal). However, because of the reduced number of etching steps used in a typical additive process, the waste generated from a typical additive process is less than a typical subtractive process.

Figure 38:
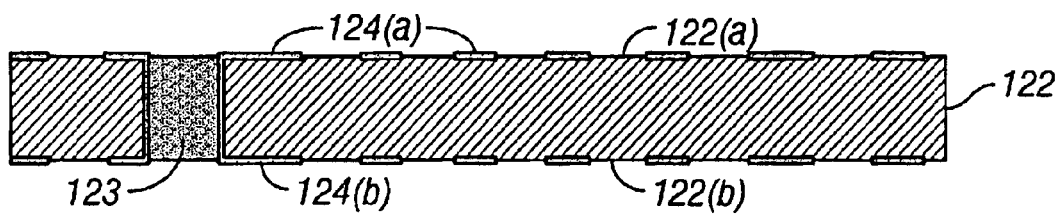
FIGS. 38 to 51 show cross sections of multilayer circuit structure precursors used to form a multilayer circuit structure with stacked conductive posts.

Embodiments of the invention can be described with reference to the Figures. FIG. 38 shows a circuitized core structure 122 upon which a plurality of conductive posts are formed. The core structure 122 includes a first side $122(a)$ and a second side $122(b)$, and can be flexible or rigid. The first and second sides $122(a)$, $122(b)$ can have, respectively, a first plurality of conductive regions $124(a)$ and a second plurality of conductive regions $124(b)$. The first and second conductive regions $124(a)$, $124(b)$ can include, e.g., lines, pads, or the ends of via structures. Moreover, the first and second conductive regions $124(a)$, $124(b)$ can be made of any suitable conductive material including copper, and can have any suitable thickness including a thickness of less than about 50 microns, and preferably between about 18 to about 36 microns. In addition to having conductive regions $124(a)$, $124(b)$ on the outer surfaces of the core structure 122, the core structure 122 may also include two or more dielectric layers and one or more conductive layers (not shown) embedded within the core structure 122.

The core structure 122 can also include one or more via structures 123. The via structures can communicate the conductive regions $124(a)$, $124(b)$ on the first and second sides $122(a)$, $122(b)$ of the core structure 122. The via structures can be solid conductive posts, or can be plated through holes (PTH) which have been filled with a conductive or a non-conductive material. For example, the PTH can be filled with a polymeric material such as an epoxy-based polymer, with or without an embedded conductive material. In another example, the PTH can be filled with a conductive paste such as a silver filled conductive paste. Filling the PTH with a material displaces any air which might otherwise reside in the PTH. It is preferable to remove any air pockets which might reside in the resulting multilayer circuit structure, because trapped air may cause reliability problems in some instances.

In a typical PTH filling process, an aperture can be formed in a rigid insulating board. Metal can be electroplated onto the wall of the aperture to form a PTH. After forming the PTH, a conductive or non-conductive filler material can be deposited within the PTH by, e.g., stenciling. If the filler material is curable, the filler material can be cured within the PTH. Before or after curing, any excess filler material on the first and second sides of the core structure can be removed.

In preferred embodiments, after the core structure is formed, a first plurality of conductive posts are formed on both the first and second sides of the circuitized core structure. Each conductive post can have an end proximate to the core structure and an end distal to the core structure. The conductive posts are preferably solid and/or substantially homogeneous in composition (e.g., all metal). The posts may also include any suitable conductive material. Suitable conductive materials include metal or metal alloys including copper, silver, gold, nickel, palladium, and aluminum. The conductive material is preferably copper.

The conductive posts may include any suitable dimensions. For example, the conductive posts can have a height of at least about 10 microns, preferably between about 15 to about 75 microns, and more preferably between about 25 to about 50 microns. The conductive posts can have any suitable diameter including a diameter between about 10 to about 150 microns, preferably between about 25 to about 75 microns. In addition, each of the posts may have a generally round radial cross-section.

The conductive posts (e.g., the first plurality of conductive posts) can be formed using any suitable process. For example, plating processes such as electroless or electroplating processes can be used to form the conductive posts.

Figure 39:
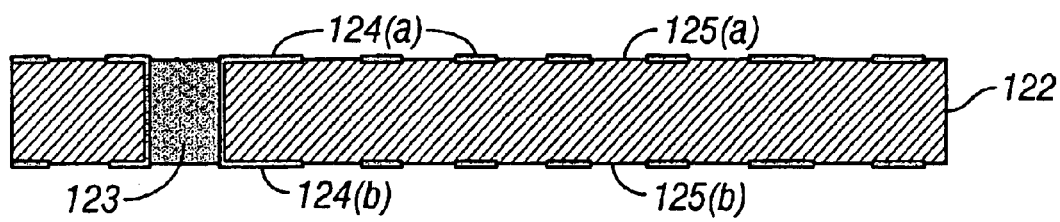

The conductive posts are preferably formed by electroplating. With reference to FIG. 39, seed layers 125(a), 125(b) can be deposited on the first and second sides 122(a), 122(b) of the core structure 122. The seed layers 125(a), 125(b) can be used to help initiate the plating of the subsequently formed conductive posts. Preferably, the seed layers 125(a), 125(b) are deposited simultaneously, but they can be deposited sequentially in some instances. Any suitable process including sputtering and electroless plating can be used to deposit the seed layers. Electroless plating is preferred as it is generally less expensive than sputtering. Regardless of how they are deposited, the seed layers 125(a), 125(b) may have a thickness of about 3 microns or less. Preferably, the thickness of each seed layer is between about 0.1 to about 1.0 micron, and is more preferably between about 0.3 to about 0.6 micron.

Prior to depositing the seed layers, the first and second sides of the core structure may be conditioned. For example, to increase the adhesion of seed layers to the sides of the core structure, the surfaces of the core structure can be roughened. Roughening can be performed using any suitable process including an etch process such as a permanganate etch process. By roughening the surfaces of the core structure prior to depositing the seed layers, the seed layers are more likely to adhere to the surfaces of the core structure.

After depositing the seed layers, photoresist layers can be deposited on the seed layers. The photoresist layers can be in the form of a film or a liquid prior to being deposited on the first and second sides of the core structure. An example of a suitable dry film photoresist is Riston□ 9000, commercially available from E.I. du Pont de Nemours, Inc. An example of a suitable liquid photoresist is AZ4620 liquid photoresist commercially available from Clariant, Inc. The photoresist layers may be positive or negative, and can be deposited on the first and second sides of the core structure simultaneously or sequentially.

The photoresist layers may be deposited by any suitable process including roller coating, spin coating, curtain coating, screen printing, slot coating, spray coating, and doctor blade coating. These processes are suitable for depositing liquid photoresist layers. Preformed photoresist layers may be deposited by laminating. Preferably, the photoresist layers are deposited by laminating. For example, in some embodiments, a double-sided hot roll laminator may be used to laminate preformed layers of photoresist on both sides of the core structure simultaneously.

After depositing the photoresist layers, photoresist patterns can be formed using conventional photolithographic techniques. For example, the deposited photoresist layers can be irradiated with a pattern of radiation. The irradiated photoresist layers can then be developed to form patterned photoresist layers. For example, with reference to FIG. 40, after the photoresist layers on both sides of the core structure 122 are developed, the developed photoresist layers 131(a), 131(b) can have a plurality of apertures 132(a), 132(b) disposed over one or more conductive regions 124(a), 124(b) on opposite sides of the core structure 122. The patterned photoresist layers can be used as masks to selectively deposit conductive material in predetermined areas. Deposition processes such as electroplating or electroless plating can be used to deposit the conductive material on regions not covered by the patterned photoresist layers.

Figure 40:
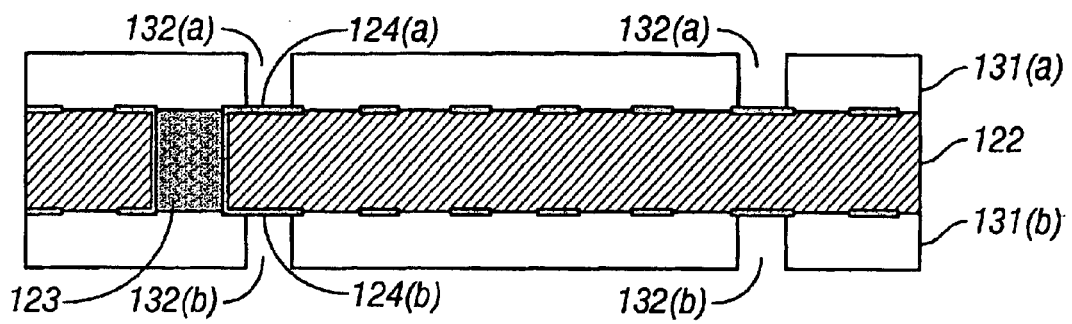
Figure 41:
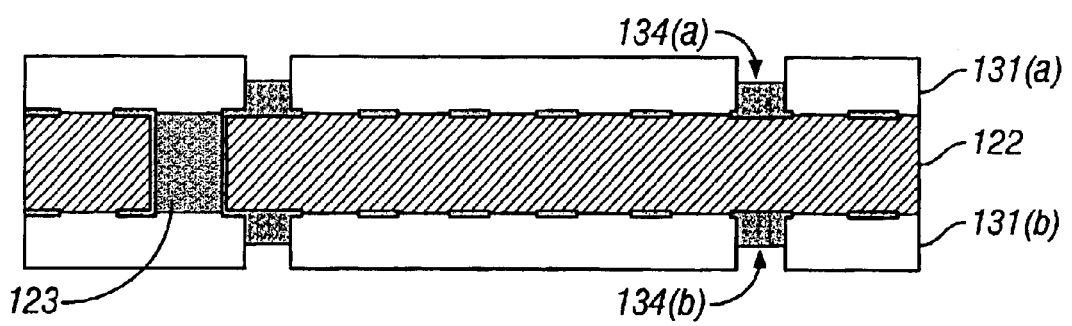

With reference to FIGS. 40 and 41, a first plurality of conductive posts 134(a), 134(b) are formed within the apertures 132(a), 132(b) of the photoresist layers 131(a), 131(b), and on the conductive regions 124(a), 124(b) exposed through the photoresist layers 131(a), 131(b). In this example, the first plurality of conductive posts includes conductive posts 134(a) on the first side of the core structure 122 and conductive posts 134(b) on the second side of the core structure 122. The first plurality of conductive posts 134(a), 134(b) are preferably formed on both sides of the core structure simultaneously. For example, the structure shown in FIG. 40 can be placed in an electroplating bath. In the electroplating bath, conductive material can plate from the conductive regions 124(a), 124(b) to the open ends of the apertures 132(a), 132(b) to form a first plurality of conductive posts 134(a), 134(b).

Although the use of seed layers are described in detail with respect to the illustrated embodiments, seed layers need not be used in other embodiments. For example, the conductive regions 124(a), 124(b) exposed through the photoresist layers 131(a), 131(b) may be suitable to initiate the direct plating of posts within the apertures 132(a), 132(b) of the photoresist layers 131(a), 131(b), without the need to deposit seed layers.

Figure 42:
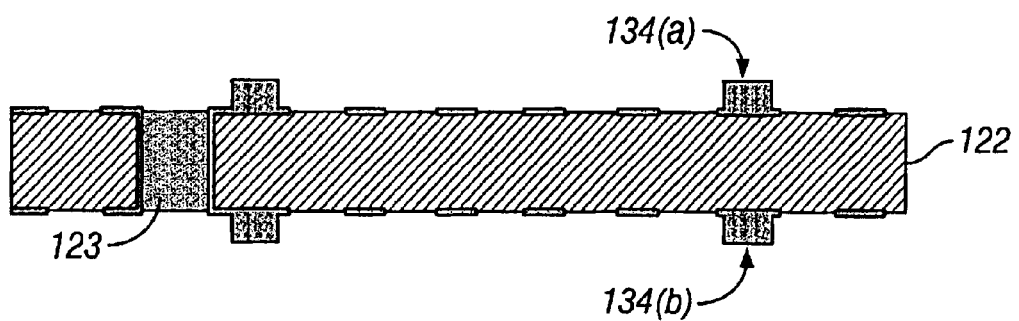

After the first plurality of conductive posts 134(a), 134(b) are formed, the photoresist layers 131(a), 131(b) which were used to form the conductive posts 134(a), 134(b) can be removed (e.g., stripped) from the core structure 122. As shown in FIG. 42, after the photoresist layers 131(a), 131(b) are removed, the first plurality of conductive posts 134(a), 134(b) are disposed on the core structure 122 and protrude from the surfaces of the core structure 122.

After the photoresist layers 131(a), 131(b) are removed, the seed layers 125(a), 125(b), if present, can also be removed. Preferably, the seed layers are etched in a flash etching process. In a typical flash etching process, the seed layers can be etched for a short period of time. After flash etching, the seed layers are completely removed from the dielectric layer surfaces, and an insubstantial portion of the formed conductive posts 134(a), 134(b) may also be removed.

After the first plurality of conductive posts are formed on the core structure, dielectric layers may be deposited on the first and second sides of the core structure. The dielectric layers may include any suitable material including any suitable polymeric material. Exemplary dielectric layer materials include polyimide, epoxy-functional materials, and BT resins. Moreover, the dielectric layers may optionally include a filler. Preferable fillers can include particles such as silica or alumina particles, but may include chopped, woven, or non-woven fibers. Preferably, the dielectric layers are in the form of a preformed layer. Examples of preformed dielectric layers include ABF-SH9 film commercially available from Ajinomoto, Inc., and BT346 film commercially available from Mitsubishi Gas and Chemical, Inc. In addition, the dielectric layers are preferably non-photoimageable. Non-photoimageable dielectric materials typically have a higher glass transition temperature (Tg) and a lower moisture absorption rate than photoimageable dielectric layers. Consequently, multilayer circuit structures having non-photoimageable dielectric layers are generally more reliable than photoimageable dielectric layers.

The deposited dielectric layers may have any suitable thickness including a thickness of about 75 microns or less, preferably between about 25 to about 50 microns. The individual dielectric layers on the core structure may have the same or different thickness. Preferably, an individual dielectric layer can have a thickness which is less than or equal to the combined height of a post and pad upon which the post is disposed. For example, the thickness of a dielectric layer may be about 2 to about 8% less (e.g., 5% or less) than the combined height of a conductive post and a conductive pad upon which the conductive post is disposed.

The dielectric layers may be sequentially or simultaneously deposited onto opposite sides of the core structure. For example, a first dielectric layer can be deposited on a first side of a core structure by depositing a liquid dielectric material on the first side. The deposited liquid can then be softbaked to solidify the deposited layer, and can then be optionally cured. After the first dielectric layer is deposited, a second dielectric layer can be deposited on the second side of the core structure in the same or different manner as the first dielectric layer.

The dielectric layers may be deposited using any suitable process including spin coating, screen printing, slot coating, doctor blade coating, curtain coating, etc. These processes can be used to deposit liquid dielectric layers. Laminating can be used to deposit preformed dielectric layers. The dielectric layers may even be deposited by a gas-phase deposition process such as a chemical vapor deposition (CVD).

Preferably, the first and second dielectric layers are respectively laminated to the first and second sides of the core structure. In these embodiments, the dielectric layers may be preformed prior to being deposited on the core structure. By depositing a preformed dielectric layer onto the core structure, the thickness of the dielectric layer is substantially uniform when present on the core structure. In addition, by laminating preformed dielectric layers onto a core structure, dielectric layers on opposite sides of the core structure can be deposited simultaneously, thus providing for more efficient processing.

Figure 43:
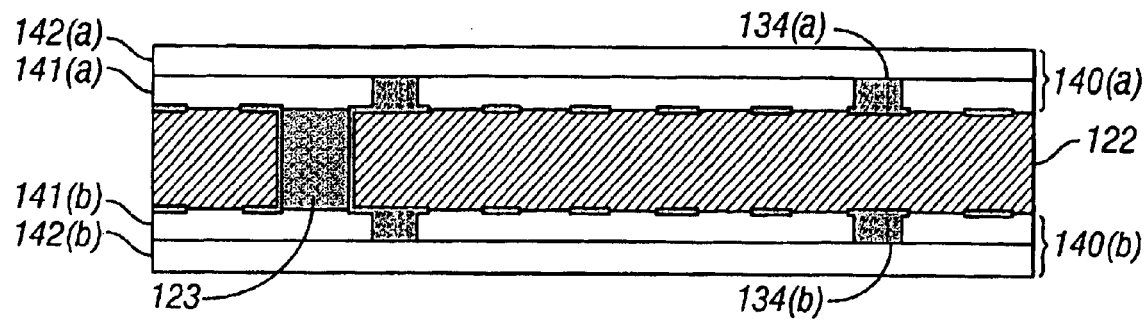

Preferably, a preformed dielectric layer is disposed on a carrier layer prior to being laminated to the core structure. The carrier layer may include any suitable polymeric material including polyethylene terephthalate. The preformed dielectric layer and the carrier layer may form a composite. Suitable composites are commercially available from Ajinomoto, Inc. (e.g., ABF-SH9). With reference to FIG. 43, composites 140(a), 140(b) including a carrier layer 142(a), 142(b) and a dielectric layer 141(a), 141(b) are laminated to the first and second sides of the core structure 122. The composites 140(a), 140(b) are laminated to the core structure 122 so that the carrier layers 142(a), 142(b) are disposed on the outer surfaces of the dielectric layers 141(a), 141(b). The composites 140(a), 140(b) are preferably flexible and can be laminated to the core structure 122 simultaneously or sequentially.

The composites can be laminated to the core structure using any suitable apparatus. Heat and pressure can be applied to the dielectric layers to soften them so that they can conform to the surfaces to which they are laminated. The heating temperature and/or pressure can chosen in accordance with the particular material used for the dielectric layer. For example, a hot roll laminator can be used to laminate composites of this type onto opposing sides of the core structure simultaneously or sequentially. In some embodiments, the rolls of the hot roll laminator can be between about 60° C. to about 120° C. (preferably 80° C. to about 90° C.), and the rollers can run at a speed of about 1 to about 2 meters per minute. A vacuum laminator can also be used to laminate the dielectric layers or composites to the core structure. For example, using heat, the vacuum laminator can operate near vacuum (e.g., less than 1 atm) for a few minutes (e.g., 5 minutes or more). Alternatively, composites can be laid on opposite sides of a core structure, placed in a lamination press (e.g., a hydraulic press), and then laminated together. The lamination press can operate at a temperature of about 80° C. to about 90° C., and at a pressure of about 1 to about 3 kg/cm2 for a few minutes, (e.g., about 5 minutes or more). Regardless of the specific lamination apparatus used, after lamination, the dielectric layers may be disposed on opposite sides of the core structure and can be sandwiched between carrier layers.

After depositing the dielectric layers 141(a), 141(b), the dielectric layers 141(a) may be optionally cured. The dielectric layers can be cured in any suitable manner. For example, an electron-beam, heat, and/or U-V radiation can be used to cure the dielectric layers. The dielectric layers are cured in a lamination press, or preferably an oven, using heat.

Release layers may be optionally disposed on the uncured dielectric layers prior to and/or during curing (e.g., in a lamination press). The release layers preferably include a heat resistant material. Exemplary release layer materials include Teddler™ paper (commercially available from du Pont), fluoropolymeric materials such as polytetrafluoroethylene (Teflon™), or metal (e.g., aluminum, copper). If the release layer is a copper foil, a shiny side of the foil is preferably in contact with the dielectric layer. In these embodiments, the previously described carrier layer (if used) may be optionally replaced with a release layer which has a higher melting temperature than the carrier layer. For example, the carrier layer can have a melting temperature less than 150° C. while the release layer can have a melting temperature greater than about 150° C.

Figure 44:
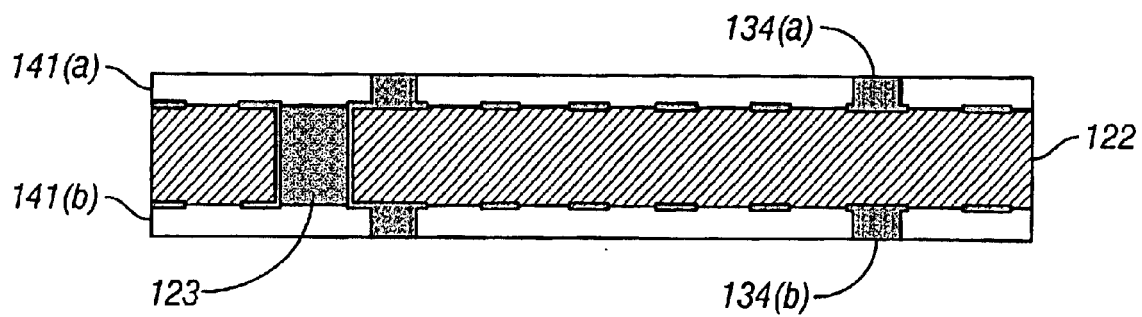
Figure 45:
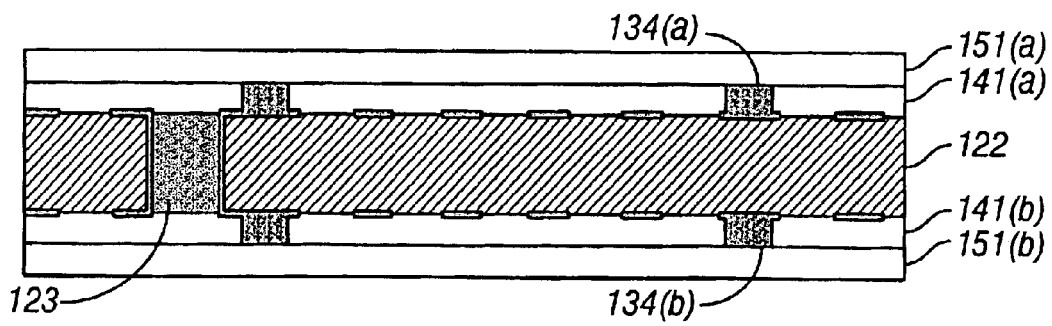

With reference to FIGS. 43 to 45, carrier layers 142(a), 142(b) can be separated (e.g., peeled) from the first and second dielectric layers 141(a), 141(b) after they are laminated to the core structure 122. Then, release layers 151(a), 151(b) can be deposited on the uncured first and second dielectric layers 141(a), 141(b). Preferably, the release layers 151(a), 151(b) are laminated to the first and second dielectric layers 141(a), 141(b). Heat, and optionally pressure, are applied to the structure to cure the dielectric layers 141(a), 141(b). For example, the first and second dielectric layers 141(a), 141(b) can be heated to a temperature of about 170° C. or more and can be subjected to a pressure of about 3.5 to about 20 kg/cm2 for about 60 minutes or more. The heat and pressure may be applied with a lamination press. After curing, the release layers 151(a), 151(b) can then be separated (e.g., by peeling) from the cured dielectric layers 141(a), 141(b).

In preferred embodiments, (with reference to FIGS. 43 and 44) an uncured dielectric layer on the core structure may be cured without the use of a release layer. For example, after laminating a carrier layer/dielectric layer composite to a core structure, the carrier layer can be removed from the dielectric layer. Then, the dielectric layer on the core structure can be cured.

In other embodiments, the dielectric layers can be partially cured and then conditioned (e.g., roughened) prior to complete curing. For instance, a precursor structure including a core structure and dielectric layers may be placed in an oven and baked for about 150° C. or more for about 30 minutes or less to partially cure the dielectric layers. Then, the outer surfaces of the dielectric layers may be roughened. For example, an etch process such as a permanganate etch process can be used to roughen the surfaces of a dielectric layer. After roughening, circuit patterns can be formed on the dielectric layer. The circuit patterns can include conductive pads disposed on the distal ends of the first plurality of conductive posts. The dielectric layers may then be baked again to fully cure them. For example, to fully cure the dielectric layers, the dielectric layers can be additionally heated at about 170° C. or more for about 60 to about 90 minutes, or more. Then, a second plurality of conductive posts can be formed on the conductive pads. Advantageously, by roughening the outer surfaces of the dielectric layers, any subsequently deposited seed layers or conductive layers can tightly adhere to the surfaces of the dielectric layers.

After the dielectric layers 141(a), 141(b) are deposited on the core structure 122, dielectric layer material present on the distal ends of the first plurality of conductive posts 134(a), 134(b) can be removed to clean the post ends. In some embodiments, residual dielectric layer material can be present on the distal ends of the conductive posts after one or more dielectric layers are deposited on the core structure. For example, after laminating and curing, a dielectric layer on the conductive posts on the core structure, residual dielectric layer material can remain on the post ends. The residual dielectric material is typically 10 microns or less, and is often is about 2 to about 5 microns thick. After the post ends are cleaned, additional conductive posts can be subsequently formed on the first plurality of conductive pads and posts 134(a), 134(b). The formed conductive posts can be stacked and are electrically coupled together to form a generally vertical electrical pathway through one or more dielectric layers.

Any suitable process can be used to remove dielectric material from the distal ends of the conductive posts. Exemplary removal processes include etching processes such as a permanganate etch process, plasma etch process, or an abrading process such as mechanical polishing. In preferred embodiments, mechanical polishing can be used to remove the dielectric layer material. Mechanical polishing can be performed by using a polishing apparatus such as an oscillation deburrer. Oscillation deburrers are commercially available from Ishii Hyoki. The polishing apparatus can include buffing elements such as SiC and $Al_2O_3$ buffing wheels. In a typical operation, the revolution speed of the wheels can be about 2000 revolutions per minute (rpm) or more, and the oscillation cycle of the wheels is about 470 (cycles per minute) or more, and the oscillation stroke of the wheels is about 5 mm or more. The wheel pressure can be controlled automatically by preset pressure at a range of 0.25 to about 20 kg/cm². In other embodiments, the dielectric material on the distal ends of the conductive posts may be ablated. For example, a laser can be used to ablate the dielectric layer material from the ends of the conductive posts.

Figure 46:
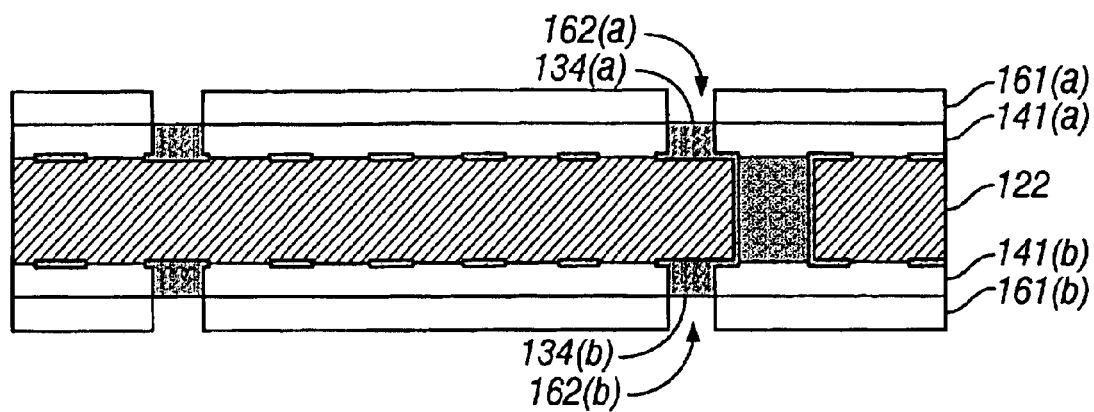
Figure 47:
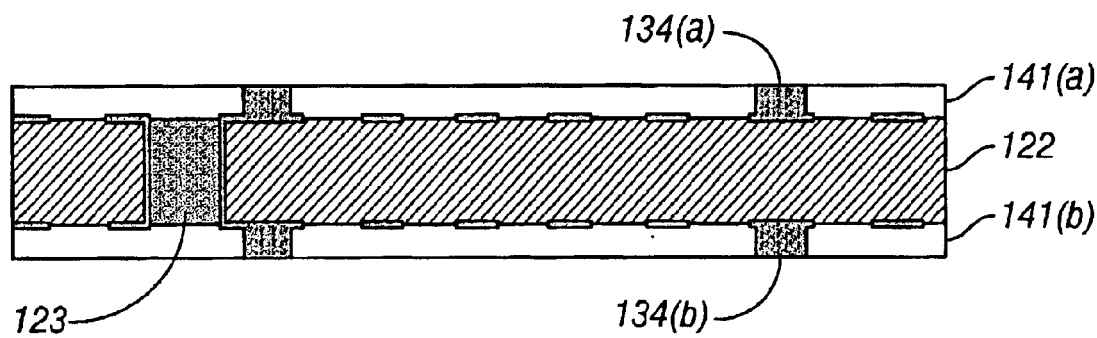
Figure 48:
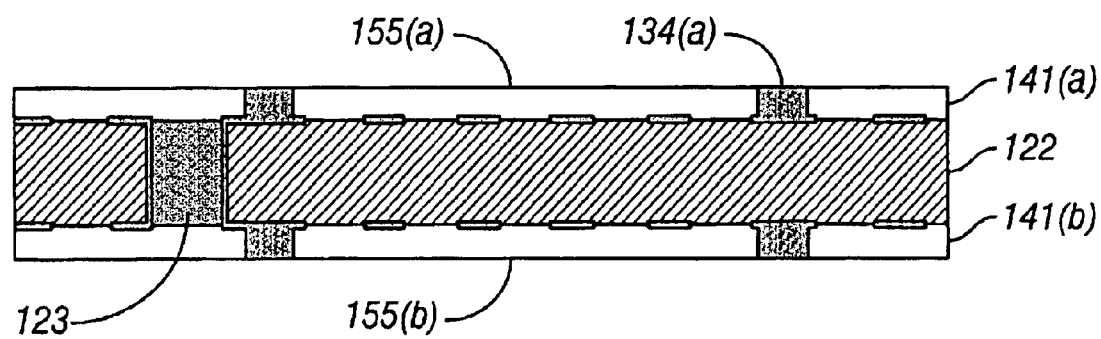

Optionally, protective layers may be used during the dielectric material removal process to protect the dielectric layer regions not disposed on the conductive posts. With reference to FIG. 46, protective layers 161(a), 161(b) can be disposed on the dielectric layers 141(a), 141(b). The apertures 162(a), 162(b) of the protective layers 161(a), 161(b) can be disposed over the distal ends of the conductive posts 134(a), 134(b). Dielectric layer material on the distal ends of the conductive posts are exposed through the protective layer apertures. By using a protective layer during the dielectric material removal process, the deposited dielectric layers are protected in the regions not disposed on the ends of the posts. Consequently, in these embodiments, unwanted dielectric layer material can be selectively removed. For example, a wide area laser can scan the outer surface of a protective layer disposed on a dielectric layer. The laser can ablate dielectric layer material exposed through apertures in the protective layer. Regardless of the particular removal process used, after removing the dielectric material from the ends of the conductive posts, the protective layers can be removed from the dielectric layers. For instance, the protective layers may be removed by etching or peeling.

The protective layers may deposited onto or formed on the previously deposited dielectric layers in any suitable manner. For example, in one embodiment, a layer of photoresist can be deposited, irradiated, and developed on a deposited dielectric layer to form a protective layer. In another embodiment, a protective layer with apertures is preformed, and is then laminated to a dielectric layer so that the distal ends of the posts (and any dielectric layer material thereon) are accessible through the apertures. The apertured protective layer may be the same as, derived from, or different from the previously described release or carrier layers.

In another example, apertures in the protective layers 161(a), 161(b) can be formed when the dielectric layer material is removed from the distal ends of the conductive posts. For example, a continuous protective layer can be laminated to a dielectric layer on a core structure. The dielectric layer material on the distal ends of the conductive posts may be ablated along with portions of the protective layer disposed on the distal ends. In this case, additional cleaning of the distal ends of the posts may not be needed after ablation and the formed apertured protective layer can simply be removed from the dielectric layers. Any residual material from the ablation process can remain on the outer surface of the formed protective layers and can be removed along with the protective layers. For example, any ash generated by the ablation process can be removed along with the protective layers when the protective layers are peeled off of the dielectric layers.

Figure 49:
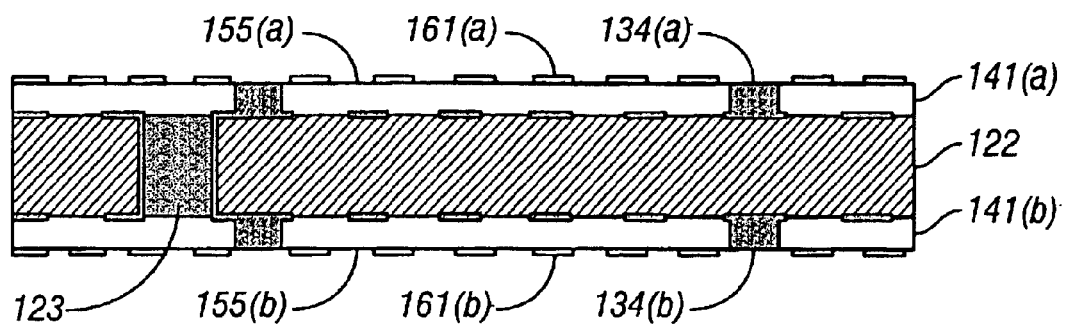

After the dielectric layers are deposited, conductive patterns can be formed on the dielectric layers. This can be done before the second plurality of conductive posts are formed. The conductive patterns are preferably formed by an additive process such as electroplating. For example, with reference to FIGS. 47 and 48, after any carrier layers, release layers, or protective layers are removed (if used), seed layers 155(a), 155(b) may be deposited on the outer surfaces of the first and second dielectric layers 131(a), 131(b) and over the distal ends of the first plurality of conductive posts 134(*b*), 134(*b*). Prior to depositing the seed layers, the dielectric layer surfaces can be conditioned (e.g., roughened) in the same or different manner as described above for the core structure 122. Then, photoresist layers may be deposited over the seed layers 155(*a*), 155(*b*), irradiated, and then developed to form patterned photoresist layers 161(*a*), 161(*b*). The photoresist layers 161(*a*), 161(*b*) may have the same or different characteristics as the previously described photoresist layers 131(*a*), 131(*b*). As shown in FIG. 49, the patterned photoresist layers 161(*a*), 161(*b*) can be disposed on the seed layers 155(*a*), 155(*b*).

Figure 50:
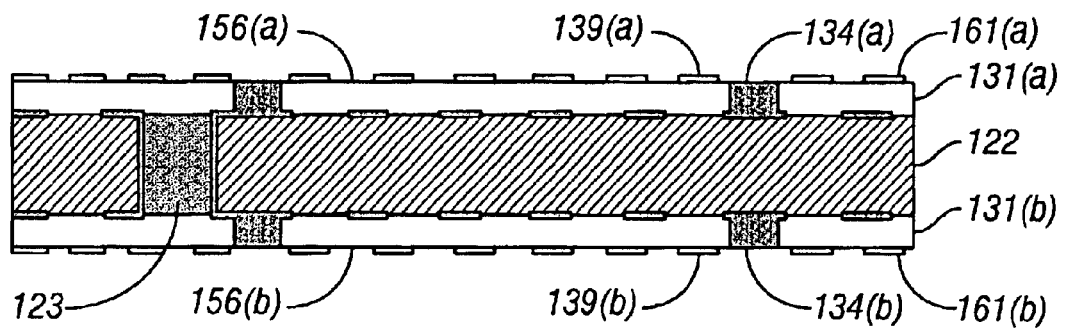

With reference to FIG. 50, conductive patterns 156(*a*), 156(*b*) are then formed (e.g., by electroplating) on the portions of the seed layers not covered by the developed photoresist layers 161(*a*), 161(*b*). The conductive patterns are preferably made of the same material as the conductive posts. The thickness of the formed conductive patterns 156(*a*), 156(*b*) can be between about 5 to about 35 microns, preferably between about 10 and about 20 microns. After the conductive patterns 156(*a*), 156(*b*) are formed, the photoresist layers 161(*a*), 161(*b*) can be removed (e.g., by stripping) from the surfaces of the dielectric layers 131(*a*), 131(*b*).

The conductive patterns may include a number of pads 139(*a*), 139(*b*) which are disposed on the distal ends of the first plurality of conductive posts. The pads generally have a larger surface area than the diameter of the conductive posts upon which they are disposed. Typically, a pad is disposed between respectively stacked conductive posts and is in direct contact with the stacked conductive posts.

Figure 51:
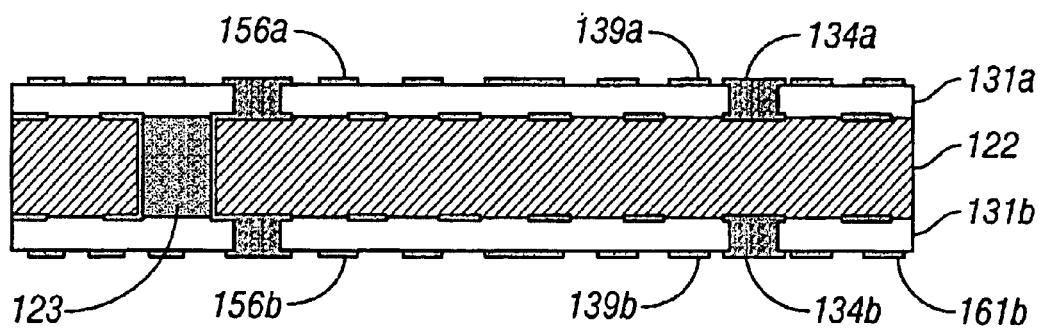
Figure 52:
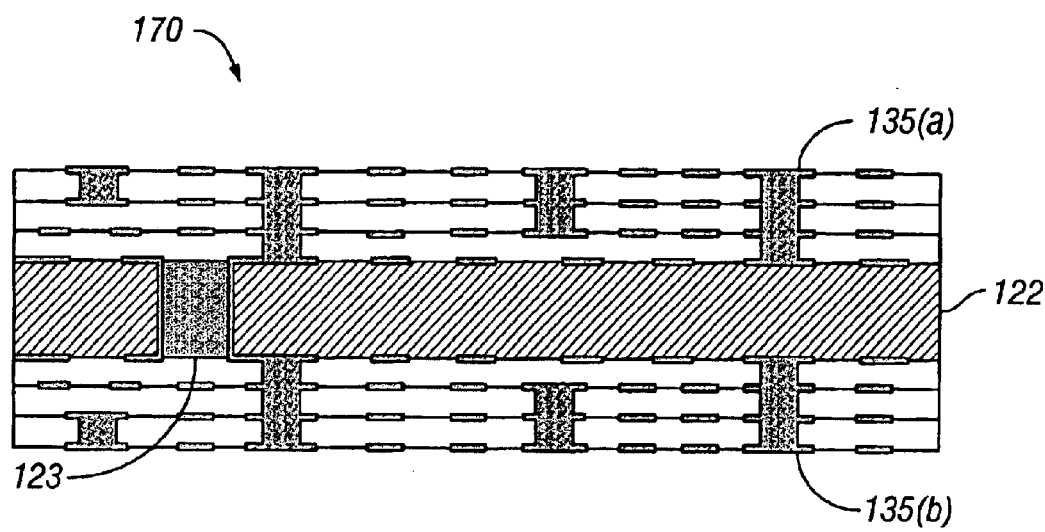
FIG. 52 shows a cross section of a multilayer circuit structure with stacked conductive posts.

Then, a second plurality and any subsequent plurality of conductive posts, dielectric layers, and conductive patterns can be formed on the structure shown in FIG. 51, or any subsequent multilayer circuit structure precursor, by repeating one or more of the previously described steps. For example, the process used to form the second plurality of conductive posts can be the same or different process used to form the first plurality of conductive posts. Preferably, the first, second, and any subsequent plurality of posts are formed by electroplating. Once the conductive patterns 156(*a*), 156(*b*) and conductive posts are formed, any seed layers 155(*a*), 155(*b*) can be etched (e.g., by flash etching).

Any number of conductive patterns, conductive posts, and dielectric layers can be included in the formed multilayer circuit structure. For example, the multilayer circuit structure 170 shown in FIG. 52 includes a circuitized core structure 122, and three dielectric layers and three conductive layers on each side of the core structure 122. The multilayer circuit structure 170 also includes generally vertical conductive pathways, each pathway including stacked conductive posts, with a pad between each adjacent pair of stacked posts. The generally vertical conductive pathways permit the size of the formed multilayer circuit structure to be reduced in comparison with a similar multilayer circuit structure with staggered via structures. Consequently, embodiments of the invention can be used to produce reliable, high density multilayer circuit structures efficiently and in a cost efficient manner.

After the multilayer circuit structure is formed, surface finishes or solder masks can be applied to the outer surfaces of the multilayer circuit structure. For example, a Ni/Au pad finish and/or a solder mask can be formed on the outer surfaces of a formed multilayer circuit structure. Accordingly, the multilayer circuit structures can be used in, for example, single chip modules, multichip modules and/or as mother or daughter boards in an electrical assembly.

Figure 53:
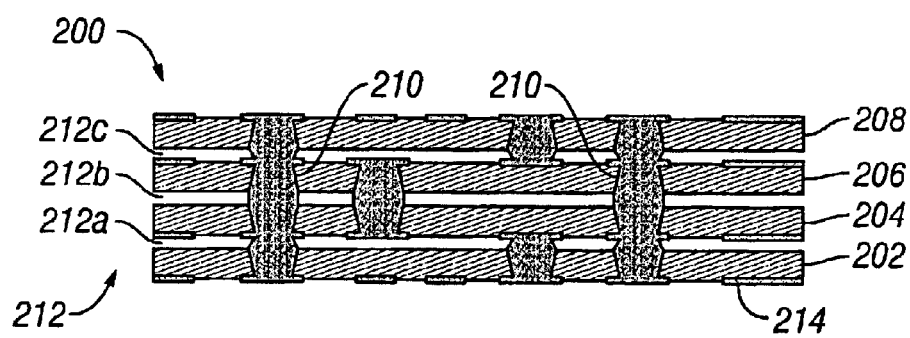
FIG. 53 shows a cross section of another embodiment of a multilayer circuit structure assembly.

Referring in detail now to FIGS. 53–65B, there is seen in FIG. 53 a multilayer laminated substrate, generally illustrated as 200. The multilayer laminated substrate 200 includes conventional laminated substrates 202, 204, 206 and 208 which are electrically coupled together by aligned metal-filled interconnected vias, each generally illustrated as 210. Any two contiguous laminated substrates are separated by a bonding sheet 212, such as bonding sheets 212*a*, 212*b* and 212*c*.

Figure 54:
Figure 55:
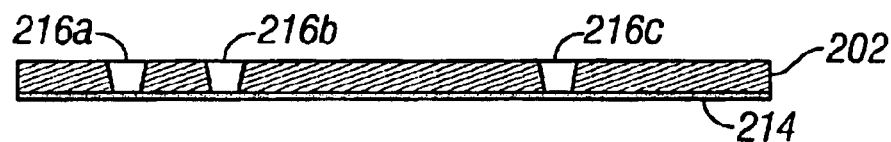
Figure 56:

Referring now to FIGS. 54–57, there is seen in FIG. 54 a conventional laminated substrate 202 (e.g., fiberglass reinforced laminate) having a copper layer 214 disposed on an underside thereof. Subsequently, blind vias 216*a*, 216*b* and 216*c* are laser drilled down to copper layer 214 by any conventional means, such as by $CO_2$, UV-Yag or eximer laser. The $CO_2$ laser is preferred since it is easy to drill through a fiber glass reinforced laminate and the drilling speed is much faster than others. Subsequently, and as shown in FIG. 56, the blind vias 216*a*, 216*b* and 216*c* are respectively filled with copper 218*a*, 218*b* and 218*c*, by any conventional manner. Due to plating non-uniformity (typically 10%), slightly over plating is necessary to make sure that every blind via 216*a*, 216*b* and 216*c* is filled up or above the top surface of laminated substrate 202. After plating, buff polishing of surface is applied to remove excess plating and flatten copper-filled blind vias by a deburr machine, such as Ishii Hyoki's oscillation deburrer. After the blind vias 216*a*, 216*b* and 216*c* have been copper-filled, and preferably subsequently buffed, a solder bump 220 is deposited on each of the copper-filled blind vias 216*a*, 216*b* and 216*c*.

Figure 57A:
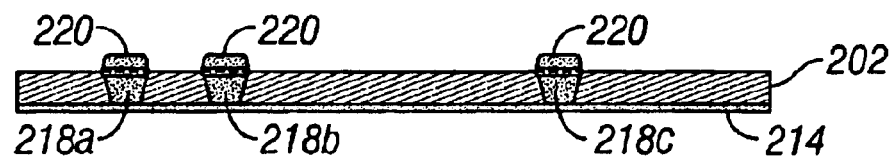
Figure 57B:
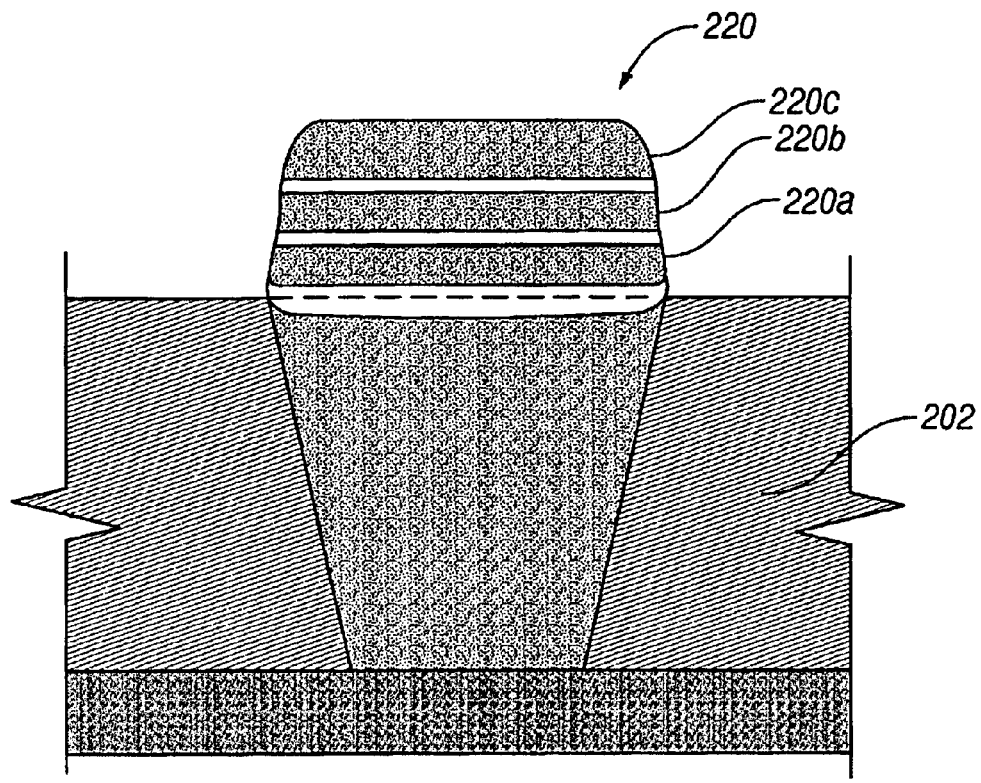
FIG. 57B is an enlarged sectional view of one embodiment of the solder bump.
Figure 57C:
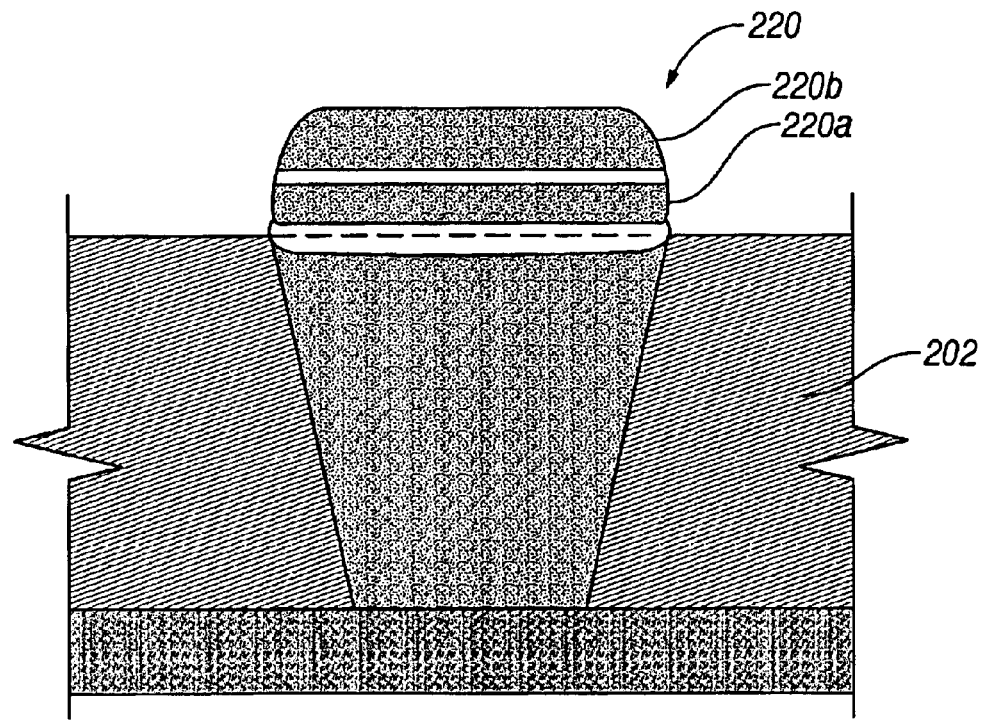
FIG. 57C is an enlarged sectional view of another embodiment of the solder bump.
Figure 58A:
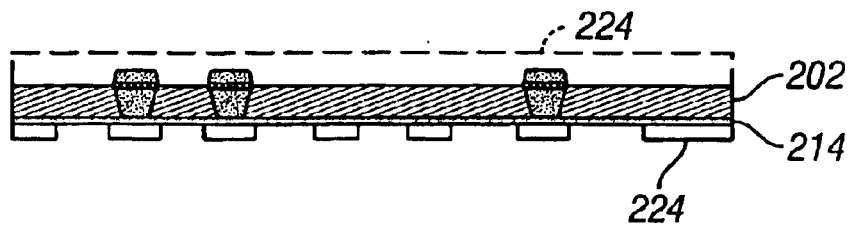
Figure 58B:
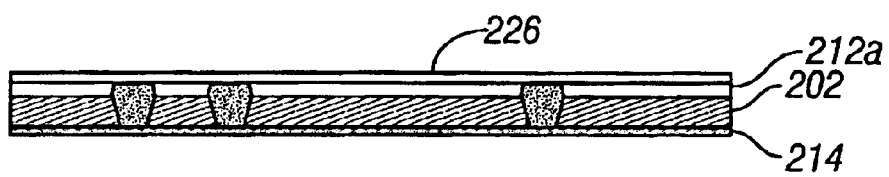
Figure 59A:
Figure 59B:
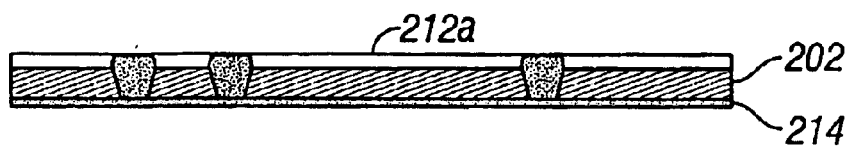
Figure 60A:
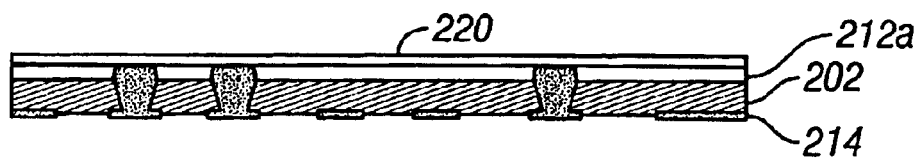
Figure 60B:
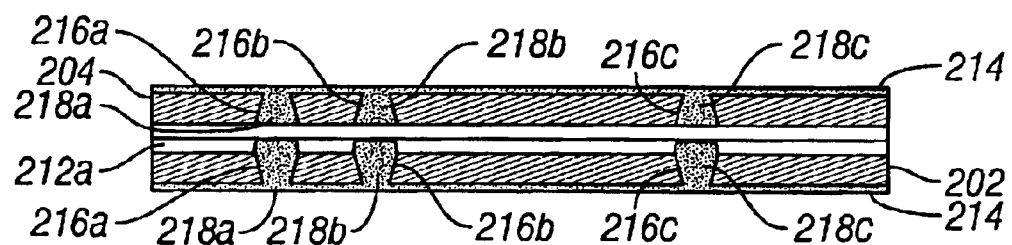

In one embodiment of the invention and as best shown in FIG. 57B, one or more solder bumps 220 may comprise three (3) separate superimposed solder layers 220*a*, 220*b* and 220*c*. In another embodiment of the invention and as best shown in FIG. 57C, one or more solder bumps 220 may comprise two (2) separate superimposed solder layers (e.g., solder layers 220*a* and 220*b*) on one substrate and a single solder layer (e.g., solder layer 220*c*) on a second substrate. Thus, two superimposed solder layers may be disposed on one substrate (e.g., substrate 220*a*), while a single layer may be disposed on another substrate (e.g., substrate 220*b*).

The material for the solder layer(s) 220 comprises a conductive composition which may include pure metals, metal alloys, metal alloy precursors, metallic compositions, metallic compounds, and combinations thereof. For example, the conductive composition can include one or more materials selected from the group consisting of In, Sn, Bi, Sb, Pb, Ni, Zn, Cu, Cd, Pt, Pd, Au and Ag.

Preferably, the conductive composition includes soft solder materials which can readily deform when pressed, thus providing for good areal contact between conducting surfaces. For instance, deforming the conductive compositions against conductive surface can increase the contact area with the support area. Suitable examples of solder compositions can include metals, or single or multi-phase alloys. The alloys may be binary, ternary, or other higher order compositions. Examples include alloys comprising In—Sn, Bi—Sn, In—Ag, Sn—Sb, Au—Sn, and Pb—Sn. More specific examples of solder material combinations include 52In/48Sn, 58Bi/42Sn, 97In/3Ag, In, 37Pb/63Sn, 96.5Sn/3.5Ag, 95Sn/5Sb, 80Au/20Sn, and 90Pb/10Sn (described in terms of weight percentages). More specifically and in a preferred embodiment of the invention, when the solder layer(s) 220 comprises three (3) superimposed layers (e.g., solder layers 220*a*, 220*b* and 220*c*), the conductive composition comprises the following elements of Table II (numbers representing weight percentages):

TABLE II

|  | Approach I | Approach II |
| --- | --- | --- |
| Solder Layer 220a | 2–5 um of eutectic solder: 37 Pb/63 Sn or 40 Pb/60 Sn | 2–5 um of Sn |
| Solder Layer 220b | 10–20 um of high lead solder: 90–97 Pb/3–10 Sn | 10–20 um of Ag |
| Solder Layer 220c | 2–5 um of eutectic solder: 37 Pb/63 Sn or 40 Pb/60 Sn | 2–5 um of Sn |

In the embodiment of the invention illustrated in FIG. 57C, solder layers 220a and 220b may respectively include the conductive composition set forth in Table II above for solder layers 220a and 220b. If a single solder layer, such as solder layer 220c, is to be employed on a separate first substrate (e.g., substrate 202) while another or second substrate (e.g., substrate 204) supports two (2) superimposed solder layers (such as solder layers 220a and 220b), the single solder layer (i.e., solder layer 220c) may comprise the conductive composition set forth in Table II above for solder layer 220c.

Referring now to FIGS. 58A–63A, photoresist 224 is disposed on at least one side, more preferably photoresist 224 is disposed on two opposing sides and is patterned over copper layer 214 which is subsequently etched. Either dry film or liquid photoresist may be used. Photoresist 224 is stripped, and then a dielectric polymer bonding film (e.g., bonding sheet 212a), and a release layer 226 coupled or attached thereto, is secured or tacked in any conventional manner to the exposed top side of the laminated substrate 202, as best shown in FIG. 60A. Tacking may be accomplished by lamination. During the lamination, the bonding film or sheet (such as Ajinomoto bonding film) is heated to its maximum flow rate temperature (e.g., 80–90° C.) without curing it so that the solder bumps 220 can easily pierce or pass through it. Alternatively, a liquid polymer may be substituted for the bonding film. The liquid polymer may be coated on by screen printing, curtain coating or spray coating. The release layer 226 is then removed or stripped from the bonding film (i.e., bonding sheet 212a in FIG. 61A).

Figure 61A:
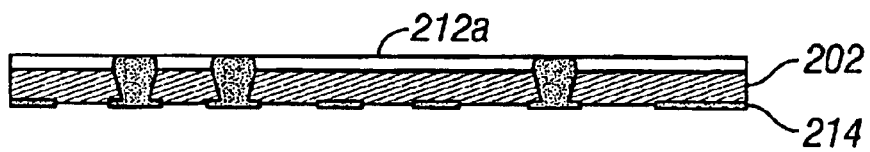
Figure 62A:
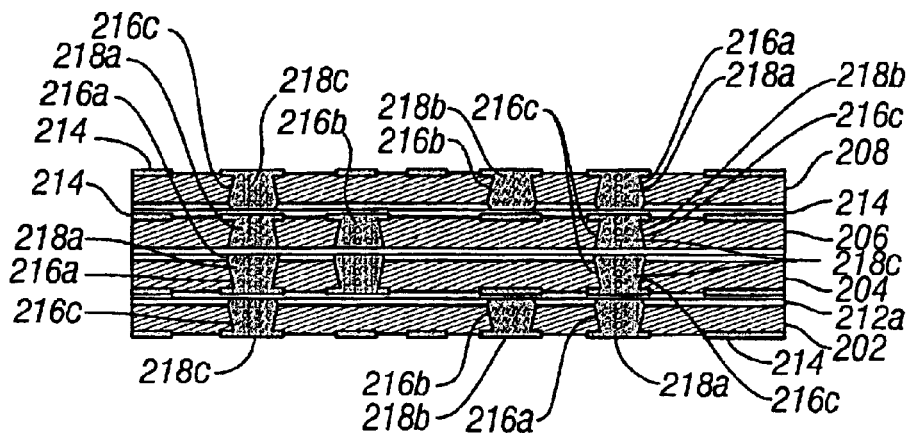
Figure 62B:
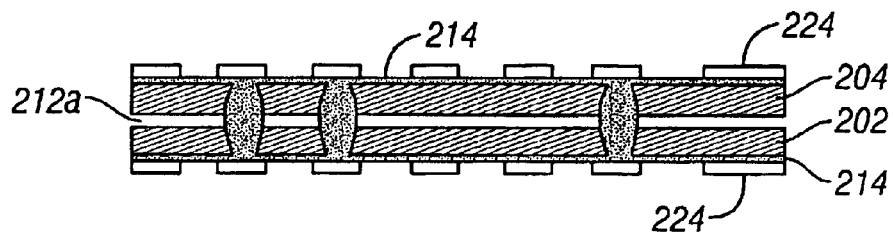
Figure 63A:
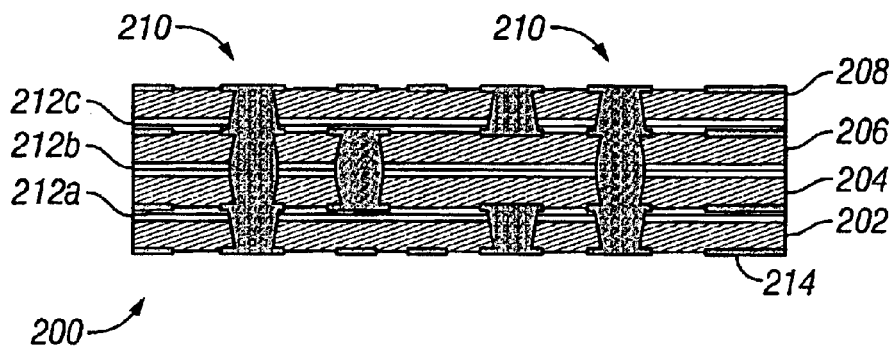
Figure 63B:
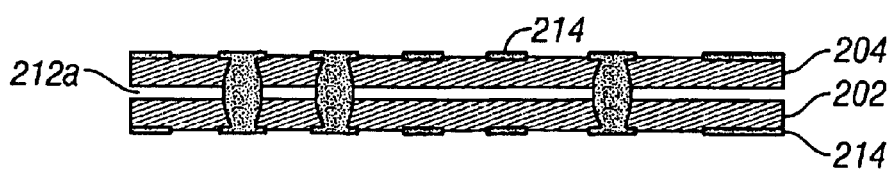
Figure 64B:
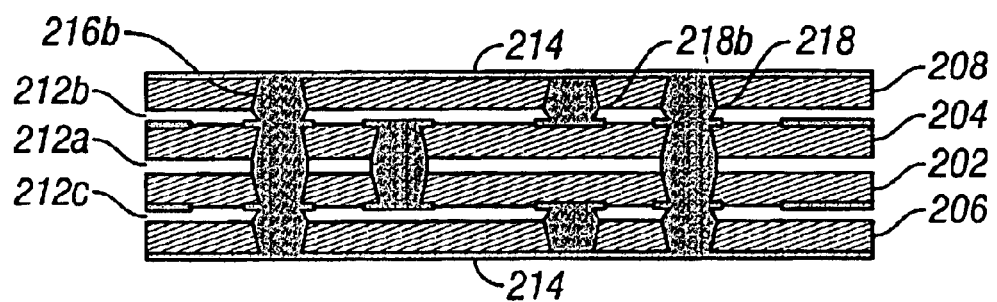
Figure 65B:
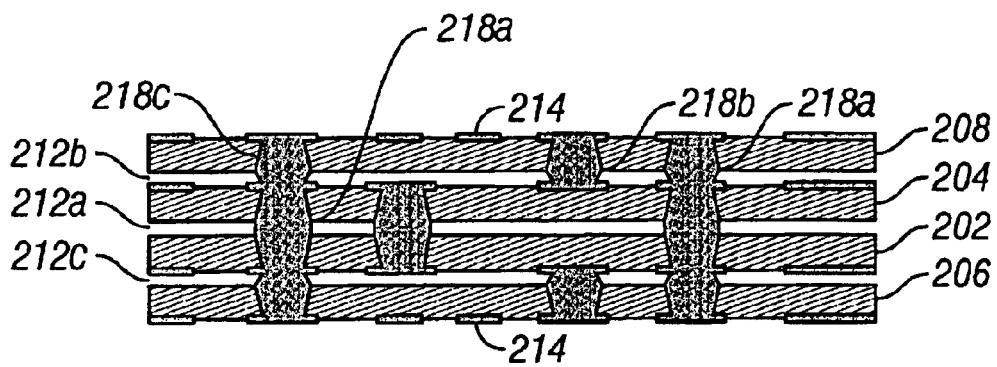

A plurality of the formed substrate assembly of FIG. 61A may be produced with laminated substrates 202, 204, 206 and 208, then aligned as shown in FIG. 62A, and subsequently laminated together by any conventional means to make intermetallic joints and the multilayer laminated substrate 200 (see FIGS. 53 and 63A). More specifically, a plurality of the formed substrate assembly of FIG. 61A may be interconnected by lamination to make the intermetallic joint and to cure bonding film, such as bonding film 212a. First, the substrate, such as substrate 202, will be heated slightly higher than the solder layers (i.e., solder layers 220a and 220c) melting temperature (e.g., 185–230° C. for the eutectic solder of Approach II in Table II above and 235–250° C. for the Sn of Approach II in Table II above). It is well known that the melting temperature of lead (e.g., 300° C. to 325° C.) is higher than the melting temperature of tin (e.g., about 260° C.), and the melting temperature of gold (e.g., about 900° C.) is higher than that of lead. Thus, preferably the melting temperature for solder layers 220a and 220c is lower than the melting temperature for solder layer 220b. The solder compositions(s) of the solder layers will melt and fuse together to make the intermetallic joint. At the same time, the solder layers 220a and 220c and solder layer 220b will comingle and/or diffuse into each other and raise the melting temperature of the whole intermetallic joint. Finally, the joint will be "frizzed" at much higher temperature than the melting temperature of solder layers 220a and 220c (i.e., a "frizze" temperature of about 260–300° C. for Approach I in Table II and >300° C., such as 310–500° C., Approach II in Table II) and higher than the melting temperature of solder layer 220b to further comingle and diffuse the solder layers into each other. Then, the temperature is reduced to the curing temperature (e.g., 95–140° C.) of the bonding film (e.g., bonding film 212a) to cure the bonding film, such as bonding film 212a. It should be readily apparent that the two opposed substrates 202 and 208 of the alignment of FIG. 62A are rotated 180 degrees to align copper 218c in via 216c of one substrate (e.g., substrate 208) with copper 218a in via 216a of a contiguous substrate (e.g. substrate 206).

Figure 61B:
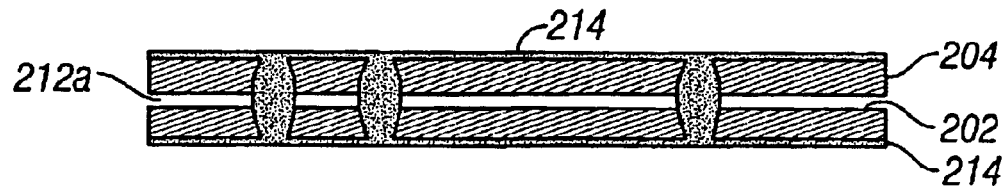

Referring now to FIGS. 58B–65B, there is seen a sequential process by which an initially pair of substrates (e.g., substrates 202 and 204 in FIGS. 60B and 61B) are laminated together as previously indicated to produce the substrate assembly of FIG. 61B. Subsequently, the exposed copper layers 214—214 are patterned with photoresist 224—224. Bonding sheets 212c and 212b are then disposed on the patterned copper layers 214—214 in accordance with the previously indicated procedure. Substrates 206 and 208 with associated copper fillings (i.e., copper fillings 218a, 218b, and 218c) and copper layers 214—214 are produced in accordance with the previously mentioned procedure, and subsequently coupled to the substrate assembly of FIG. 63B through lamination on the bonding sheets 212b and 212c, as previously indicated. The exposed copper layers 214—214 are then patterned with the assistance of photoresist 224—224. By performing the foregoing procedure the solder layers 220 will not be exposed to lithographic patterning process.

The embodiments of the invention of FIGS. 53—65B has many advantages over conventional plated through hole (PTH) vias. For example, embodiments of the present invention enable the production of much smaller (50–150 um vs. >200 um in diameter) vias so that the density is much higher. For L/D (laminated core+build-up deposited layer) package substrate application, the via of laminated core has to be filled before any deposited layer can be build up on top. Embodiments of the present invention has automatically filled vias so that no extra process steps are needed. For conventional plated through hole vias, the center hole of the plated vias have to be filled after via plating (forming). The typical filling material is a suitable liquid polymer (e.g., epoxy). Since the coefficient of thermal expansion (CTE) of typical polymer filler is much higher, it will generate reliability problem. For solving this problem, a copper capping layer is plated usually after via filling to "cap" the filler inside the via, but this way increases total thickness of copper before patterning so that the subtractive patterning resolution decreases. Embodiments of the present invention provide stack via structures to save the space. As previously mentioned embodiments of the present invention can make "frizzed" solder joints so that the solder joints can easily survive from further chip assembly processing, such as solder reflow to mount chips on a substrate.

Figure 66:
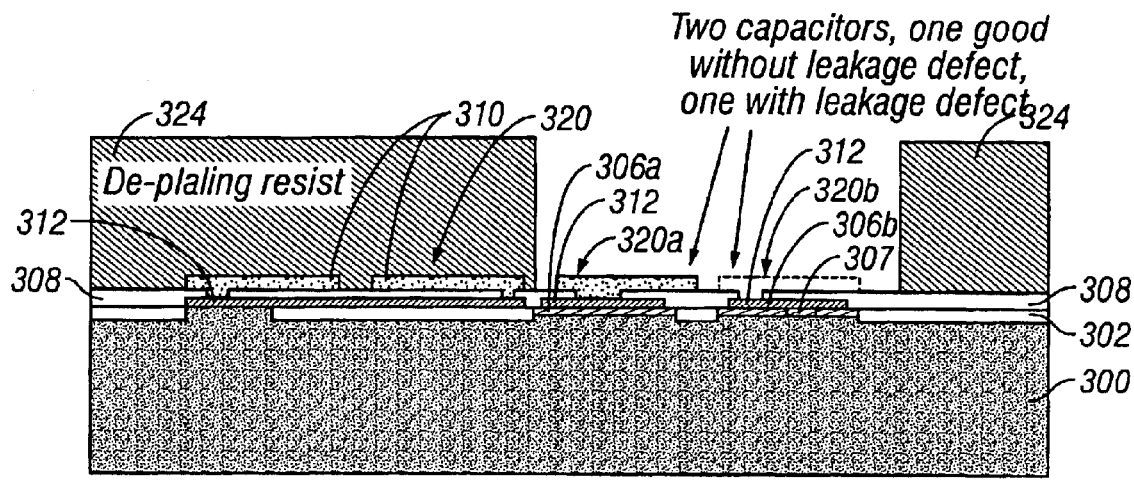
FIG. 66 is a side elevational view of a semiconductor substrate assembly supporting a good capacitor and a defective capacitor with a short circuit.

Referring now to FIGS. 66–87 for additional embodiments of the present invention. There is seen in FIG. 66 a broad illustration of a de-plating process to remove metal 310 pads (e.g., copper pads) connected to defective capacitors 320b with shorts (or high leakage) to a substrate 300. Broadly, mask design opens resist over the entire metal 310 capacitor pads, or only the trace leading to the pad. Breaking the capacitor into many small capacitors, allows the isolation (de-plating) of defects without large reductions in capacitance. There is more specifically illustrated in FIG. 66, substrate 300 supporting field oxide layers 302, a good capacitor 320a including gate oxide 306a without a short and a layer of polysilicon metal 312, a defective capacitor 320b including gate oxide 306b with a short 307 and a layer of polysilicon metal 312, and a passivation layer 308 providing the appropriate isolation. Resist 324 may be conveniently disposed as illustrated. Mask design opens resists 324 over all metal 310 capacitor pads.

Deplating of defective capacitor 320b may be accomplished by any suitable means, such as by a conventional plating fixture. Water is placed in a plating fixture, followed by adding a plating solution to the water. The plating bias is the reverse of that used to plate copper, i.e., a negative voltage is applied to the back of wafer and a positive voltage is applied to the solution. Plating solution can be copper sulfate, sulfuric acid, and additives. Contact to the backs of the wafer may be from the frontside, metal 310 pads to metal 312 to the silicon. Wet etch is performed with the assistance of resist 320. The deplating procedure is followed with Cu etch to remove residue, and then the adhesion layer is etched to remove any exposed adhesion layer. Resist 324 may be conveniently stripped.

Figure 67:
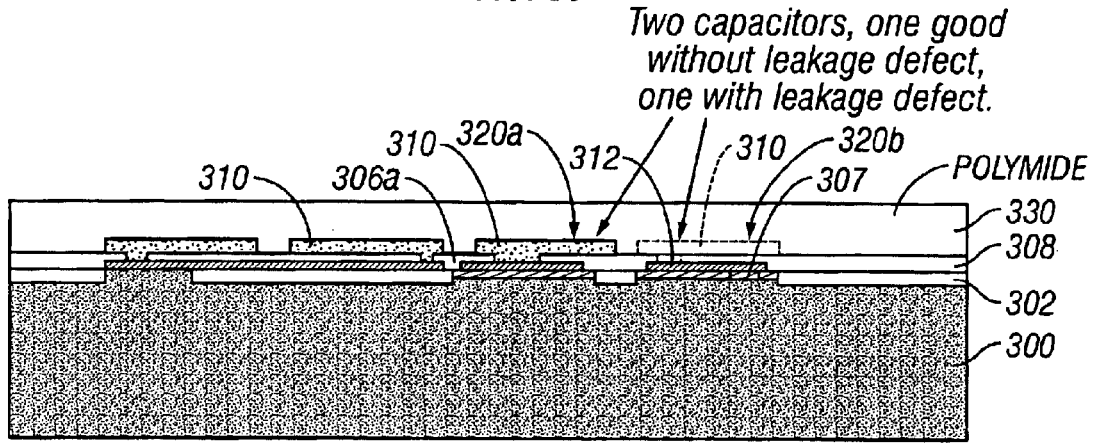
FIG. 67 is a side elevational view of the substrate assembly of FIG. 66 after depleting the defective capacitor and removing the photoresist, and after depositing a dielectric layer (e.g. a polyimide coat)

Referring now to FIG. 67 there is illustrated a substrate assembly produced by the following semiconductor manufacturing process: nitride deposition on substrate 300, field oxide 302 (MASK 1) deposition, followed by nitride etch, field oxidation (1 um), nitride stripe, and gate oxidation (10 nm). A contact mask (MASK 2) is then deposited, followed by oxide etch, polysilicon deposit 312 and metal deposit. MASK 3 is deposited for etching metal 312, followed by aluminum etch, polysicon etch, and passivation layer 308 deposition. Pad mask (MASK 4) is disposed conveniently, followed by passivation etch, TiCu deposition, metal 310 mask (MASK 5), patterning metal 310, de-plating MASK (MASK 6) placement, de-plating defective capacitors 320b, and polyimide coat 330 deposition.

Figure 68:
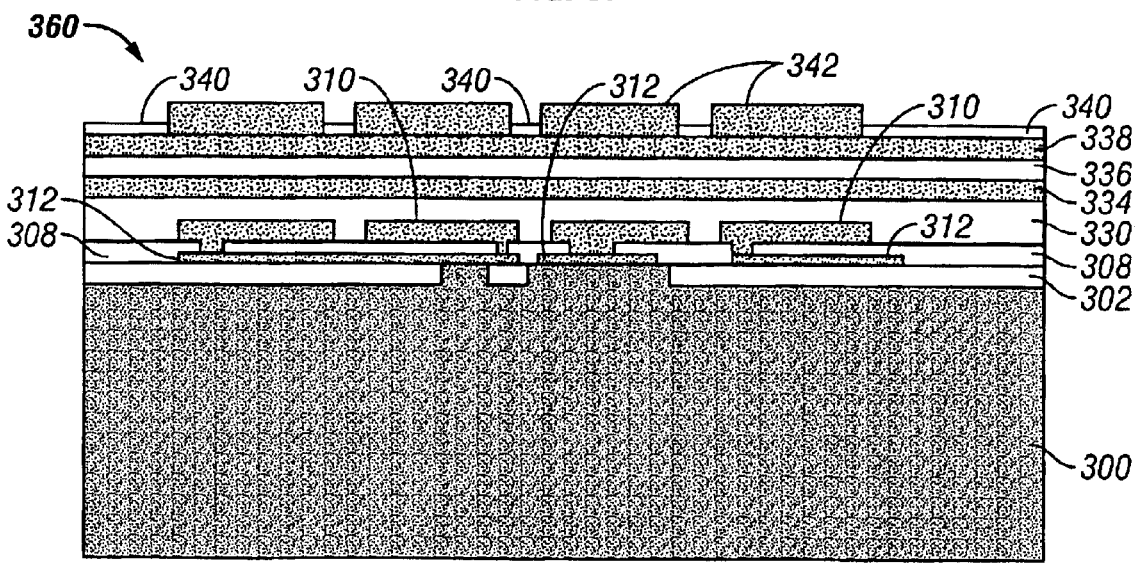
FIG. 68 is a side elevational view of a MCM substrate assembly.

Referring now to FIG. 68, there is seen a MCM assembly 360 formed by producing the assembly of FIG. 67, followed by the following procedures: depositing metal layer 334, then depositing dielectric layer 336, and subsequently depositing metal layer 338 on the dielectric layer 336 and forming metal pads 342 and dielectric layers 340. From the MCM assembly 360 of FIG. 68, through via formation is conducted by the following steps: backgrind wafer or substrate 300 to 200 u, backside silicon nitride passivation (0.2 u), deposit adhesive 350, mount temporary carrier 350, form through via (MASK 7) in substrate, plasma etch nitride, KOH etch through wafer (stop on field oxide 302), plasma etch oxide 302 down to polysilicon 312, vapor deposit parylene 370 (20 u ), laser via in parylene 370, and plasma clean via CrCu seed deposition. Subsequently, via pad is deposited in contact with polysilicon metal 312 (MASK 8) using laminated resist, followed by Cu plate 380 (10 u) formation, seed etch, and eless Ni/Au plating.

Figure 69:
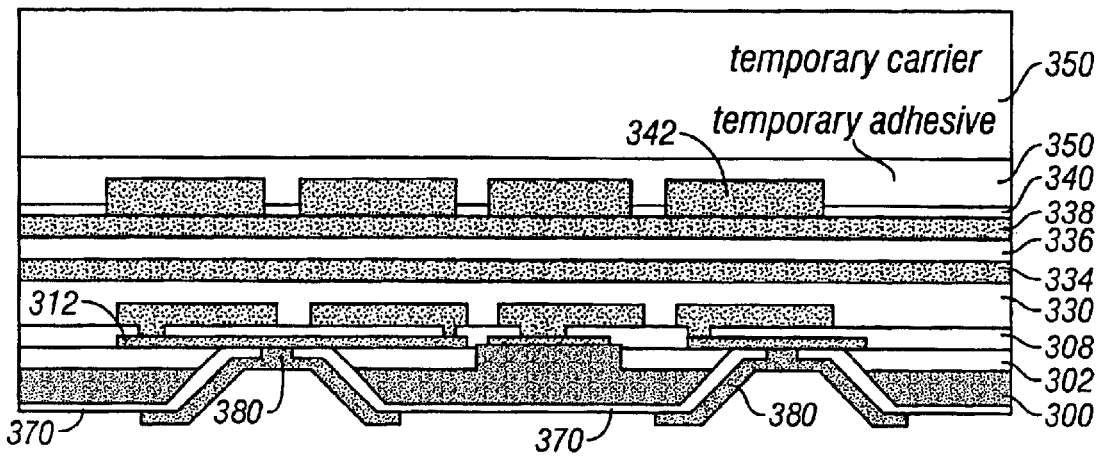
FIG. 69 is a side elevational view of the MCM substrate assembly of FIG. 68 after formation of a through via.
Figure 70:
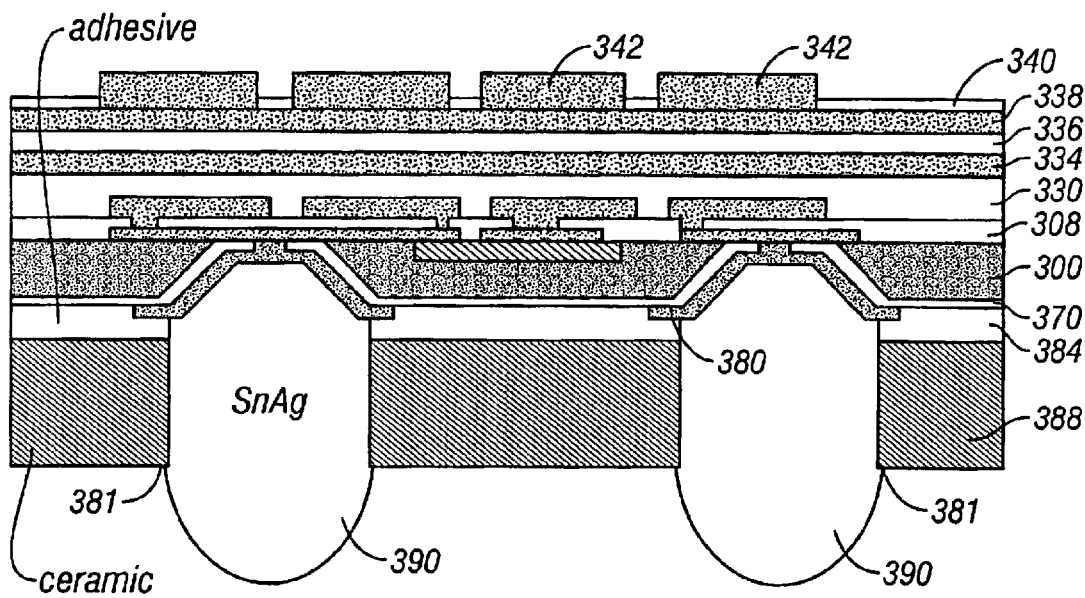
FIG. 70 is a side elevational view of the MCM substrate assembly of FIG. 69 after coupling a ceramic (e.g. Al N) substrate thereto and after depositing SnAg paste or solder balls into the via holes.
Figure 71:
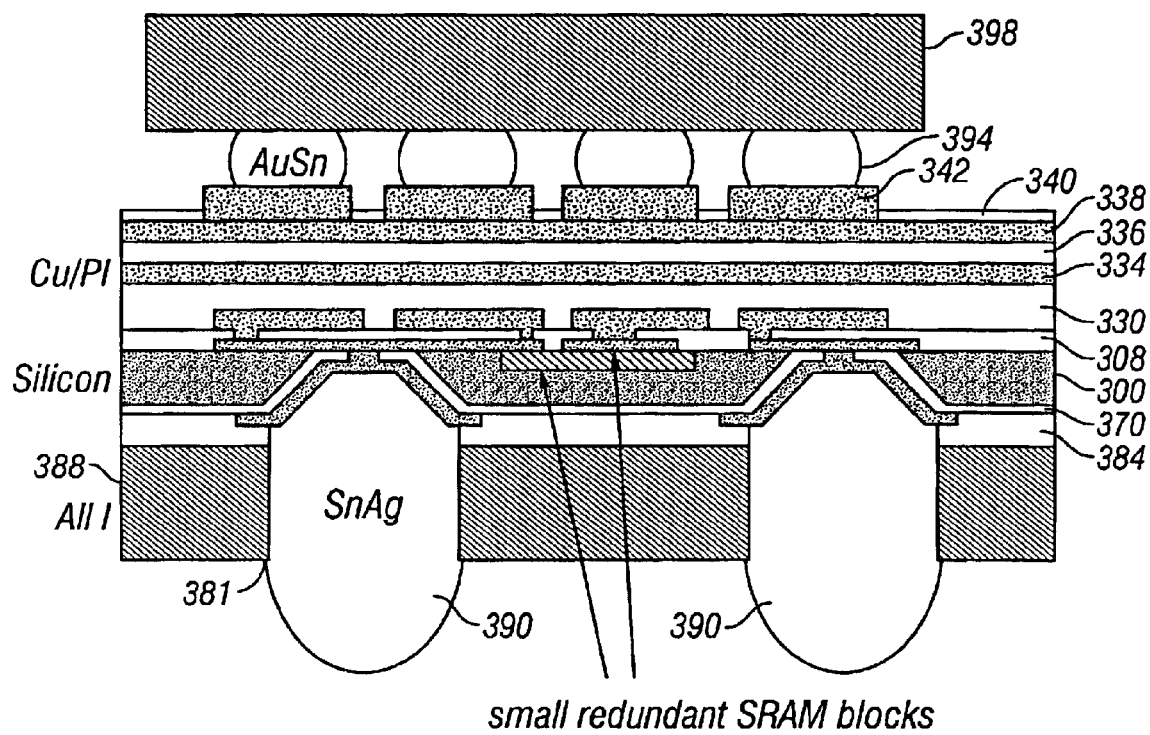
FIG. 71 is a side elevational view of the MCM substrate assembly of FIG. 70 after coupling a silicon substrate thereto.
Figure 72:
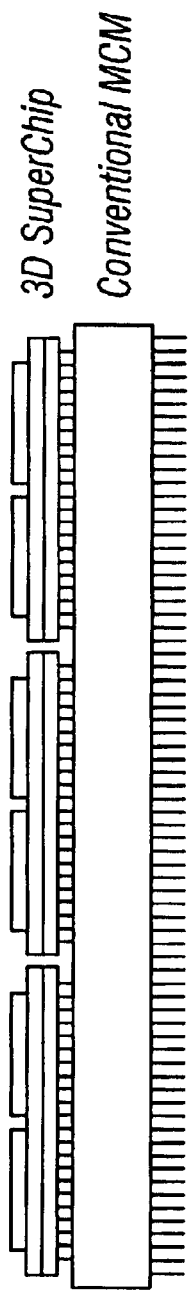
FIG. 72 is a side elevational view of a 3D superchip for a high performance MCM substrate assembly.
Figure 73:
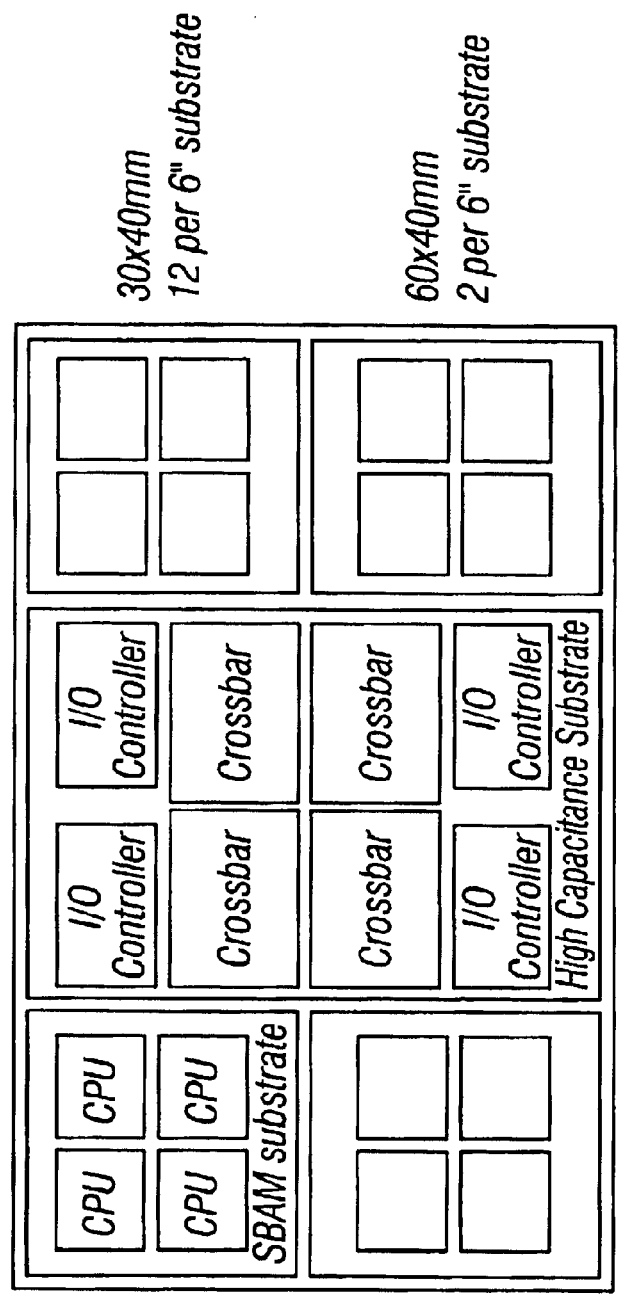
FIG. 73 is a top plan view of the substrate assembly of FIG. 72.
Figure 74:
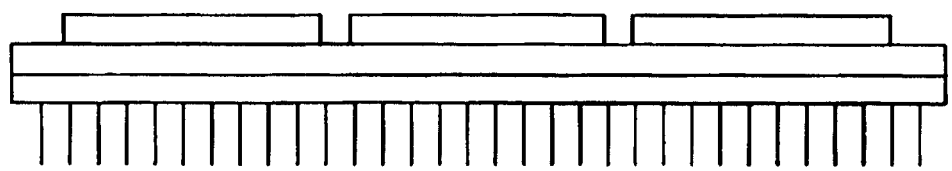
FIG. 74 is a side elevational view of an alternative assembly with 3D superclip for 8-way server.
Figure 75:
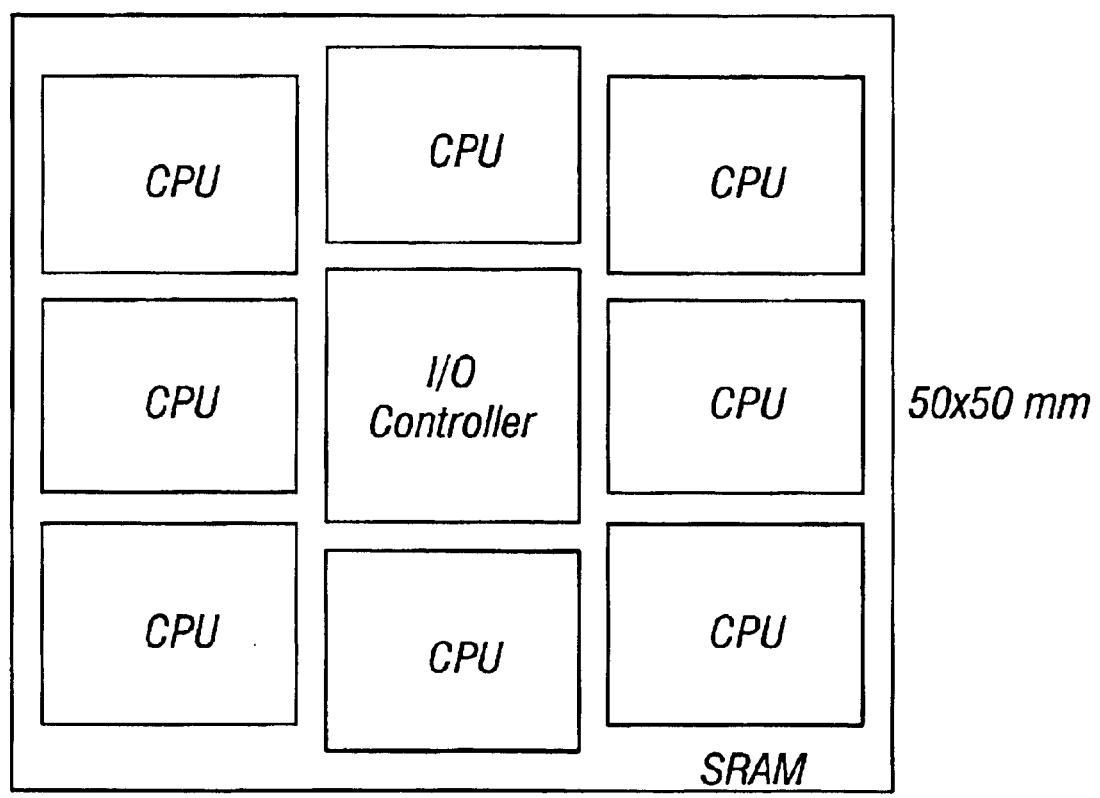
FIG. 75 is a top plan view of the substrate assembly of FIG. 74.

Referring now to FIG. 70 for illustration of a process for forming support substrate attachment, the assembly of FIG. 69 is diced to size. Adhesive layer 384 is tacked to ceramic substrate 388 having vias 381. The adhesive layer 384 over the copper plating 380 is removed by using the ceramic substrate 388 including vias 381 as a laser mask to remove the appropriate amount of adhesive layer 384. The ceramic substrate 388 is subsequently laminated to parylene layer 370 supported by substrate 300. Subsequently, paste 390 (e.g., SnAg) is screened into the vias 381, and then SnAg solder balls are placed to increase volume and reflow. In an alternate embodiment and as best shown in FIG. 71, the assembly of FIG. 70 includes CPU 398 mounted to pads 342 of the assembly of FIG. 70 through solder (e.g., AuSn) 394.

Figure 76:
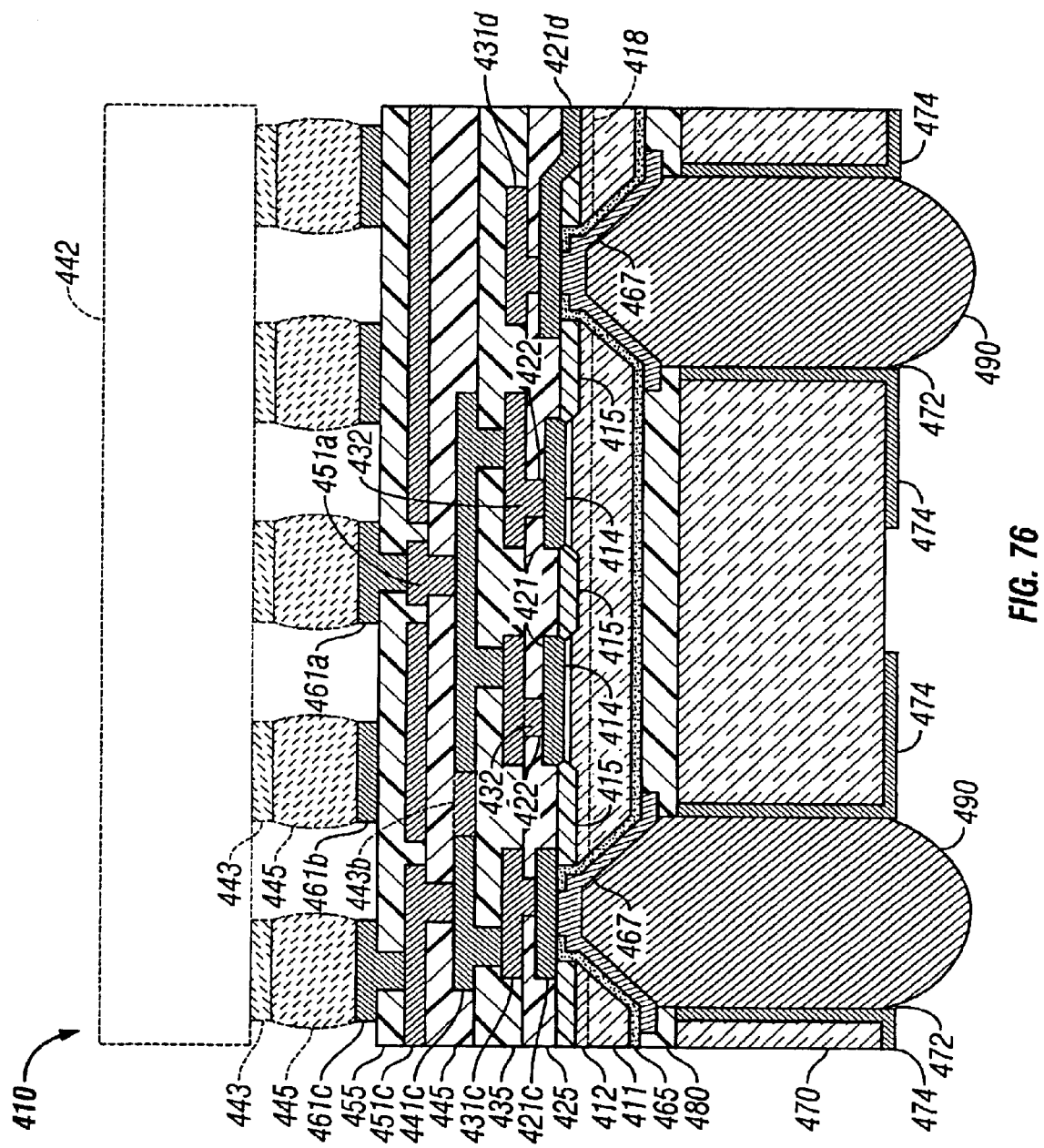
FIG. 76 is another cross-sectional view of the embodiment of a multichip module substrate according to the present invention.

Referring now to FIGS. 76–87, there is seen an exemplary multichip module with capacitor structures, generally illustrated as 410 in FIG. 76. To simplify the visual presentation of module 410, only a cross-sectional slice of the module is shown in the Figures, with it being understood that additional portions of the module lie to the left of the left straight edge of the slice and to the right of the right straight edge of the slice. Substrate 410 comprises a primary substrate 411 which is affixed to a secondary substrate 470 by an adhesive layer 480. Primary substrate 411 preferably comprises a silicon wafer, and secondary substrate 470 preferably comprises a ceramic substrate. Adhesive layer 480 may comprise a bonding sheet (also called a bonding film), and examples thereof are described in greater detail below. Several dielectric and conductive layers are formed on top of primary substrate 411, ending with a plurality of conductive interconnect pads 461 at the top of module 410. Among other purposes, some of the pads 461 are used to interconnect to one or more integrated circuit chips 442, each of which has a plurality of corresponding interconnect pads 443. The interconnection of the pads 461 and 443 is preferably made by way of a plurality of reflowed solder bumps 445, such an may be formed in a conventional flip-chip bounding process.

One aspect of the present application is provided by a plurality of high-value capacitance structures, each of which comprises a conductive (e.g., doped) region 412 of primary substrate 411, an ultra-thin dielectric layer 414 (which preferably comprises silicon oxide) formed over a portion of conductive region 412, a first conductive layer 421 formed over the dielectric layer 414, a second dielectric layer 425 formed over the first conductive layer 421 with at least one aperture 422 therein and formed over the layer 421, a body 432 of a conductive material filled within each aperture 422, and a second conductive layer 431 formed over second dielectric layer 425 and electrically contacting body 432 of conductive material. After the first and second conductive layers 421 and 431 are formed, capacitance structures which have defective dielectric layers 414 (such as caused by pin holes formed through the layer) are detected by a de-plating process according to the present invention and their second conductive layers 431 are removed by the de-plating process. A bypass-capacitor is then constructed from non-defective capacitance structures by coupling a third conductive layer 441A to selected ones of the conductive layers 431 which remain after the de-plating process. Third conductive layer 441A is then coupled to an interconnect pad 461A directly or by an intervening layer 451A of conductive material, the latter being shown in FIG. 76.

Conductive region 412 of primary substrate 411 serves as a common bottom electrode for two or more capacitor structures according to the present invention, and preferably comprises a heavily doped N+ type layer formed at the top surface of substrate 411, such as that made by diffusion or ion implantation, and more preferably comprises the entire substrate 411 doped with n-type impurities to have a relatively low bulk resistivity of 0.01 ohm-cm. A bulk doping level of $5 \times 10^{-18}$ n-type impurities per cubic centimeter ($5 \times 10^{-18}$ cm$^{-3}$) can be used to achieve this level of resistivity. In general, the bulk resistivity for this implementation of regions 412 should be at or above 0.002 ohm-cm, corresponding to a doping level of $1 \times 10^{-8}$ cm$^{-3}$ and above.

Thin dielectric layer 414 preferably comprises silicon dioxide and has a thickness of around 10 nm. A range of thickness of between 7 nm and 20 nm may be used. Such thin dielectric layers are susceptible to the formation of pin holes through the dielectric layer, which can cause a short circuit across the capacitor's electrodes. As described below, the present invention addresses this problem by coupling two or more capacitor structures together in order to provide a composite bypass capacitor, and includes a selective de-plating process during manufacturing which automatically detects the presence of pin holes in the thin dielectric layer 414 and de-plates the second conductive layer 431 of the defective capacitor structure. In order to reduce the potential of edge leakage currents around the periphery of each thin dielectric layer, and thereby to improve the reliability of the capacitor structure, each thin dielectric layer 414 is preferably surrounded by a thicker layer 415 of silicon dioxide 415, oftentimes called the "field" oxide layer.

First conductive layer 421 preferably comprises a first sub-layer of n-type conductive polysilicon, which contacts the thin dielectric layer 414, and a second sub-layer of aluminum. The sub-layers may be relatively thick with respect to thin dielectric layer, such as on the order of 0.25 $\mu$m to 1 $\mu$m in thickness. Second dielectric layer 425 may comprise a number of suitable dielectric materials, such as polyimide or deposited silicon dioxide, and also has a thickness which is preferably greater than that of layer 414, such as a thickness in the range of 2 $\mu$m to 10 $\mu$m. Aperture 422 within second dielectric layer 425 is preferably filled with a body 432 (i.e., via) of conductive material which is different from the material of the top sub-layer of first conductive layer 421, and/or which is different from the material at the bottom of second conductive layer 431. This difference enables the de-plating process according to the present invention to remove the second conductive layer 431 without removing first conductive layer 421 when it is found that the thin dielectric layer 414 is defective. Second conductive material 431 comprises a metal which can be readily de-plated, such as copper.

In preferred embodiments of the present invention, the above requirements for via body 432 are met by a construction of second conductive layer 431 which comprises a first sub-layer of titanium and a second sub-layer of copper, with the second sub-layer having a greater thickness than that of the first sub-layer. The first sub-layer is deposited after aperture 422 has been formed in second dielectric layer 425, thereby at least partially filling aperture 422 with a material which is different from the top sub-layer of first layer 421 (e.g., aluminum), as well as covering the top portions of second dielectric layer 425. The second sub-layer of copper provides a metal which can be readily de-plated, and is different from both the sub-layer of titanium at the bottom of aperture 422 and the aluminum sub-layer of first conductive layer 421.

Another feature of the present invention is the provision of large-diameter vias 490 at the bottom side of module 410 which provide low-inductance pathways for current to flow to and from the capacitance structures on module 410, as well as to and from other components on module 410. Vias 490 are formed through the top and bottom surfaces of secondary substrate 470, further through the top and bottom surfaces of adhesive layer 480, and further through the bottom surface of primary substrate 411 up to near the top surface of substrate 411, where each via 490 contacts a respective conductive backside contact 467. Each backside contact 467 is conductively isolated from primary substrate 411 by a dielectric passivation layer 465, and is electrically coupled to a respective instance 421C and 421D of first conductive layer 421. Each backside contact 467 mechanically couples its respective via 490 to primary substrate 411, and electrically couples its respective via 490 to a conductive layer 421C, 421D. A via may be configured to provide a power supply voltage to module 410, to provide a ground potential to module 410, to convey an input signal (e.g., data signal, clock signal, etc.) to module 410, or to convey an output signal from module 410. While only two vias 490 and two backside contacts 467 are shown in the figures for visual simplicity, it may be appreciated that module 410 may comprise hundreds to thousands of vias 490 and corresponding backside contacts.

Each via 490 is preferably formed through an aperture 472 in secondary substrate 470, and preferably mechanically coupled to substrate 470 by a metal layer 474 formed and adhered to the inside surface of aperture 472. Each metal layer 474 preferably extends outside of its aperture to a top or bottom surface of secondary substrate 470, where power, ground, or electrical signals may be coupled to it.

In FIG. 76, the via 490 shown on the right of the figure is configured to provide a ground potential to conductive region 420 of primary substrate 411. The backside contact 467 that is coupled to this via 490 is, in turn, electrically coupled to a respective first conductive layer 421D. In turn, layer 421D is electrically coupled to an ohmic contact 418 formed on a portion of doped region 412 (e.g., an ohmic contact to a spot on the top surface of primary substrate 411). Thus, the via 490 shown at the right of the figure is electrically coupled to the common bottom electrode (i.e., doped region 412) of all the capacitor structures. Ohmic contact 418 may be formed in a number of ways. As one example, n-type polysilicon may be deposited onto portion of doped region 412. This is, in fact, done as a matter of course when the first conductive layer 421 (and its instances 421C and 421D) comprise a bottom sub-layer of n-type polysilicon and a top sub-layer of aluminum. An ohmic contact may also be formed by depositing aluminum directly onto a portion of doped region 412, or by depositing a 10%–90% alloy of titanium-tungsten (Ti—W) on top of a portion of doped region 412, followed by depositing aluminum on top of this alloy. The use of n-doped polysilicon or the use of the titanium-tungsten alloy are preferred over the direct deposit of aluminum over the portion of doped region 412.

Also in FIG. 76, the via 490 shown on the left is configured to provide an electrical signal from conductive layer 421C to a contact pad 461C through a series of intervening conductive layers 431C, 441C, and 451C, which are electrically coupled to one another, with layer 431C being electrically coupled to layer 421C and layer 451C being electrically coupled to layer 461C. However, the left via 490 may also be configured to provide a power voltage to third conductive layer 441, which couples the second layers 431 (i.e., the top electrodes) of one or more capacitor structures together. This may be accomplished by including a bridge 443B of conductive material between conductive layers 441C and 441A, which is shown in dashed lines in the figure. This configuration provides a low-impedance source of power voltage to the top electrodes of the capacitance structures.

We note that, for the purposes of visual clarity, the vertical thicknesses of conductive layers 421, 431, 441, 451, and 461 and dielectric layers 414, 425, 435, 445, and 455 have been enlarged with respect to the vertical thicknesses of substrate 411 and 470. For the same reason, the vertical thicknesses of layers 465 and 480, and of contacts 467 have also been enlarged.

Having generally described an exemplary module according to embodiment of the present invention, we now turn to describing exemplary methods of constructing modules according to the present invention. First we will describe exemplary methods of constructing primary substrate 411 and the various elements disposed above, and then we will describe exemplary methods for constructing vias 490.

Figure 77:
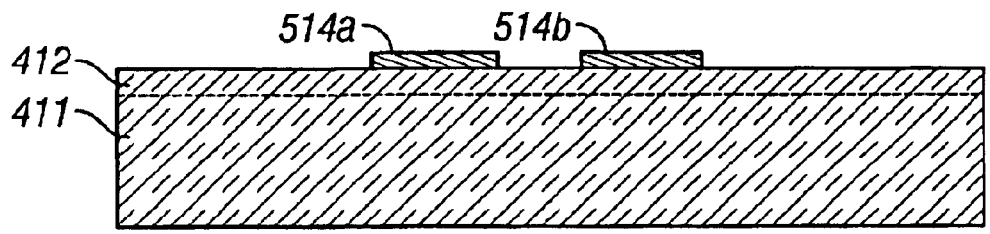
FIGS. 77–83 illustrate a primary substrate according to the present invention at various stages of processing to form de-coupling capacitors according to the present invention.

Referring to FIG. 77, an exemplary method according to the present invention begins with silicon substrate 411' having a crystal orientation of <1, 0, 0>, and a thickness of 500 $\mu$m to 675 $\mu$m. The substrate may be uniformly doped with n-type dopant at a concentration of $1 \times 10^{18}$ dopant atoms per cubic centimeter ($cm^{-3}$) or more as one example, or may comprises a silicon substrate which has a top surface that has had dopant implanted or diffused into it to create a conductive region 412 at the top surface as another example. In the first example, a bulk doping of $1 \times 10^{18}$ dopant atoms per $cm^{-3}$ is preferred to provide a bulk resistivity of 0.01 ohm-cm. In the second example, the level of doping in the doped layer and the depth of the doped layer are selected to provide an equivalent surface resistance as found in the former case. Various combinations of thickness and dopant levels are possible, and it is well within the skill of one of ordinary skill in the art to select one such combination.

Next, the layers 414 of ultra-thin dielectric material for the capacitance structures are defined. We show here a preferred approach which reduces peripheral leakage current by defining the layers 414 within regions 415 of a thicker field oxide. In this preferred approach, a mask layer 514 comprising silicon nitride is deposited and patterned to act as an oxidation mask in a subsequent first oxidation step. The patterning may be accomplished by photo-lithographic and etching processes that are well-known in the semiconductor fabrication art. Substrate 411' will be subsequently oxidized to form field oxide regions 415A, 415C, and 415D at those locations where silicon nitride layer 514 has been removed. The portions of mask layer 514 which are retained on the surface of substrate 411' are indicated in the figure at reference numbers 514A and 514B. Dielectric layers 414 will be subsequently formed at layer portions 514A and 514B. Accordingly then, with mask layer 514 formed and patterned, silicon substrate 411' is exposed to an oxidation step to form field oxide regions 415A–415D by oxidizing the portions of substrate 411' which are not covered by mask layer 514 to silicon dioxide. The oxidatation step is performed such that the field oxide preferably has a thickness of approximately 1 $\mu$m. As is well known in the semiconductor fabrication art, a wide range of combinations of oxidation temperature and oxidation time may be used to accomplish the preferred thickness, and it is readily within the skill of one of ordinary skill in the art to select one such combination.

Figure 78:
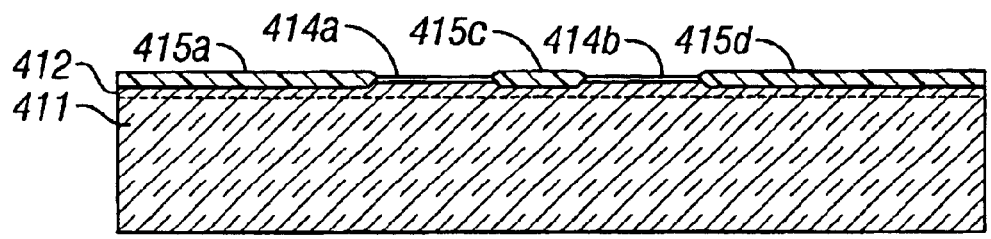

Next, mask layers 514A and 514B are removed from the surface of substrate 411', and silicon substrate 411' is again exposed to an oxidation step to form thin dielectric layers 414 of silicon dioxide with thicknesses of approximately 10 nm, which is equivalent to 100 Angstroms. The resulting structure is shown in FIG. 78. As is well known in the semiconductor fabrication art, a wide range of combinations of oxidation temperature and oxidation time may be used to accomplish the preferred thickness, and it is readily within the skill of one of ordinary skill in the art to select one such combination. This oxidation step adds less than 10 $\mu$m of thickness to field oxide layers 415A–415D. With this approach, a smooth transition from the thin oxide layer 414 to the field oxide layer 415 is achieved at the peripheral edge of thin oxide layer, which reduces the chances of pin holes and leakage current at the peripheral edge.

As the next general step in the exemplary method according to the present invention, ohmic contacts 418, the first conductive layers 421, the second conductive layers 431, and the intervening dielectric layer 425 are formed. A preferred way of accomplishing this is disclosed herein which enables the interconnection of the first conductive layers with the backside vias 490 and enables the detection of defective oxide layers 414. The preferred approach starts by defining windows in the field oxide layer 415 for the locations of ohmic contacts 418. This may be accomplished by forming a layer of photo-resist over layer 415, patterning the photo-resist layer by conventional photo-lithographic methods to remove portions in the photo-resist layer which overlie the locations where the windows in layer 415 are to be made, and thereafter etching the exposed portions of layer 415 with a chemical etchant to form the windows. The results of these steps are shown in FIG. 79 (with the photo-resist layer removed), where the windows in oxide layer 415 is shown by reference number 515C.

Figure 79:
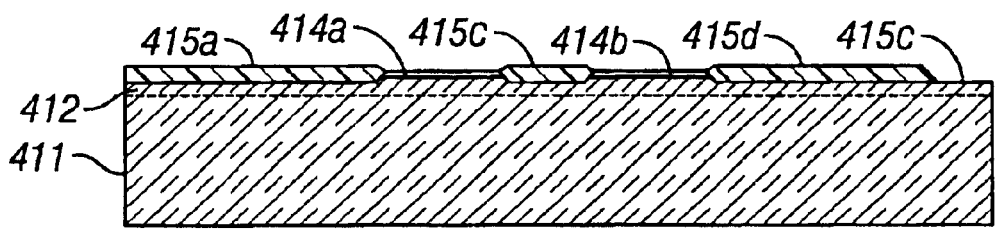

Next, conductive layer 421 is formed by depositing a first sub-layer of N+ doped polysilicon over the top surface of the substrate structure shown in FIG. 79, and thereafter depositing a sub-layer of aluminum over the sub-layer of polysilicon. Each of these steps, separately by itself, is well-known to the semiconductor fabrication art, and it is within the skill of one of ordinary skill in that art to perform each of these steps. An inventive feature provided by the present application is the particular sequence of these steps. The deposition of the N+ polysilicon layer at windows 515C creates ohmic contacts at the interface between the polysilicon and substrate 411'. Thereafter, the particular regions, or instances, 421A–421D of first conductive layer 421 are formed by conventional photo-lithographic and etching methods. For example, a photo-resist layer is formed over the wholly formed layer 421 and then patterned to expose portions of the wholly formed layer 421, followed by etching the exposed aluminum with an aluminum etchant to remove the aluminum and to expose the underlying portions of polysilicon, and thereafter etching the exposed polysilicon portions with a polysilicon etchant to remove them to finally define the instances 421A–421D. As another example, a conventional lift-off technique can be used. The reader may refer ahead to FIG. 80 to see the resulting patterned layer 421.

The next steps in the preferred method comprise forming second dielectric layer 425, forming apertures 422 in dielectric layer 425, and thereafter depositing second conductive layer 431, which fills each aperture 422 with a body of conductive material. Dielectric layer 425 may comprise any number of dielectric materials, including CVD deposited glasses such as phosphosilicate (PSG) glasses, borophosphosilicate (BPSG) glasses, TEOS glasses (tetraethyloxysilane), deposited silicon nitrides, polyimides, and other polymer dielectrics. At present polyimides and deposited glasses are preferred. Apertures 422 may be formed by conventional photo-lithographic and etching steps. In additionally, some polymeric dielectrics are photoimageable, and apertures can be defined by direct pattern exposure of the dielectric material to actinic radiation followed by exposure to the material's developer. Next, the bodies 432 of conductive material and second conductive layer 431 are formed. The types of material deposited for bodies 432 and conductive layer 431 are selected according to the previously described criterion, namely that the material at the bottom of each body 432 be different from the material at the top of first conductive layer 421 and/or different from the material at the bottom of second conductive layer 431. To accomplish this, the inventors' preferred approach is to form bodies 432 and second conductive layer 431 at the same time by depositing conductive layer 431 as a first sub-layer titanium (Ti) and a second sub-layer of copper (Cu), with the titanium sub-layer being deposited first to fill the bottom of each aperture 422 and to served as the bottom portion of each conductive body 432. Second conductive layer 431 is then patterned by conventional photo-lithographic and etch methods. The resulting structure is shown in FIG. 80.

Figure 80:
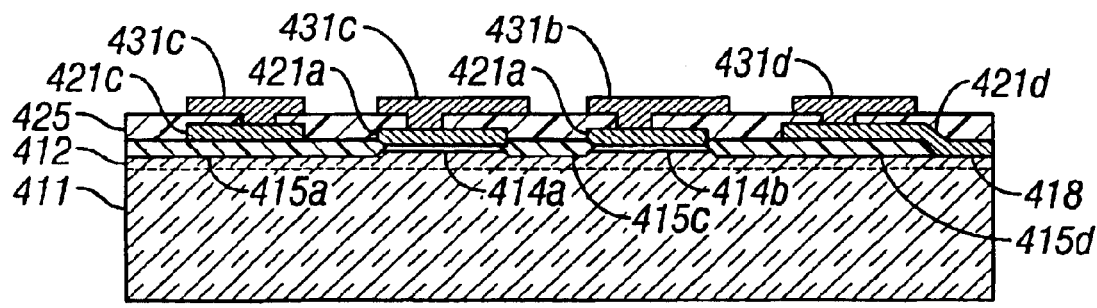

At this stage, two capacitance structures according to the present invention are shown in FIG. 80. The first such structure comprises common conductive region 412, thin dielectric layer 414A bordered by thick field oxide instances 415A and 415C, first conductive layer instance 421A, and second conductive layer instance 431A. The second capacitance structure comprises common conductive region 412, thin dielectric layer 414B bordered by thick field oxide instances 415C and 415D, first conductive layer instance 421B, and second conductive layer instance 431B.

Figure 81:
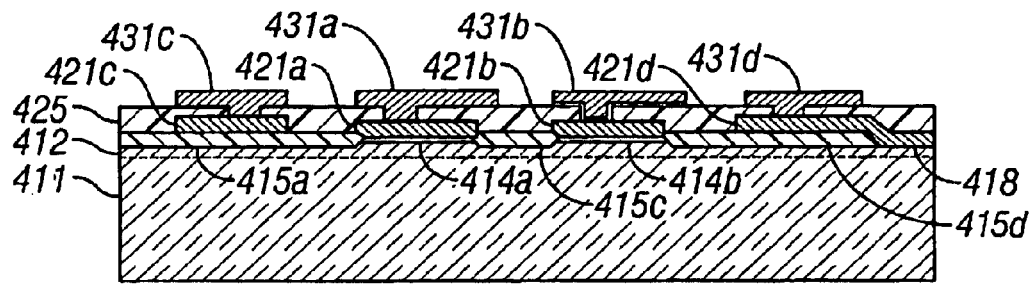

The next general step in the exemplary methods according to the present invention is to expose the instances of conductive layer 431 to a de-plating process with a de-plating voltage (i.e., anode voltage) being applied to conductive region 412, and a plating voltage (i.e., cathode voltage) being applied to the anodic bar. The de-plating process can use any conventional electrolytic plating solution. With conductive layer 431 comprising a top copper sub-layer, the plating solution comprises a copper electrolytic plating solution and the anodic bar comprises copper, but with a cathodic potential applied to it. When the instances of conductive layer 431 are exposed to the plating solution with the de-plating voltage applied to region 412, the de-plating voltage will couple through any defective dielectric layer 414A, 414B and onto the overlying instances of conductive layers 421 and 431. Therefore, an instance of conductive layer 431 which overlies a defective layer 414A, 414B will have the de-plating voltage applied to it, and will have its copper sub-layer de-plated. As an example, we assume that dielectric layer 414B has a pin hole which makes it defective. In this case, the copper sub-layer of conductive layer instance 431B is de-plated, as shown in FIG. 81 by the dash-lines which show the outline of its copper sub-layer. The endpoint of the de-plating process may be detected by a substantial drop in the de-plating current. Alternatively, one may use a pre-set time period which has a sufficient duration to ensure that all of the copper sub-layer is removed. Prior to the de-plating step, the top surface of the substrate is preferably covered with a photo-resist mask which is subsequently developed to uncover only those portions (instances) of layer 431 which are electrically coupled to a second layer instance 421 of a capacitance structure. This mask protects the other portions of the substrate from the acid which is typically present in electrolytic plating solutions. The photo-resist mask is removed (stripped) after the de-plating step.

After the de-plating step, the titanium sub-layer of layer instance 431B may then be removed by suitable chemical etchant which preferably does not etch first conductive layer 421 or dielectric layer 425. When dielectric layer 425 comprises a deposited glass and first conductive layer 421 comprises aluminum, suitable titanium etchants are hydrogen chloride (HCl) aqua regia (HCl+HNO$_3$), and ntric acid (HNO$_3$). When dielectric layer 425 comprises a polyimide material, one may use these etchants, as well as hydrofluoric acid (HF) and a combination of hydrofluoric and nitric acids.

Figure 82:
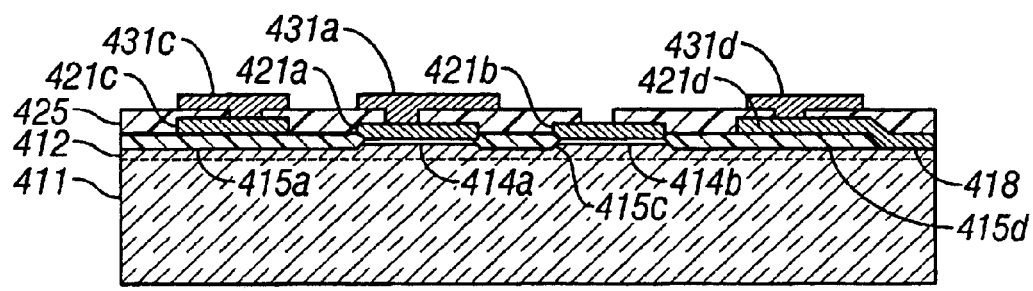

The above described process enables the removal of the instance 431B of second conductive layer 431 that overlies a defective dielectric layer 414B without removing the underlying instance 421B of the first conductive layer 421, as shown in FIG. 82. The preservation of the instance 421B of first conductive layer 421 in this manner improves the planarity of the subsequently formed layers 435, 441, 445, 451, and 455, and prevents dielectric layer 425 from caving in during subsequent processing steps.

Figure 83:
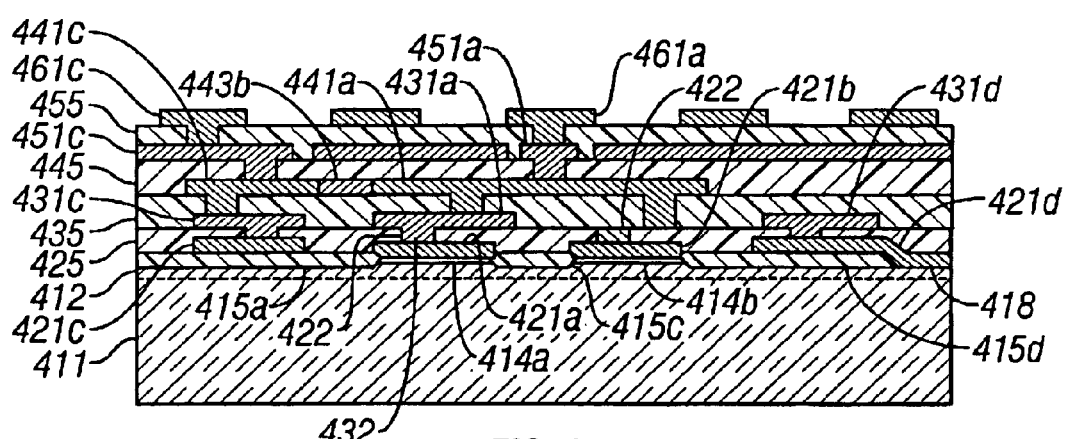

The remaining layers of module 10 may then be formed, as shown in FIG. 83. Here it is seen that the instance 441A of third conductive layer 441 has a vertical portion which contacts instance 431A of second conductive layer (part of the good capacitance structure), and also has a vertical portion which would have contacted instance 431B, but instead terminates on the top surface of second dielectric layer 425. This prevents the instance 421B of first conductive layer from being electrically coupled to pad 461A at the top surface of the substrate.

Figure 84:
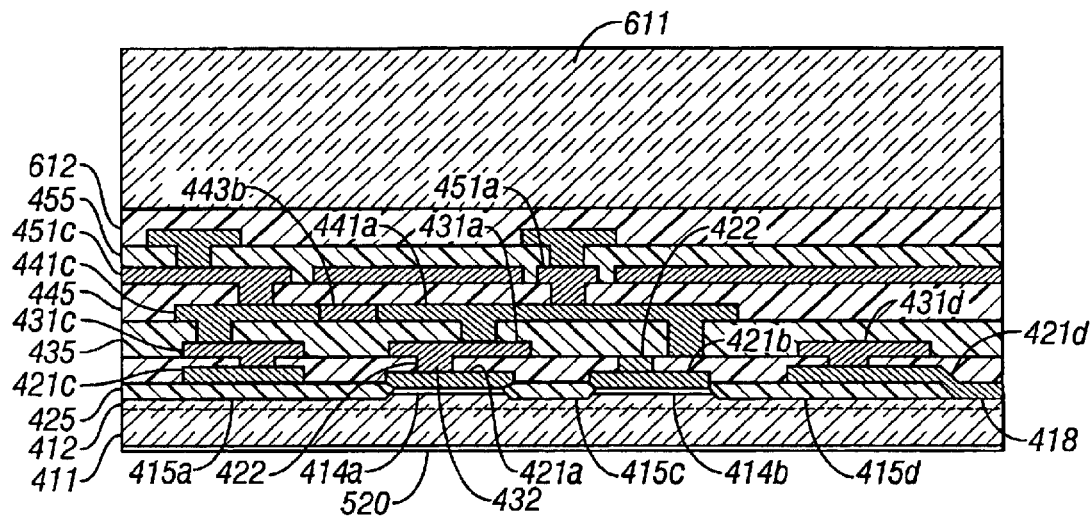
FIGS. 84–87 illustrate a primary substrate according to the present invention at various stages of processing to form de-coupling capacitors according to embodiments of the present invention.

We now describe the formation of vias 490. First, substrate 411' is back lapped at its bottom surface to reduce its thickness to a value of around 200 $\mu$m. For reasons explained below, this step will enable the present invention to achieve a high density of vias 490. The lapped bottom surface is then coated with a 0.2 $\mu$m thick passivation layer 520 which comprises silicon nitride. The resulting substrate is designed with reference number 411, and is thereafter mounted to a temporary support substrate 611 because the thinned substrate 411 is fragile. The result of these steps is shown in FIG. 84. Temporary substrate 611 may be attached to substrate 411 by a layer 612 of temporary adhesive which can be later removed with an organic solvent. In addition, the temporary substrate attachment processes described in U.S. Pat. No. 5,258,236 to Arjavlingam, et al. may be used.

Figure 85:
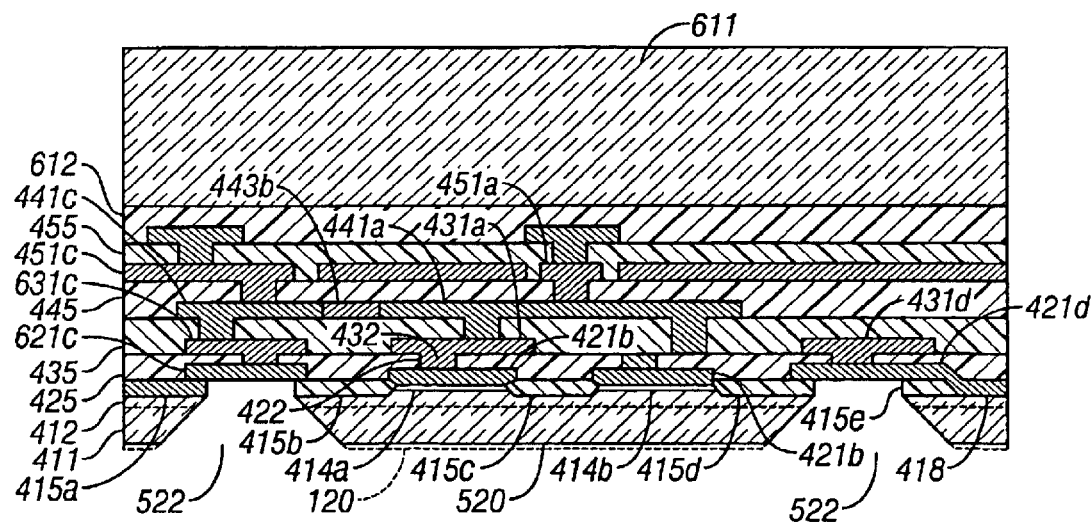

The next set of processing steps are as follows, with FIG. 85 showing the final result of these steps. A window 522 is plasma etched in silicon nitride layer 520 at each location where a backside contact 467 is to be made. Substrate 411 is then subjected to a hot potassium hydroxide (KOH) etchant, which etches the portion of silicon substrate 411 behind each window 522. This etch is performed until the etchant reaches portions of the undersides of field oxide regions 415A and 415D which are opposite to windows 522. The KOH etchant preferentially etches the (500) plane of the silicon crystal structure with respect to the (510) and (511) planes, and therefore creates side edges that slope at 54.7 degrees. To form a widow of width W at the underside of field oxide region 415A or 415D, the corresponding window 522 is selected to have a width of W+2·d·cot(54.7°)=W+1.42·d, where d is the thickness of substrate 411 (after lapping). By back lapping substrate 411' to produce substrate 411, the value of d is reduced by 60% to 70%, which significantly reduces the width of window 522, which in turn enables one to form more windows 522 and corresponding vias 490 over a given area of the substrate 411. As the next step, mask layer 520 is then removed (as shown by dashed lines in FIG. 85), and the newly exposed portions of the undersides of field oxide regions 415A and 415D are plasma etched (using the newly formed apertures in substrate 411 as a mask) until the plasma etchant reaches the polysilicon sub-layer of first conductive layers 421C and 421D. A plasma gas for preferentially etching silicon dioxide over silicon is used. Field oxide region 415A is divided into regions 415A and 415B, and field oxide region 415D is divided into regions 415D and 415E. As the next step, the polysilicon sub-layer of first conductive layers 421C and 421D are plasma etched using a suitable plasma gas. The result of these steps is shown in FIG. 85.

Figure 86:
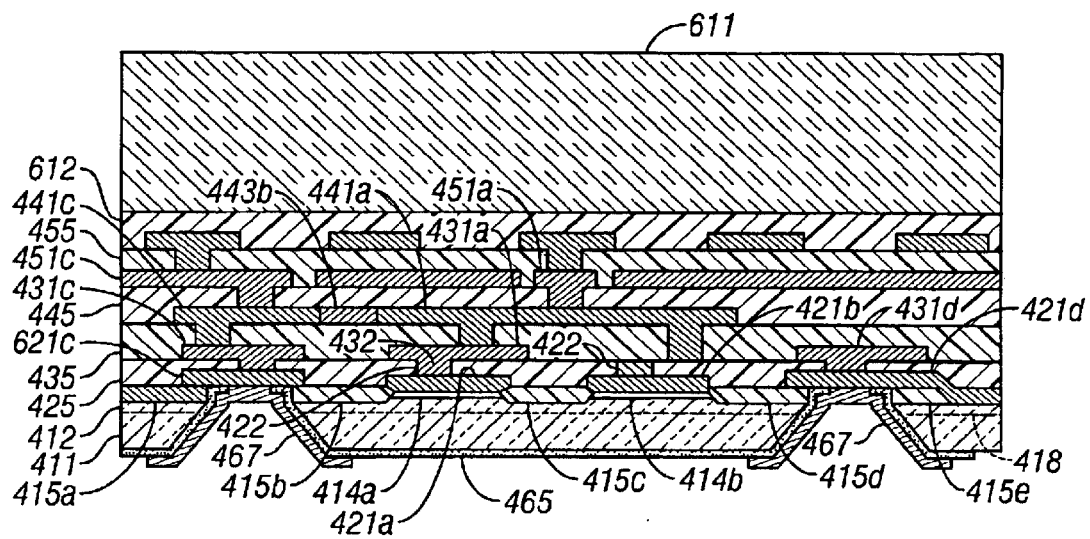

The next set of processing steps are as follows, with FIG. 86 showing the final result of these steps. A passivation layer 465 is formed on the back surface of substrate 411, which also coats the exposed underside portions of conductive layers 421C and 421D, and the exposed side portions of field oxide regions 415A, 415B, 415D, and 415E. Passivation layer 465 preferably comprises vapor deposited parylene, and preferably has a thickness of approximately 20 μm. Holes are laser etched through passivation layer 465 at those locations where backside contact 467 is to contact first conductive layers 421C and 421D, after which passivation layer 465 is plasma cleaned to removed the debris left over from the laser etch process. Next, backside contacts 467 are formed, preferably by first depositing a seed plating layer over the back surface of substrate 411, laminating a resist layer (e.g., RISTON) over the back surface of substrate, patterning the laminated resist layer to form windows therein which overlie the areas where contacts 467 are to be formed, and thereafter plating additional conductive material over the seed layer in those areas exposed by the resist windows. Next, the resist layer is removed, and the portions of the seed layer which are not covered by plated material are removed. The seed layer preferably comprises a thin layer of sputtered chromium (e.g., 200 Angstroms to 400 Angstroms in thickness), followed by a thicker layer of sputtered copper (e.g., 0.1 μm to 0.2 μm in thickness). The additional conductive material plated onto the seed layer preferably comprises copper, with a thickness of approximately 10 μm. In the case where the seed layer comprises sputtered copper over sputtered chromium, the seed layer may be removed by a short exposure to any of the common copper etching solutions, followed by a short exposure to any of the common chromium etching solutions (e.g., HCl, dilute $H_2SO_4$). The brief exposure to the copper etching solution may also etch the plated material of contacts 467, but this is of little consequence since the thickness of plated material is substantially greater than the thickness of the seed layer. As a final preferred step, a thin layer of nickel is plated over the copper by an electroless plating process, and a thin layer of gold is plated over the nickel layer by an electroless plating process.

Figure 87:
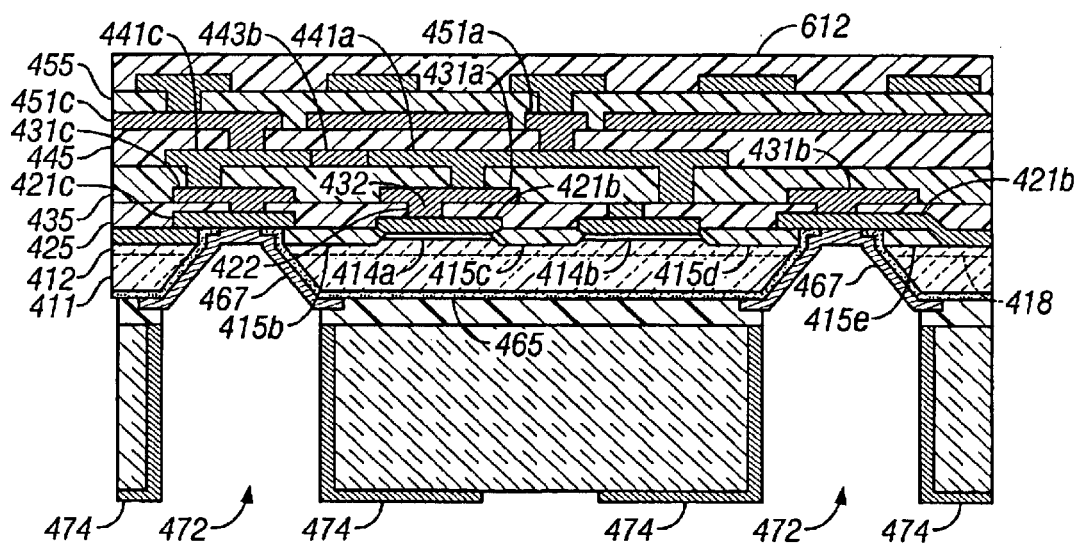

The next set of processing steps are as follows, with FIG. 87 showing the final result of these steps. Adhesive layer 480 is bonded to the top surface of secondary substrate 470. To enable vias 490 to pass through layer 480, the portions of layer 480 which overlie apertures 472 of secondary substrate 470 are removed by laser ablation. The laser light is directed through the apertures 472 from the bottom surface of substrate 470. In this manner, substrate 470 acts as a mask and directs the laser light to only those portions of adhesive layer 480 that are to be removed. A self-aligned pattern in layer 480 is thereby created. As the next steps, primary substrate 411 is diced to a final size, removed from temporary substrate 611, and mounted onto adhesive layer 480 to thereby laminate it onto secondary substrate 470, with its bottom surface facing the top surface of secondary substrate 470. These three steps may be done in any order. In a preferred embodiment, the first two steps are performed in either order, followed by the third step. In another embodiment, temporary substrate 612 is first removed from primary substrate 411, then substrate 411 is mounted onto secondary substrate, and finally substrate 411 is diced to size. Adhesive layer 480 preferably comprises a bonding sheet. Exemplary bonding sheet are, for example, Mitsubishi BT bonding film BT F346, Mitsubishi LCP reinforced BT prepreg GMPL-195, and Shin-etsu epoxy bonding sheets types E31 through E38. Each of these examples are thermosetting bonding sheets which comprise epoxy which has been gelled to the intermediate B-stage. Adhesive layer 480 may also comprise a polyimide bonding sheet, such as Nippon Steel polyimide bonding sheet SPB-A. The result of these steps is shown in FIG. 86.

As the next step, a solder paste is screened into apertures 472 of secondary substrate 470, and then reflowed to make electrical connections between conductive layers 474 and layers 421C and 421D. The solder paste generally comprises a volatile carrier which evaporates during reflow, thereby reducing the volume of conductive mass formed within each aperture 472. The reduction of volume can cause a problem if each aperture 472 does not have a conductive layer 474 which extends from the substrate's top surface to the substrate's bottom surface. In those cases where layers 474 do not extend from top surface to bottom surface, Additional volume may be added by placing reflowed solder balls over the screened solder paste prior to the reflow operation, and thereafter reflowing the solder paste with the solder balls disposed over the respective bodies of solder paste. The solder bodies meld with the reflowed solder pastes, and compensate for the volume lost by the evaporation of the volatile components in the solder paste. The result of this approach is show in FIG. 76. In constructed embodiments of the present invention, a tin-silver (SnAg) solder paste and tin-silver solder balls are used. However, other solders may be used. In addition, a conductive adhesive may be used in place of solder, particularly for lower speed (frequency) application.

Thus, by the practice of the embodiments of the present invention there is provided a capacitor deplating method (see FIGS. 66 and 67) wherein metal contacts from defective capacitors 320b are removed. In the method, a number of capacitors 320 are formed on a semiconductor substrate 300. Metal contacts are formed over the capacitors 320. A photoresist layer 324 is patterned over the metal contacts such that the metal contacts are exposed through the layer. The resulting structure is then placed in an electrolytic bath and the contacts over defective capacitors 320b can be deplated. For example, if the defective capacitor 320b has a short circuit 307, current flows through the structure and the short circuit 307 so that deplating can occur. Good capacitors have an insulating layer which prevents the formation of a complete circuit and prevents deplating. By removing the contacts over defective capacitors 320b, yields can be increased.

By the further practice of embodiments of the present invention there are provided methods for forming a multichip module (MCM) having an active or passive semiconductor device embedded within the chip package structure. Other embodiments of the invention relate to the MCM and any subcomponents thereof (see FIGS. 68–73 by way of illustration). For example, FIG. 71 illustrates a substrate for a CPU. The substrate includes a silicon layer disposed between a copper/polyimide thin film structure and ceramic carrier (AlN). The silicon layer can include active device or passive devices. For instance, the silicon layer can include a chip capacitor to decouple noise in a power distribution system.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A multi-chip module comprising:
a multilayer thin-film polymeric interconnect structure formed on a semiconductor layer, said interconnect structure having a first side and a second side, said second side being adjacent to said semiconductor layer;
a chip disposed on the first side;
wherein said semiconductor layer comprises active or passive devices.

2. The multi-chip module of claim 1 wherein the active devices comprise SRAMs and wherein the passive devices comprise chip capacitors.

3. The multi-chip module of claim 1 wherein the semiconductor layer further comprises an aperture extending through the layer.

4. The multi-chip module of claim 3 wherein the aperture is filled with solder.

5. A multichip module substrate capacitor structure comprising:
a semiconductor substrate having a top surface and a bottom surface;
a doped region of the substrate located at the substrate's top surface;
an ohmic contact located on the top surface of the substrate, and a first dielectric layer disposed over the doped region;
a first conductive layer having a top surface and a bottom surface, and being disposed over the first dielectric layer with its bottom surface adjacent to the first dielectric layer, said first conductive layer having at least a sub-layer of a first conductive material disposed at its top surface;
a second dielectric layer disposed over the first conductive layer;
an aperture formed in the second dielectric layer and disposed over the first conductive layer to expose a portion thereof;
a conductive via formed through the aperture and disposed against a portion of the first conductive layer and comprising a second conductive material disposed adjacent to the sub-layer of first conductive material of said first conductive layer, the portion of said second conductive material adjacent said first conductive material being different from said sub-layer of said first conductive material; and
a second conductive layer having a top surface and a bottom surface, and being disposed over the second dielectric layer with its bottom surface adjacent to second dielectric layer, said second conductive layer having a portion therefor disposed over the conductive via.

6. The module of claim 5 wherein said first conductive layer comprises polysilicon and a top layer of aluminum.

7. The module of claim 5 wherein the doped region extends over substantially the entire top surface of the substrate.

8. The module of claim 5 wherein said substrate comprises a doping level of more than $1 \times 10^{-18}$ cm$^{-3}$ and wherein the doped region is provided by the entire substrate.

9. The module of claim 5 wherein said first dielectric layer comprises silicon oxide.

* * * * *